United States Patent
Kaji et al.

[11] Patent Number: 6,129,806
[45] Date of Patent: Oct. 10, 2000

[54] PLASMA PROCESSING APPARATUS AND PLASMA PROCESSING METHOD

[75] Inventors: Tetsunori Kaji, Tokuyama; Shinichi Tachi, Sayama; Toru Otsubo, Fujisawa; Katsuya Watanabe, Kudamatsu; Katsuhiko Mitani, Hikari; Junichi Tanaka, Chiyoda-machi, all of Japan

[73] Assignee: Hitachi, Ltd., Tokyo, Japan

[21] Appl. No.: 08/808,805

[22] Filed: Feb. 28, 1997

[30] Foreign Application Priority Data

| Mar. 1, 1996 | [JP] | Japan | 8-044391 |
| Jan. 20, 1997 | [JP] | Japan | 9-007938 |

[51] Int. Cl.[7] ............................... H05H 1/46; C23F 4/00
[52] U.S. Cl. ...................................... 156/345; 118/723 E
[58] Field of Search ........................ 156/345; 118/723 E; 204/298.34, 298.37

[56] References Cited

U.S. PATENT DOCUMENTS

| 4,859,908 | 8/1989 | Yoshida et al. |
| 5,387,893 | 2/1995 | Oguriyama et al. |
| 5,423,941 | 6/1995 | Komura et al. |
| 5,431,769 | 7/1995 | Kisakibaru et al. ..................... 156/345 |
| 5,587,038 | 12/1996 | Cecchi et al. ........................... 156/345 |

FOREIGN PATENT DOCUMENTS

| 0421430 | 4/1991 | European Pat. Off. |
| 0669637 | 8/1995 | European Pat. Off. |
| 0710056 | 5/1996 | European Pat. Off. |
| 6-13480 | 2/1981 | Japan . |
| 62-280378 | 12/1987 | Japan . |
| 2-312231 | 12/1990 | Japan . |
| 3-204925 | 9/1991 | Japan . |
| 6-61182 | 3/1994 | Japan . |
| 7-288195 | 10/1995 | Japan . |
| 7-297175 | 11/1995 | Japan . |

OTHER PUBLICATIONS

Oda et al., "Generation of Electron Cyclotron Resonance Plasma in the VHF Band", Japanese Journal of Applied Physics, vol. 28, No. 10, Oct., 1989.

Primary Examiner—Thi Dang
Attorney, Agent, or Firm—Antonelli, Terry, Stout & Kraus, LLP

[57] ABSTRACT

A plasma processing apparatus and method are provided which are capable of easily performing precise working of a fine pattern on a large sized sample having a diameter of 300 mm or larger, and also capable of improving selectivity during micro processing. The apparatus includes a vacuum processing chamber, a plasma generating arrangement including a pair of electrodes, a sample table for mounting a sample to be processed inside the vacuum processing chamber and also serving as one of the electrodes, and an evacuating means for evacuating the vacuum processing chamber. The apparatus further includes a high frequency electric power source for applying an electric power of VHF band from 50 MHz to 200 MHz between the pair of electrodes. A magnetic field forming structure is also provided for forming a static magnetic field or a low frequency magnetic field larger than 10 gauss and smaller than 110 gauss in a direction intersecting an electric field generated between the pair of electrodes and in the vicinity thereof by the high frequency electric power source. The magnetic field forming structure is set so that a portion where a component of the magnetic field in a direction along the surface of the sample table becomes maximum is brought to a position on the opposite side of the sample table from the middle of the two electrodes. As a result, an electron cyclotron resonance region is formed between the upper and lower electrodes by the magnetic field and the electric field.

12 Claims, 31 Drawing Sheets

$$V_{CM} = \frac{q}{c} = \frac{i_i \cdot (T_0 - T_1)}{(\varepsilon_\gamma \varepsilon_0 / d) \times K}$$

$i_i$ : ION CURRENT DENSITY $\varepsilon_\gamma$ : SPECIFIC DIELECTRIC CONSTANT OF ELECTROSTATIC ATTRACTING FILM d : THICKNESS OF ELECTROSTATIC ATTRACTING FILM

K : ELECTRODE COVERING RATIO OF ELECTROSTATIC ATTRACTING FILM $T_{01} : T_{02} : T_{03} : T_{04} : T_{05} = 16 : 8 : 4 : 2 : 1$

FREQUENCY-LOWEST GAS PRESSURE FOR STABLE DISCHARGE CHARACTERISTC

PLASMA PROCESSING APPARATUS AND PLASMA PROCESSING METHOD

BACKGROUND OF THE INVENTION

The present invention relates to a plasma processing apparatus and a plasma processing method, and more particularly relates to a plasma processing apparatus and a plasma processing method suitable for forming a fine pattern in a semiconductor device manufacturing process.

The need for improving the fine pattern manufacturing capability and the processing speed in plasma processing is growing further as integration of semiconductor devices become higher. In order to respond to this need, it is required to decrease the pressure of the processing gas and to increase the plasma density.

In regard to plasma processing apparatuses aiming to decrease the pressure of the processing gas and to increase the plasma density, there presently are: (1) a method which utilizes the electron cyclotron resonance phenomena (hereinafter referred to as ECR) of a microwave (e.g., 2.45 GHz electromagnetic field with a static magnetic field (e.g., 875 G); and (2) a method which utilizes induction coupling processing (hereinafter referred to as ICP) in which a plasma is generated by generating an induced electromagnetic field by exciting a coil using an RF frequency power source.

In a case where a film of the oxide film group is etched using a gas of fluorocarbons, when either of the methods of the ECR described in the above item (1) or the ICP described in the item (2) is employed, it is difficult to increase selectivity of an oxide-film to a base material, for example, Si or SiN since dissociation of the gas progresses excessively.

On the other hand, in a conventional method of generating a plasma by applying an RF frequency voltage between a pair of parallel flat plates, it is difficult to stably discharge under a pressure condition below 10 Pa.

As a countermeasure, there are: (3) a two-frequency exciting method in which a plasma is generated using a high frequency voltage above several tens MHz and bias control of a sample is performed using a low frequency voltage below several MHz, which is disclosed in Japanese Patent Application Laid-Open No. 7-297175 or Japanese Patent Application Laid-Open No. 3-204925; and (4) a magnetron RIE (hereinafter referred to as M-RIE) method which utilizes an action of confining electrons by Lorentz force of electrons by applying a magnetic field B in a direction intersection with a self-bias electron field (E) induced on the surface of the sample, which is disclosed in Japanese Patent Application Laid-Open No. 2-312231.

Further, a method of increasing plasma density under a low pressure condition is described in Japanese Patent Application Laid-Open No. 56-13480. This method obtains a high plasma density under a low pressure condition of 0.1 Pa to 1 Pa by utilizing an electron cyclotron resonance (ECR) effect induced by a microwave of electromagnetic waves (e.g., 2.45 GHz) and a static magnetic field (e.g., 875 gauss).

On the other hand, in the technical field of performing etching processing or film forming processing of a semiconductor material using a plasma, an apparatus is employed having a high frequency power source for accelerating ions in a plasma to a sample table for mounting an object to be processed (for example, a semiconductor wafer substrate, hereinafter referred to as the sample) and an electrostatic attracting film for holding the sample on the sample table by an electrostatic attracting force.

For example, in an apparatus disclosed in the specification of U.S. Pat. No. 5,320,982, a plasma is generated by microwaves and a sample is held on a sample table by an electrostatic force, and using a high frequency power source output having a sinusoidal waveform as a bias electric source, the ion energy incident on the sample is controlled by connecting the power source to the sample table while the temperature of the sample is being controlled by introducing a heat transfer gas between the sample and the sample table.

Further, Japanese Patent Application Laid-Open No.62 280378 discloses that a distribution of the ion energy incident to the sample can be narrowed by applying a pulse-shaped ion control bias voltage to a sample table for maintaining the electric field intensity between a plasma and an electrode at a constant value. Thereby, it is possible to improve the dimensional accuracy of plasma etching processing and the etching rate ratio of a processed film to a base material by several times.

Furthermore, Japanese Patent Application Laid-Open No. 6-61182 discloses that it is possible to prevent the occurrence of notches by generating a plasma utilizing electron cyclotron resonance and applying a pulse bias having a width of pulse duty of 0.1% or more to a sample.

An example of increasing a plasma density by generating cyclotron resonance using an electromagnetic wave of VHF band and a static magnetic field is described in the Journal of Applied Physics, Japan, Vol.28, No. 10. However, in this example, by applying a high frequency voltage of 144 MHz to a coaxial central conductor and adding a magnetic field of 51 gauss in parallel to the central conductor, cyclotron resonance is formed to generate a high density plasma, and a grounded sample table is arranged in a position downstream of the plasma generating portion.

In the plasma generating methods described in Japanese Patent Application Laid-Open No. 7-288195 or Japanese Patent Application Laid-Open No. 7-297175 among the above-mentioned conventional technologies, a plasma is generated by a high frequency source of 13.56 MHz or several tens MHz. It is possible to generate a plasma appropriate for etching an oxide film under a gas pressure of several tens Pa to 5 Pa (Pascal).

However, as a pattern dimension becomes as small as nearly 0.2 $\mu$m or smaller, verticality in a processed shape is strongly required and consequently it is inevitable that the gas pressure decreases.

However, in the two-frequency exciting method or the M-RIE method described above, it is difficult to stably produce a plasma having a desired density higher than nearly $5 \times 10^{10}$ cm$^{-3}$ under a pressure condition lower than 4 Pa (0.4 to 4 Pa). For example, in the two-frequency exciting method described above, even if the plasma exciting frequency is increased up to a frequency around 50 MHz, the plasma density cannot be increased but, on the contrary, it decreases. Therefore, it is difficult to produce a plasma having a desired density higher than nearly $5 \times 10^{-10}$ cm$^{-3}$ under a pressure condition of 0.4 to 4 Pa.

Further, in the M-RIE method, the density distribution of a plasma generated by an action of confining electrons by Lorentz force of electrons produced on a surface of a sample must be uniform all over the surface of the sample. However, there is a disadvantage in that an inclination of the plasma density generally occurs over the surface of the sample due to drift of E×B. The inclination of the plasma density formed by the action of confining electrons cannot be corrected by any method such as diffusion or the like since the inclination occurs near the sheath in the vicinity of the sample where intensity of the magnetic field is strong.

Japanese Patent Application Laid-Open No. 7-288195 discloses a method of solving this problem in which it is possible to obtain a uniform plasma without inclination by arranging magnets so that the magnetic field intensity is weakened in a direction of electron drift due to the drift of E×B, even when a magnetic field with a maximum value as high as 200 gauss is applied in parallel to a sample. However, there is a disadvantage with this method in that it is difficult to follow a change in a processing condition since a condition for maintaining the plasma uniform is limited to a specified narrow range once the distribution of magnetic field intensity is fixed. In particular, in a case of a large sized sample having a diameter larger than 300 mm, when a distance between the electrodes is as narrow as 20 mm or less, pressure above the central portion of the sample becomes 10% or more greater than pressure above the peripheral portion of the sample. In order to avoid this pressure difference, the gap between the sample table and the opposite electrode must be set to 30 mm or more since, otherwise, the difficulty is likely to be increased.

As described above, in the two-frequency exciting method and the M-RIE method, it is difficult to obtain a uniform plasma density of $5 \times 10^{10}$ cm$^{-3}$ over the surface of a sample having a diameter of 300 mm or more under a pressure condition as low as 0.4 to 4 Pa. Therefore, in the two-frequency exciting method and the M-RIE method, it is difficult to manufacture the fine pattern of 0.2 $\mu$m or smaller on a wafer having a diameter larger than 300 mm uniformly and quickly with a high selectivity of the etching material to the base material.

On the other hand, a method for substantially increasing a plasma density under a low pressure condition is disclosed in Japanese Patent Application Laid-Open No. 56-13480 among the prior art described above. However, this method has a disadvantage in that in a case where a silicon oxide film or a silicon nitride film is etched using a gas containing fluorine and carbon, it is difficult to attain a desired selectivity to the base material such as Si or the like since dissociation of the gas progresses excessively and a large amount of fluorine atoms and/or molecules and/or fluorine ions are generated. The ICP method using an electromagnetic field induced by an RF power source also has a disadvantage in that dissociation of the gas progresses excessively, the same as in the ECR method described above.

Further, the plasma processing apparatus is generally constructed in such a manner that the processing gas is exhausted from the peripheral portion of a sample. In such a case, there is a disadvantage in that the plasma density is higher in the central portion of the sample and lower in the peripheral portion of the sample, and accordingly uniformity in the processing all over the surface of the sample is degraded. In order to eliminate this disadvantage, a ring-shaped bank, that is, a focus ring is provided near the periphery of the sample to stagnate gas flow. However, there is another disadvantage in that reaction products attach onto the bank which becomes a particle producing source to decrease the product yield.

On the other hand, in order to control energy of ions incident to the sample, an RF bias with a sinusoidal waveform is applied to an electrode mounting the sample. The frequency of the RF bias used is several hundreds kHz to 13.56 MHz. However, the energy distribution of incident ions becomes of a double peak type. One of the two peaks is in a lower energy region and the other is in a higher energy region because the ions follow to change in electric field inside a sheath when the RF bias has a frequency within this frequency band. The ions in the higher energy range can process at high speed but damage the sample, and the ions in the lower energy range can process without damage but at low speed. That is, there is a disadvantage in that the processing speed is decreased when one tries to prevent damage of the sample, and the problem of damage arises when one tries to increase the processing speed.

On the other hand, when the frequency of the RF bias is set to a value higher than, for example, 50 MHz, the distribution of incident energy becomes of a single peak type. However, most of the energy is used in plasma generation and consequently the voltage applied to the sheath is substantially decreased. Therefore, there is a disadvantage in that it is difficult to control the energy of the incident ions independently to the plasma density.

Further, in the pulse bias power source method described in Japanese Patent Application Laid-Open No. 62-280378 or Japanese Patent Application Laid-Open No. 6-61182, there is no discussion of a case where a dielectric layer for electrostatic attraction is used between a sample table electrode and a sample while a pulse bias is applied to the sample. When the pulse bias method is directly applied to the electrostatic attracting method, an ion acceleration voltage applied between a plasma and the surface of the sample is decreased by the increase of the voltage generated between both ends of the electrostatic attracting film as ion current flows within one cycle of the RF bias, and consequently the distribution of ion energy is broadened. Therefore, the pulse bias power source method has a disadvantage in that it cannot cope with a required fine pattern processing while temperature of the sample is properly being controlled.

Further, in the conventional sinusoidal wave output bias power source method disclosed in the specification of U.S. Pat. No. 5,320,982, there is a disadvantage in that an impedance of the sheath portion approaches an impedance of the plasma itself or lower when the frequency becomes high. If this occurs, an unnecessary plasma is generated near the sheath in the vicinity of the sample by the bias power source, and accordingly the ions are not effectively accelerated and the distribution of the plasma is also degraded to lose controllability of ion energy by the bias power source.

Furthermore, in plasma processing, in order to improve the performance, it is important to properly control the amount of ions, the amount of radicals and the kinds of radicals. In the past, a gas to be formed into ions and radicals is introduced into a process chamber and the ions and the radicals are produced at the same time by generating a plasma in the process chamber. Therefore, as the processing of the sample becomes very small, it becomes clear that there is a limit in the control of the amount of ions, the amount of radicals and the kinds of radicals.

Further, in regard to an example of utilizing cyclotron resonance of the VHF band, installation of a bias electric power source for applying a voltage to a sample table and a means for uniformly applying a voltage all over a sample surface are described in Journal of Applied Physics, Japan, Vol.28, No. 10. Further, a processing chamber has a height higher than 200 mm. Therefore, the construction cannot use reaction on the surfaces of opposite electrodes effectively, and consequently it is difficult to obtain a high selectivity in this construction.

SUMMARY OF THE INVENTION

An object of the present invention is to provide a plasma processing apparatus and a plasma processing method capable of easily performing precise manufacturing of a fine pattern on a large sized sample having a diameter of 300 mm or more by obtaining a large-sized and uniform plasma in which dissociation of the processing gas does not excessively progress.

Another object of the present invention is to provide a plasma processing apparatus and a plasma processing method capable of performing uniform and high-speed processing, and particularly oxide film processing, all over the surface of a large diameter sample.

A further object of the present invention is to provide a plasma processing apparatus and a plasma processing method capable of improving the selectivity of the etching material of insulator films such as SiO2, SiN, BPSG and the like to the base material.

A still further object of the present invention is to provide a plasma processing apparatus and a plasma processing method capable of improving the selectivity of plasma processing stably with low-damage and high controllability.

A further object of the present invention is to provide a plasma processing apparatus and a plasma processing method capable of performing processing of a required fine pattern manufacturing highly accurately and stably by improving temperature control through electrostatic attracting of a sample.

A still further object of the present invention is to provide a plasma processing apparatus and a plasma processing method capable of controlling the generation of ions and radicals independently.

The present invention is characterized by a plasma processing apparatus comprising a vacuum processing chamber, a plasma generating means including a pair of electrodes, a sample table having a sample mounting surface for mounting a sample to be processed inside the vacuum processing chamber, and an evacuating means for evacuating the vacuum processing chamber, which further comprises a high frequency electric power source for applying a high frequency electric power of a VHF band from 30 MHz to 300 MHz between the pair of electrodes; and a magnetic field forming means for forming a static magnetic field or a low frequency magnetic field in a direction intersecting an electric field generated between the pair of electrodes and the surrounding vicinity by the high frequency electric power source, whereby an electron cyclotron resonance region is formed between the electrodes by the magnetic field and the electric field.

The present invention is also characterized by a plasma processing apparatus comprising a vacuum processing chamber, a plasma generating means including a pair of electrodes, a sample table for mounting a sample to be processed inside the vacuum processing chamber and also serving as one of the electrodes, and an evacuating means for evacuating the vacuum processing chamber, which further comprises a high frequency electric power source for applying an electric power of a VHF band from 50 MHz to 200 MHz between the pair of electrodes; and a magnetic field forming means for forming a static magnetic field or a low frequency magnetic field not weaker than 17 gauss and not stronger than 72 gauss in a direction intersecting an electric field generated between the pair of electrodes and the surrounding vicinity by the high frequency electric power source. The magnetic field forming means is set so that a portion where a component of the magnetic field in a direction along the surface of the sample table becomes maximum is brought to a position on the opposite side of the sample table from the middle of both electrodes. With this arrangement, an electron cyclotron resonance region is formed between the electrodes by the magnetic field and the electric field.

The present invention is further characterized by a method of plasma-processing a sample using a plasma processing apparatus comprising a vacuum processing chamber, a plasma generating means including a pair of electrodes, a sample table for mounting a sample to be processed inside the vacuum processing chamber and also serving as one of said electrodes, and an evacuating means for evacuating the vacuum processing chamber, the method comprising the steps of evacuating inside the vacuum processing chamber by said evacuating means; forming a static magnetic field or a low frequency magnetic field not weaker than 10 gauss and not stronger than 110 gauss in a direction intersecting an electric field between the pair of electrodes by a magnetic field forming means; forming an electron cyclotron resonance region between both electrodes by interaction of the magnetic field and an electric field generated by a high frequency electric power source by applying an electric power of a VHF band from 30 MHz to 300 MHz between the pair of electrodes using the high frequency electric power source; and processing the sample by a plasma produced by the cyclotron resonance of electrons.

According to the present invention, in order not to excessively progress dissociation of a processing gas and in order to obtain a uniform plasma which has a diameter larger than 300 mm and a saturation ion current distribution smaller than ±5%, a high frequency electric power source having a frequency of 30 MHz to 300 MHz, preferably 50 MHz to 200 MHz, is used for generating a plasma. Further, a static magnetic field or a low frequency magnetic field is formed in a direction intersecting an electric field generated between the pair of electrodes. Thereby, an electron cyclotron resonance region is formed between the pair of electrodes along the surface of the sample table and on the opposite side of the sample table from the middle of both electrodes by the magnetic field and the electric field. Thus, the sample is processed using the plasma produced by the cyclotron resonance of electrons.

In regard to the magnetic field, the static magnetic field or the low frequency magnetic field (lower than 1 kHz) partially has an intensity not weaker than 10 gausses and not stronger than 100 gauss, preferably not weaker than 17 gauss and not stronger than 72 gausses. In regard to the gas pressure, it is set to a low pressure from 0.4 Pa to 4 Pa. In addition to these, the distance between the electrodes is set to a value from 30 mm to 100 mm, preferably, 30 mm to 60 mm.

In regard to the frequency f of the high frequency electric power source, by employing VHF in the range 50 MHz≦f≦200 MHz the plasma density is decreased by one order to two orders compared to that in a case of a microwave ECR. The dissociation of gas is also decreased and accordingly generation of unnecessary fluorine atoms and/or molecules and ions are also decreased by one order or more. By using the frequency in the VHF band and the cyclotron resonance, it is possible to obtain a plasma having an appropriately high density and a high processing rate under a pressure condition of 0.4 Pa to 4 Pa. Further, since the dissociation of processing gas is not excessively progressed, the selectivity to the base material such as Si, SiN or the like is not significantly degraded.

Although the dissociation of processing gas only progresses slightly compared to that in a conventional apparatus of the parallel flat plate electrode type using a frequency of 13.56 MHz, the disadvantage of the small increase in the amount of fluorine atoms and/or molecules and/or ions can be eliminated by providing a material containing silicon or carbon on the surface of the electrodes and/or a wall surface of the chamber, and further by applying a bias voltage to the electrodes and the chamber or by exhausting fluorine through coupling the fluorine with hydrogen using a gas containing hydrogen atom.

Further, according to the present invention, a portion where the component of the magnetic field parallel to the sample table between the electrodes is set at a position on the side opposite to the sample table from the middle of both electrodes and the magnetic field intensity on the surface of the sample table mounting the sample parallel to the sample table is set below 30 gauss, preferably, below 15 gauss. Thereby, a Lorentz force (E×B) acting on electrons near the sample mounting surface is made small, and consequently occurrence of non-uniformity by the electron drift effect due to the Lorentz force on the sample mounting surface can be eliminated.

The present invention is characterized by the fact that the cyclotron resonance effect of electrons is larger in a portion within a range from the periphery of a sample to the outer side of the periphery than in the center of the sample so as to increase the generation of plasma in the portion within the range from the periphery of the sample to the outer side of the periphery than in the center of the sample. A means for decreasing the effect of the cyclotron resonance of electrons can be attained by increasing the distance between the cyclotron resonance region and the sample, or decreasing the degree of intersection between the magnetic field and the electric field.

When a gradient of the magnetic field near the cyclotron resonance region Bc is steepened to narrow the ECR resonance region, the cyclotron effect can be weakened. The ECR resonance region is formed in a range of a magnetic field intensity B, $Bc(1-a) \leq B \leq Bc(1+a)$ where $0.05 \leq a \leq 0.1$.

A large amount of ions are generated in the ECR resonance region since dissociation of the processing gas progresses there. On the other hand, a large amount of radicals are generated in the region other than the ECR resonance region since the dissociation of the processing gas does not progress significantly compared to progression in the ECR resonance region. By adjusting a width of the ECR resonance region and a high frequency electric power applied to the upper electrode, it is possible to independently control the amount of generated ions and the amount of generated radicals appropriate for processing the sample.

The present invention is characterized by a plasma processing apparatus comprising a vacuum processing chamber, a sample table for mounting a sample to be processed in the vacuum processing chamber, and a plasma generating means including a high frequency electric power source, which further comprises an electrostatic attracting means for holding the sample onto the sample table by an electrostatic attracting force; and a pulse bias applying means for applying a pulse bias voltage to the sample; the high frequency electric power source applying a high frequency voltage of 10 MHz to 500 MHz, the vacuum processing chamber being depressurized to 0.5 to 4.0 Pa.

The present invention is further characterized by a plasma processing apparatus comprising a vacuum processing chamber, a sample table for mounting a sample to be processed in the vacuum processing chamber, and a plasma generating means including a high frequency electric power source, which further comprises an electrostatic attracting means for holding said sample onto the sample table by an electrostatic attracting force; a pulse bias applying means connected to the sample table and for applying a pulse bias voltage to the sample; and a voltage suppressing means for suppressing a voltage rise generated by applying a pulse bias voltage corresponding to an electrostatic attracting capacity of the electrostatic attracting means.

The present invention is also characterized by a method of plasma processing comprising the steps of placing a sample on one of a pair of electrodes opposite to each other provided in a vacuum processing chamber; holding the sample onto the electrode by an electrostatic attracting force; introducing an etching gas into an environment in which the sample is placed; evacuating the environment to a pressure condition of 0.5 Pa to 4.0 Pa; forming the etching gas into a plasma under the pressure condition by applying a high frequency electric power of 10 MHz to 500 MHz; etching the sample by the plasma; and applying a pulse bias voltage to the one of the pair of electrodes.

The present invention is further characterized by a method of plasma processing comprising the steps of placing a sample on one of the electrodes opposite to each other; holding the placed sample onto the electrode by an electrostatic attracting force; introducing an etching gas into an environment in which the sample is placed; forming the introduced etching gas into a plasma; etching the sample by the plasma; and applying a pulse bias voltage having a pulse width of 250 V to 1000 V and a duty ratio of 0.05 to 0.4 to the one of electrodes during etching, whereby an insulator film, such as $SiO_2$, SiN, BPSG or the like, in the sample is plasma-processed.

According to another characteristic of the present invention, by applying a pulse-shaped bias voltage having a proper characteristic to a sample table having an electrostatic attracting means with a dielectric layer for electrostatic attracting, it is possible to appropriately control the temperature of a sample and stably perform required fine pattern processing. That is, the plasma processing apparatus comprises an electrostatic attracting means for holding a sample onto a sample table by an electrostatic attracting force, and a pulse bias applying means connected to the sample table for applying a pulse bias voltage to the sample table. The pulse bias voltage has a period of 0.2 to 2 $\mu s$ and a duty cycle in the positive direction less than one-half, and is applied to the sample through a capacitance element.

According to a further characteristic of the present invention, in regard to a voltage suppressing means for suppressing change in a voltage generated by applying the pulse bias voltage corresponding to an electrostatic attracting capacity of the electrostatic attracting means, the voltage suppressing means is designed so that voltage change due to an electrostatic attracting film of the electrostatic attracting means during one cycle of pulse is suppressed to one-half of the pulse bias voltage. In detail, this can be attained by reducing a thickness of an electrostatic chuck film made of a dielectric material provided on the surface of the lower electrode, or by employing a material having a large specific dielectric coefficient. Further, it is also possible to employ a method of suppressing an increase of voltage applied to both ends of the dielectric layer by shortening the period of the pulse bias voltage.

According to a further characteristic of the present invention, by applying a pulse bias voltage having a pulse width of 250 V to 1000 V and a duty ratio of 0.05 to 0.4 to the one of electrodes during etching, it is possible to improve the plasma processing selectivity of the base material of an insulator film, such as $SiO_2$, SiN, BPSG or the like.

The present invention is characterized by a plasma processing apparatus comprising a vacuum processing chamber, a sample table for mounting a sample to be processed in the vacuum processing chamber, and a plasma generating means, which further comprises an electrostatic attracting means for holding the sample onto the sample table by an electrostatic attracting force; a bias applying means for applying a bias voltage to the sample; a radical supplying means having a means decomposing a gas for generating radicals in advance and for supplying a required amount of the radicals to the vacuum processing chamber; a means for supplying a gas for generating ions to the vacuum processing chamber; and a plasma generating means for generating a plasma in the vacuum processing chamber, wherein $SiO_2$ is used as the sample.

The present invention is further characterized by a plasma processing apparatus comprising a vacuum processing chamber, a sample table for mounting a sample to be processed in the vacuum processing chamber, and a plasma generating means including a high frequency electric power source, which further comprises an electrostatic attracting means for holding the sample onto the sample table by an electrostatic attracting force; a pulse bias applying means for applying a pulse bias voltage to the sample; a radical generating plasma supplying means for forming a gas for generating radicals into a plasma in advance and for supplying a required amount of the radicals to the vacuum processing chamber; and the plasma generating means for supplying a gas for generating ions to the vacuum processing chamber and for generating a plasma in the vacuum processing chamber, whereby the high frequency electric power source applying a high frequency voltage of 10 MHz to 500 MHz, the vacuum processing chamber can be depressurized to 0.5 to 4.0 Pa.

According to another characteristic of the present invention, by controlling the amounts and the qualities of ions and radicals independently and applying a pulse bias voltage having an appropriate characteristic to a sample table having an electrostatic attracting means with a dielectric layer for electrostatic attracting, it is possible to properly control temperature of a sample and to stably perform required fine pattern processing.

Further, it is possible to improve the selectivity of plasma processing with a stable and better control condition by controlling the amounts and the qualities of ions and radicals independently and by obtaining a narrow ion energy distribution.

Furthermore, the amounts and the qualities of ions and radicals are independently controlled, and a voltage suppressing means, which suppresses change in a voltage corresponding to an electrostatic attracting capacity of the electrostatic attracting means generated by applying the pulse bias voltage, is designed so that voltage change due to an electrostatic attracting film of the electrostatic attracting means during one cycle of pulse is suppressed to one-half of the pulse bias voltage. In detail, this can be attained by reducing a thickness of an electrostatic chuck film made of a dielectric material provided on the surface of the lower electrode, or by employing a material having a large specific dielectric coefficient. Further, it is also possible to employ a method of suppressing an increase of voltage applied to both ends of the dielectric layer by shortening the period of the pulse bias voltage.

According to a further characteristic of the present invention, since the amounts and the qualities of ions and radicals are independently controlled and a pulse bias voltage having a pulse width of 250 V to 1000 V and a duty ratio of 0.05 to 0.4 is applied to the one of electrodes during etching, it is possible to improve the plasma processing selectivity of the base material to an insulator film, such as $SiO_2$, SiN, BPSG or the like.

Further according to a characteristic of the present invention, the amounts and the qualities of ions and radicals are independently controlled, a high frequency electric power source for generating a plasma of a high frequency voltage of 10 MHz to 500 MHz is used, and gas pressure in the processing chamber is set to a low pressure of 0.5 Pa to 4.0 Pa. Thereby, it is possible to obtain a stable plasma. Further, by using such a high frequency voltage, the plasma is well ionized and the control of selectivity during processing a sample is improved.

DETAILED DESCRIPTION OF THE PREFERRED EMBODIMENTS

Figure 1:
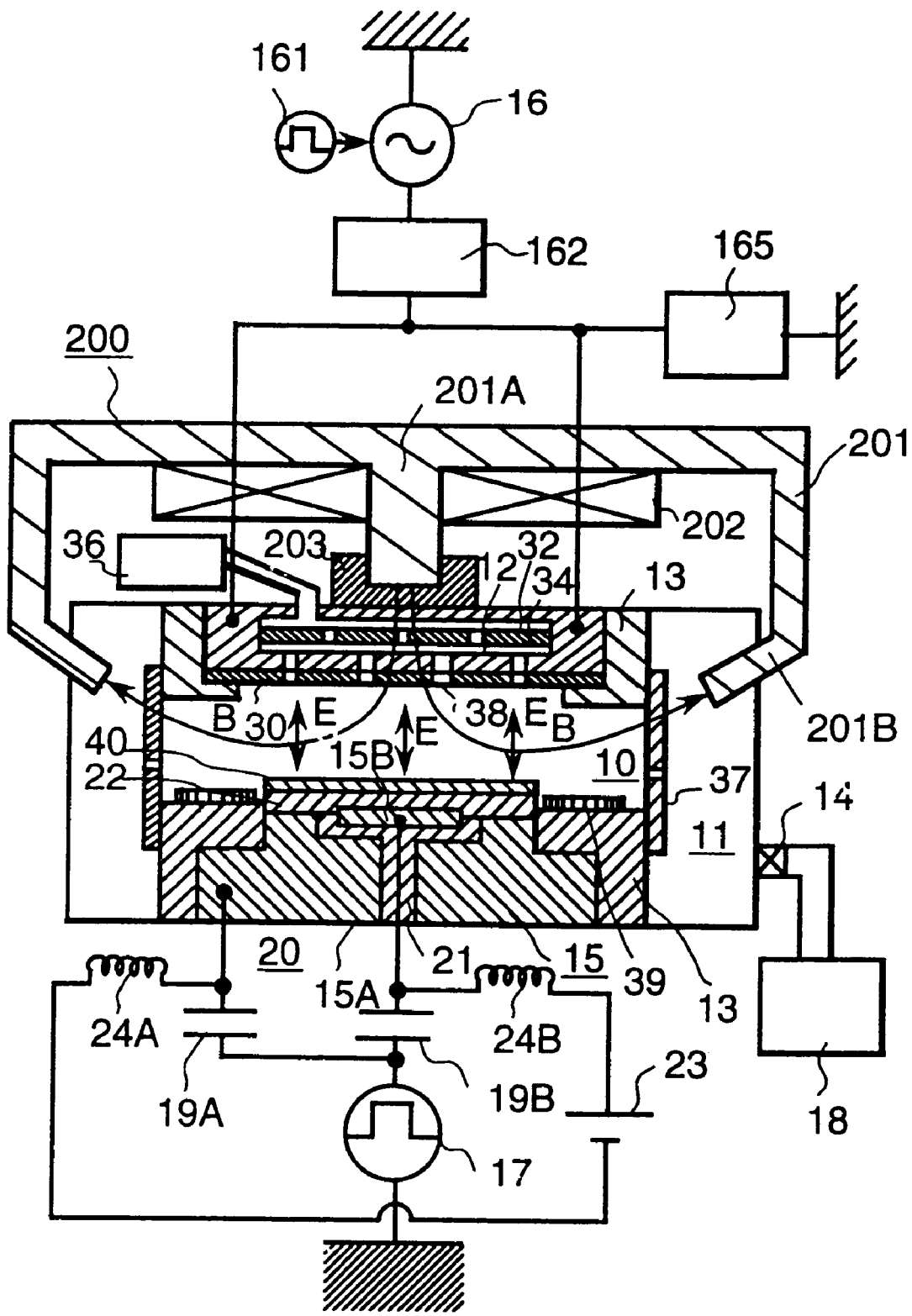
FIG. 1 is a vertical cross-sectional view showing an embodiment of a plasma etching apparatus of a two-electrode type in accordance with the present invention.

Embodiments of the present invention will be described below. FIG. 1 shows a first embodiment of a plasma etching apparatus using opposed electrodes to which the present invention is applied.

Referring to FIG. 1, a processing chamber 10 of a vacuum container has a pair of opposed electrodes composed of an upper electrode 12 and a lower electrode 15. On the lower electrode 15 a sample 40 is mounted. The distance of a gap between the electrodes 12 and 15 is preferably not smaller than 30 mm in order to suppress a pressure difference on the sample to within 10% when the sample has a large diameter of about 300 mm or larger. In order to decrease amounts of fluorine atoms, molecules and ions, the distance is desired to be not larger than 100 mm, preferably, not larger than 60 mm from the view point of effectively using a reaction product on the surfaces of the upper and the lower electrodes. A high frequency electric power source 16 for supplying a high frequency energy is connected to the upper electrode 12 through a matching box 162. The reference character 161 indicates a high frequency electric power modulating signal source. Between the upper electrode 12 and the ground there is connected a filter 165 which becomes a low impedance to the frequency component of a bias electric power source 17 and becomes a high impedance to the frequency component of the high frequency electric power source 16. The reference character 13 indicates an insulator member made of aluminum oxide or the like.

The area of the upper electrode 12 arranged nearly parallel to the sample table is larger than an area of the sample 40 to be processed so that voltage of the bias electric power source 17 is effectively and uniformly applied to the sheath on the sample table.

An upper electrode cover 30 of a fluorine removing plate made of silicon, carbon or SiC is provided on the bottom surface of the upper electrode 12. Further, a gas introducing chamber 34 is provided having a gas diffusion plate 32 for diffusing gas in a desired distribution. A gas necessary for processing operations such as etching the sample is supplied to the processing chamber 10 from a gas supplying unit 36 through the gas diffusion plate 32 of the gas introducing chamber 34, and holes 38 are provided in the in the upper electrode 12 and the upper electrode cover 30. An outer chamber 11 is evacuated by a vacuum pump 18 connected to the outer chamber 11 through a valve 14 to adjust pressure in the processing chamber 10 to a process pressure. A discharge confining ring 37 is provided in the processing chamber 10 to increase plasma density and make the reaction inside the processing chamber uniform. The discharge confining ring 37 has gaps for evacuation.

Above the upper electrode 12, there is provided a magnetic field forming means 200 which forms a magnetic field intersecting with an electric field E formed between the electrodes at a right angle and parallel to the surface of the sample 40. The magnetic field forming means 200 has a core 201, an electromagnetic coil 202 and an insulator member 203. A material for constructing the upper electrode 12 is a non-magnetic conductor such as aluminum, an aluminum alloy or the like. A material for constructing the processing chamber 10 is a non-magnetic material such as aluminum, an aluminum alloy, aluminum oxide, quartz, SiC or the like. The core 201 is formed in an axial-rotating symmetrical structure having a nearly E-shaped cross section with the cores 201A, 201B so as to form a magnetic field B of which the magnetic fluxes extend from the upper central portion of the processing chamber 10 toward the upper electrode 12 and then extend along and in parallel to the upper electrode 12 toward the periphery of the upper electrode. The magnetic field formed between both electrodes by the magnetic field forming means 200 has a portion of a static magnetic field or a low frequency magnetic field (lower than 1 kHz) having an intensity of 10 gauss to 110 gauss, preferably, 17 gauss to 72 gauss for producing cyclotron resonance.

It is well-known that the relationship between an intensity $B_c$ (gauss) of the magnetic field for producing cyclotron resonance and a frequency f (MHz) of the plasma forming high frequency source can be expressed as $B_c$=0.357 Xf (MHz).

The two electrodes 12 and 15 in the present structure may have some indent portions or projecting portions depending on, for example, a requirement of a plasma forming characteristic as far as the pair of opposite electrodes 12 and 15 are substantially in parallel to each other. In such a two-electrode type, the electric field distribution between the two electrodes can be easily made uniform. Accordingly, generation of plasma by cyclotron resonance can be made uniform comparatively easily by improving the uniformity of the magnetic field intersecting with the electric field at a right angle.

The lower electrode 15 mounting and holding the sample 40 has a two-pole type electrostatic chuck 20. That is, the lower electrode 15 is composed of a first lower electrode 15A in the outer side and a second lower electrode 15B arranged in the inner side through an insulator member 21, and an electrostatic attracting dielectric layer 22 (hereinafter referred to as an electrostatic attracting film) is provided on the upper surfaces of the first and the second lower electrodes. A direct current source 23 is connected to the first and second lower electrodes through coils 24A, 24B for cutting a high frequency component to apply a direct current voltage between both lower electrodes so that the second lower electrode 15B is charged positively. Thereby, the sample 40 is attracted and held onto the lower electrode 15 by a Coulomb force acting between the sample 40 and both lower electrodes through the electrostatic attracting film 22. A material usable for the electrostatic attracting film 22 is a dielectric material such as aluminum oxide, titanium oxide containing aluminum oxide or the like. As the electric source 23, a direct current source of several hundred volts can be used.

A pulse bias electric power source 17 for supplying a pulse bias having an amplitude of 20 V to 1000 V is connected to the lower electrodes 15A, 15B through blocking capacitors 19A, 19B for cutting Direct current components, respectively.

Although the electrostatic chuck of a two-pole type has been described above, an electrostatic chuck of another type such as a single-pole type or an e-pole type (n≧3) may be applicable.

When etching is performed, the sample 40 of an object to be processed is mounted on the lower electrode 15 in the processing chamber 10 and attracted by the electrostatic chuck 20. On the other hand, a gas required for etching the sample 40 is supplied to the processing chamber 10 from the gas supplying unit 36 through the gas introducing chamber 34. The outer chamber 11 is vacuum-pumped by the vacuum pump 18 to be evacuated and depressurized so that pressure of the processing chamber becomes a processing pressure of the sample, for example, a pressure of 0.4 Pa to 4.0 Pa. Then, a high frequency electric power of 30 MHz to 300 MHz, preferably 50 MHz to 200 MHz, is output from the high frequency electric power source 16 to form the processing gas in the processing chamber 10 into a plasma.

By the high frequency electric power of 30 MHz to 300 MHz and the portion of static magnetic field of 10 gauss to 110 gauss formed by the magnetic field forming means 200, cyclotron resonance of electrons is generated between the upper electrode 12 and the lower electrode 15 to form a plasma having a low pressure, 0.4 to 4.0 Pa in this case, and a high density.

On the other hand, a pulse bias voltage of 20 V to 1000 V having a period of 0.1 $\mu$s to 10 $\mu$s, preferably 0.2 $\mu$s to 5 $\mu$s, and a duty in a positive pulse portion of 0.05 to 0.4 is applied to the lower electrode 15 from the pulse bias electric power source 17 to etch the sample while the electrons and the ions in the plasma are being controlled.

The etching gas is formed in a desired distribution by the gas diffusion plate 32 and then introduced into the processing chamber 10 through the holes 38 bored in the upper electrode 12 and the upper electrode cover 30.

Materials which can be used for the upper electrode cover 30, include carbon, silicon or a material containing carbon or silicon which removes the components of fluorine and/or oxygen to improve the selectivity to the resist and/or silicon to the base material.

In order to improve the micro workability of a large diameter sample, it is preferable that a plasma generating high frequency electric power source 16 having a high frequency is used to attempt to stabilize discharge in a low pressure region. In the present invention, the plasma generating high frequency electric power source 16 is connected to the upper electrode 12 in order to obtain a plasma which is a low pressure of 0.4 Pa to 4.0 Pa and a plasma density of $5 \times 10^{10}$ to $5 \times 10^{11}$ cm$^{-3}$, and dissociation of the processing gas is not excessively progressed and has a uniform and large diameter. On the other hand, an ion energy controlling bias electric source 17 is connected to the lower electrode 15 mounting the sample, and the distance between the electrodes is set between 30 mm to 100 mm.

Further, using a VHF voltage of 30 MHz to 300 MHz, preferably 50 MHz to 200 MHz, for the plasma generating high frequency electric power source 16, and by the interaction with the portion of the static magnetic field or the low frequency (lower than 1 kHz) magnetic field having an intensity of 10 gauss to 110 gauss, preferably 17 gauss to 72 gauss, cyclotron resonance of electrons is formed between the upper electrode 12 and the lower electrode 15.

Figure 2:
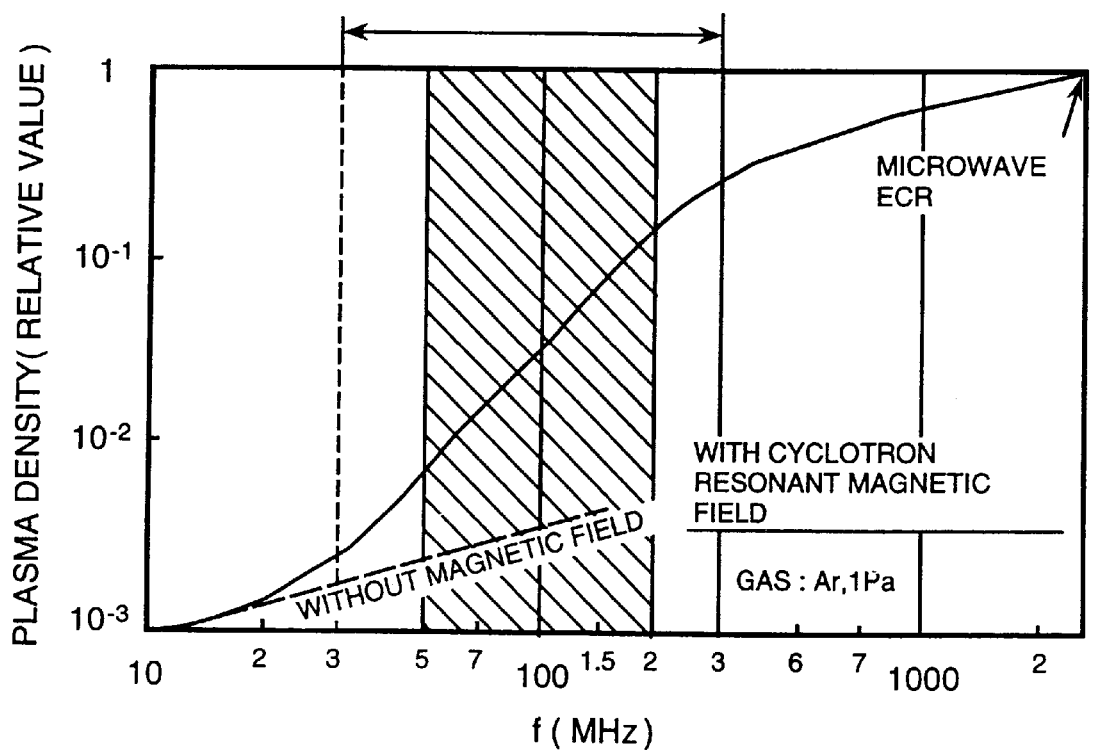
FIG. 2 is a graph showing an example of change in plasma density when the frequency of a high frequency electric power source for generating a plasma is changed under a condition where a magnetic field for producing cyclotron resonance of electrons is applied.

FIG. 2 shows an example of the change in plasma density when the frequency of a high frequency electric power source for generating a plasma is changed under a condition where a magnetic field for producing cyclotron resonance of electrons is applied. The gas used is argon with 2 to 10% of $C_4F_8$ added thereto, and the pressure of the processing chamber is 1 Pa. The plasma density in the figure is shown as a normalized value by letting the density in a case of a microwave ECR with f=2450 MHz be 1 (one). The dashed line in the figure shows a result obtained in a case without a magnetic field.

The plasma density is lower by one order to two orders compared to that in the microwave ECR when the frequency is in the range of 50 MHz≦f≦200 MHz. Further, dissociation of the gas is also decreased and generation of unnecessary fluorine atoms, molecules and ions is decreased by one order or more. By using the frequency in the VHF band and cyclotron resonance, a plasma having appropriately high density, namely, a plasma density above $5\times10^{10}$ cm$^{-3}$ in absolute value is obtained, and a high rate processing is also possible under a low pressure of 0.4 Pa to 4.0 Pa. Furthermore, since dissociation of the gas is not excessively progressed, the selectivity of an insulator film such as $SiO_2$ to the base material such as Si or SiN is not appreciably degraded.

When the frequency is within the range of 50 MHz≦f≦200 MHz, the dissociation of the processing gas is slightly progressed compared to that in a conventional apparatus of parallel flat plate electrode type using a frequency of 13.56 MHz, and the disadvantage of a small increase in the amount of fluorine atoms and/or molecules and/or ions can be eliminated by providing a material containing silicon or carbon to the surface of the electrodes and wall surface of the chamber, and further by applying a bias voltage to the electrodes and the wall surface of the chamber or by exhausting fluorine through coupling the fluorine with hydrogen using a gas containing hydrogen atoms.

When the frequency of the high frequency electric power source is above 200 MHz, particularly, above 300 MHz, the plasma density becomes high. However, it is not preferable since the dissociation of the processing gas becomes large and fluorine atoms and/or molecules and ions are extremely increased, and consequently the selectivity to the base material is largely degraded.

Figure 3:
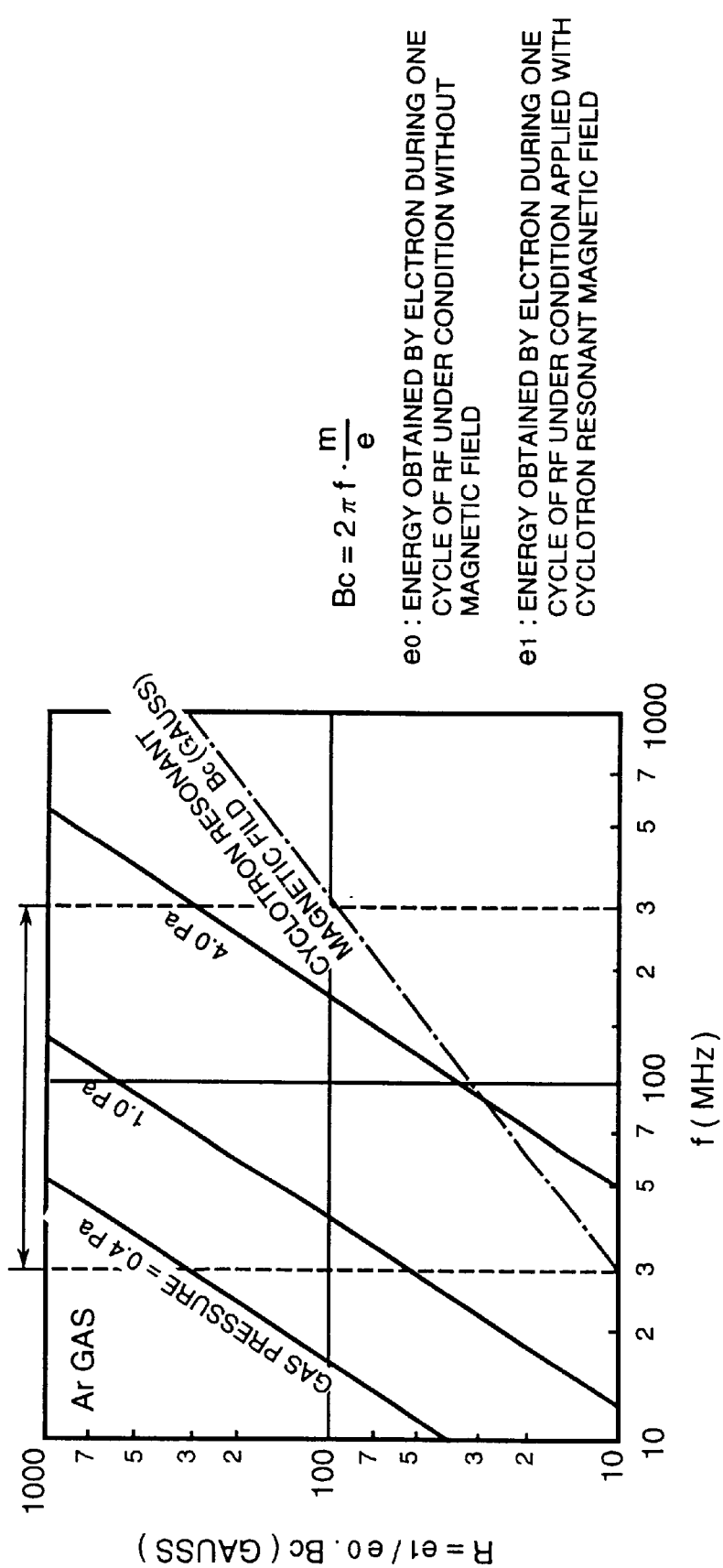
FIG. 3 is a graph showing energy gains k of electrons obtained from a high frequency electric field under conditions with and without cyclotron resonance.

FIG. 3 shows an energy gains k of electrons obtained from a high frequency electric field under conditions with and without cyclotron resonance. Letting an energy obtained by an electron during one cycle of a high frequency source under a condition without the magnetic field be $e_0$, and an energy obtained by an electron during one cycle of a high frequency source under a condition applied with a cyclotron resonance magnetic field $B_c=2\pi f\cdot(m/e)$ be $e_1$, $e_0$ and $e_1$ are expressed as the following equations:

$$e_0=(e^2E^2/2\ m)\ \{v/(w^2+v^2)\} e_1=(e^2E^2v/4\ m)\{1/(v^2+(w-wc)^2)+1/(v^2+(w+wc)^2)\}$$ (Equation 1)

where E is the intensity of the electric field.

Letting the ratio ($=e_1/e_0$) be k, k is expressed by the following equation, where m is the mass of an electron, e is the charge of an electron and f is charged frequency:
k=(1/2) $(w^2+v^2)$ $\{1/(v^2+(w-wc)^2)+1/(v^2+(w+wc)^2\}$, where
v is collision frequency, w is exciting angular frequency, and wc is cyclotron angular frequency.

In general, the value k becomes larger as the gas pressure is lower and the frequency is higher. FIG. 3 is a result obtained using argon gas in which k≧150 when f≧50 MHz under a condition of pressure P=1 Pa, and dissociation of the processing gas is progressed even under a low pressure compared to in a case without the magnetic field. The cyclotron resonance effect is rapidly decreased under a condition of pressure P=1 Pa when the frequency is below nearly 20 MHz. It can be understood from the characteristic shown in FIG. 2 that when the frequency is lower than 30 MHz, there is little difference in the result from that in a case without the magnetic field, and the cyclotron resonance effect is small.

Although the cyclotron resonance effect can be increased by decreasing the gas pressure, electron temperature of the plasma is increased and there occurs an opposite effect in that the dissociation of the gas is excessively progressed when the gas pressure is lower than 1 Pa. In order to suppress the excessive dissociation of gas and to increase the plasma density above $5\times10^{10}$ cm$^{-3}$, the gas pressure is set to at a value in the range of 0.4 Pa to 4 Pa, preferably, 1 Pa to 4 Pa.

In order to attain an effective cyclotron resonance effect, it is necessary to set the value k to several tens or larger. It can be understood from FIG. 2 and FIG. 3 that in order to effectively use the cyclotron resonance effect without excessively progressing dissociation of the gas, it is required to set the gas pressure to a value of 0.4 Pa to 4 Pa and to use a VHF of 30 MHz to 300 MHz, preferably, 50 MHz to 200 MHz for plasma generating high frequency electric power.

Figure 4:
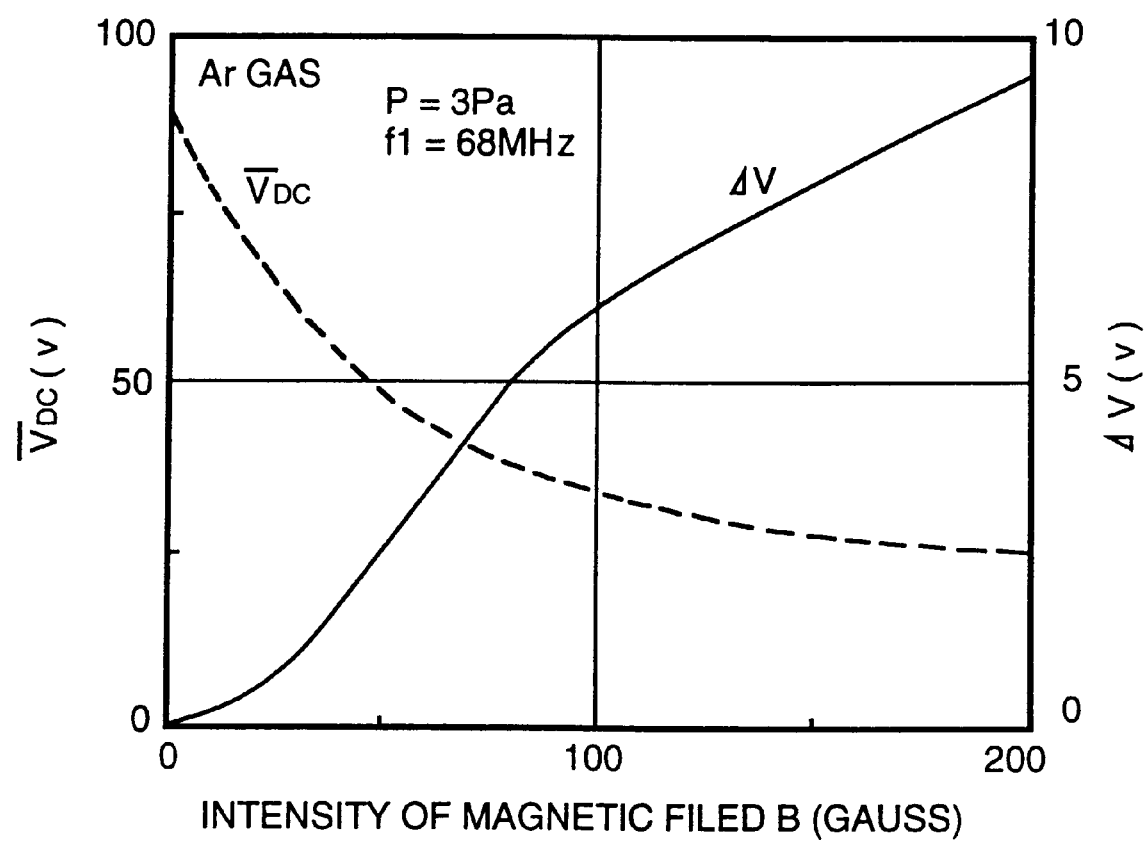
FIG. 4 is a graph showing the relationship between intensity of a magnetic field and an ion acceleration voltage $V_{DC}$ induced in a sample, as well as the deviation $\Delta V$ of an induced voltage in the sample when an upper electrode of a magnetron discharge electrode is grounded and a lower electrode is applied with a magnetic field B and a high frequency electric power.

FIG. 4 shows the relationship between intensity of a magnetic field and an ion acceleration voltage $V_{DC}$ induced in a sample, deviation $\Delta V$ of an induced voltage in the sample when an upper electrode of a magnetron discharge electrode is grounded and a lower electrode is applied with a magnetic field B and a high frequency electric power. As the intensity of magnetic field is increased, the ion acceleration voltage $V_{DC}$ becomes small by Lorentz force action on electrons and consequently the plasma density is increased. However, since the intensity of magnetic field B is as large as 200 gauss in the conventional magnetron discharge type, there is a disadvantage in that uniformity of plasma density in the surface is degraded and the deviation $\Delta V$ of the induced voltage becomes large to increase damage of the sample.

It can be understood from FIG. 4 that in order to decrease the deviation $\Delta V$ to ⅕ to 1/10 of that in the conventional magnetron discharge type having a magnetic field intensity of 200 gauss, in order to eliminate sample damage the intensity of the magnetic field B is set to a value below 30 gauss near the sample surface, preferably, set to a value smaller than 15 gauss.

Figure 5:
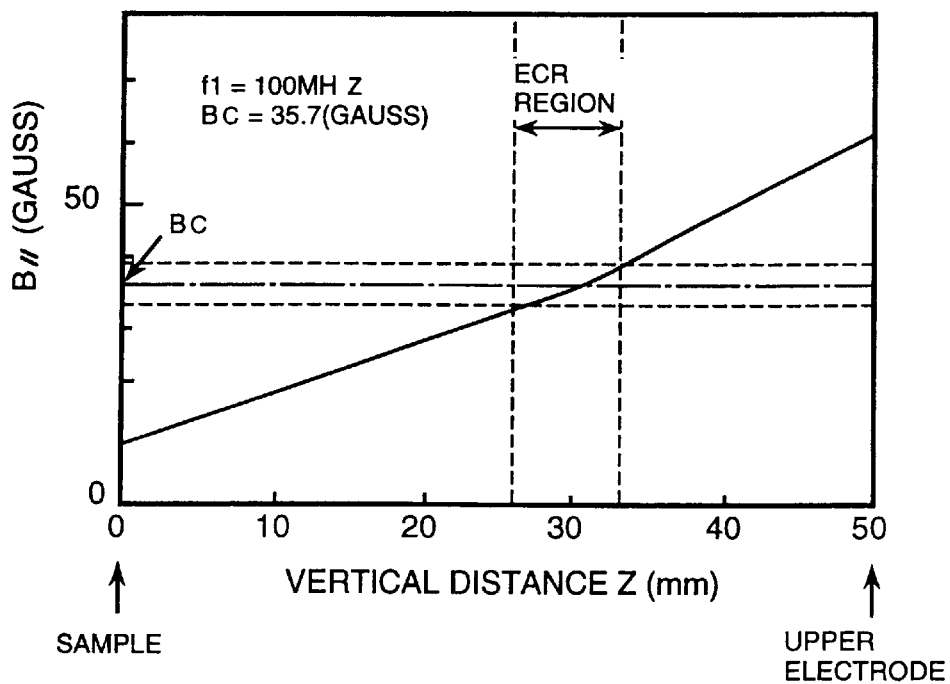
FIG. 5 is a graph showing a magnetic field characteristic of the plasma etching apparatus of FIG. 1.

A cyclotron resonance region is formed between the upper electrode 12 and the lower electrode 15 and slightly on the side of the upper electrode from the middle position of both electrodes. The abscissa in FIG. 5 indicates distance from the sample surface (the lower electrode 15) to the upper electrode 12, and the ordinate indicates magnetic field. FIG. 5 shows an example obtained under a condition of an applied frequency $f_1$ of 100 MHz, $B_c$ of 37.5 G and a distance between the electrodes of 50 mm, in which an ECR region is formed in a position about 30 mm from the sample surface.

As described above, in the present invention, a portion where the component of magnetic field parallel to the lower electrode 15 (the sample mounting surface) becomes maximum is set on the upper electrode surface or on the side of the upper electrode from the middle position between the two electrodes. By doing so, the intensity of the magnetic field parallel to the sample on the lower electrode surface is set to a value smaller than 30 gauss, preferably, smaller than 15 gauss to make the Lorentz force (E×B) acting on electrons near the lower electrode surface a small value, and consequently it is possible to eliminate the non-uniformity in the plane of plasma density due to the electron drift effect caused by Lorentz force on the lower electrode surface.

Figure 6:
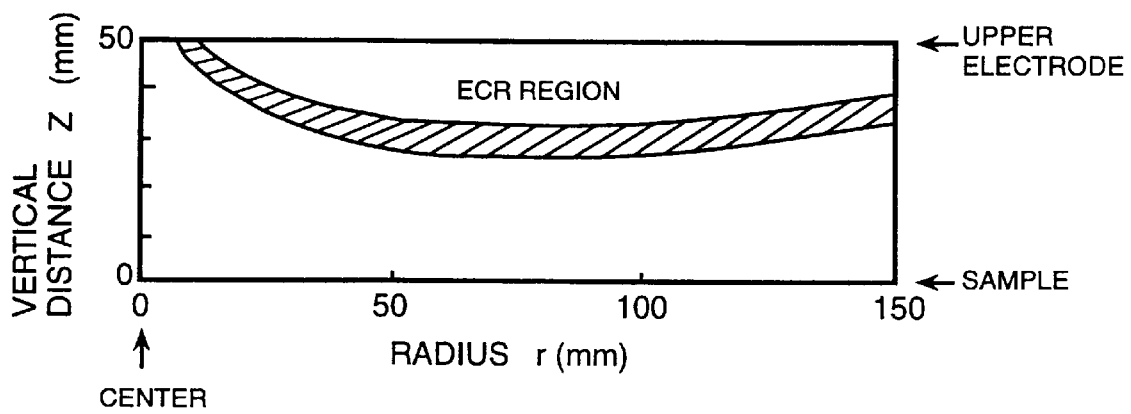
FIG. 6 is a graph explaining an ECR region of the plasma etching apparatus of FIG. 1.

According to the magnetic field forming means 200 in the embodiment of FIG. 1, the ECR region is formed nearly in the same level from the lower electrode 15 (the sample mounting surface) except for the central portion of the sample, as shown in FIG. 6. Therefore, a sample having a large diameter can be plasma-processed uniformly. However, the ECR region in the central portion of the sample is formed in a position of higher level from the sample mounting surface. Since the distance between the ECR region and the sample table is larger than 30 mm, ions and radicals are diffused and averaged in the gap. Therefore, there is no problem in a general plasma processing operation. However, in order to perform plasma-processing all over the sample uniformly, it is preferable that the ECR region is formed in a position of the same level from the sample surface all over the surface of the sample, or the ECR region is formed in a position slightly closer to the periphery of the sample table compared to the level of the ECR region in the central portion. The method of forming such a plasma will be described later.

As described above, in the embodiment of the present invention shown in FIG. 1, since a VHF voltage of 30 MHz to 300 MHz forming the plasma generating high frequency electric power source 16 is used and dissociation of the processing gas is progressed by electron cyclotron resonance, it is possible to obtain a stable plasma even when gas pressure inside the processing chamber is as low as 0.4 Pa to 4 Pa. Further, since ion collision in the sheath is reduced, moving directions of ions during processing the sample 40 are well aligned to improve the verticality in the fine pattern processing.

In regard to the surrounding of the processing chamber 10, since the plasma is confined in the vicinity of the sample 40 by the discharge confining ring 37, the plasma density is increased and attaching of unnecessary deposits to portions outside the discharge confining ring 37 is minimized.

A material used for the discharge confining ring 37 is a semiconductor material or a conductor material such as carbon, silicon or SiC. When the discharge confining ring 37 is connected to a high frequency electric power source to cause sputtering by ions, it is possible to decrease attaching of deposits to the ring 37 and also to remove fluorine.

Since fluorine can be removed by providing a suscepctive cover 39 made of carbon, silicon or a material containing carbon or silicon on the insulator member 13 near the sample when an insulator film such as $SiO_2$ is plasma-processed using a gas containing fluorine, the selectivity can be improved. In this case, when the thickness of the insulator member 13 in a portion under the susceptive cover 39 is thinned to 0.5 mm to 5 mm, the effect described above can be promoted by the sputtering effect by ions.

Further, an electrostatic attracting circuit is formed through the lower electrode 15 (15A, 15B) and the sample 40 interposing the electrostatic attracting film 22 of dielectric material. In this state, the sample 40 is held and maintained onto the lower electrode 15 by an electrostatic force. Along the back side surface of the sample 40 held by the electrostatic attracting force, a heat transfer gas such as helium, nitrogen, argon or the like is supplied. The heat transfer gas is filled between the back side surface of the sample 40 and the lower electrode 15, and the heat transfer gas is set to a pressure of several hundreds pascals to several thousands pascals. It is considered that the electrostatic attracting force is nearly zero between the indented portions existing in gaps and acts only in the projecting portions of the lower electrode 15. However, as described later, since it is possible to set an attracting force large enough to withstanding the pressure of the heat transfer gas by properly setting a voltage of the direct current electric power source 23, the sample 40 cannot be moved or blown off by the heat transfer gas.

The electrostatic attracting film 22 acts to decrease the bias function of pulse bias to ions in the plasma. The function exists in a conventional method of biasing using a sinusoidal electric power source, but the problem does not clearly appear. However, the problem becomes clear in the pulse bias method since the characteristic of the pulse bias method of narrow ion energy width is lost.

The present invention is characterized by a voltage suppressing means that is provided in order to suppress the increase of the voltage difference generated between the ends of the electrostatic attracting film 22 accompanied by application of the pulse bias to increase the pulse bias effect.

As an example of the voltage suppressing means, it is preferable that the voltage change ($V_{CM}$) in one cycle of the bias voltage generated between the ends of the electrostatic attracting film accompanied by application of the pulse bias is lower than one-half of the voltage ($V_P$) of the pulse bias. In detail, there is a method for increasing the electrostatic capacity of the dielectric member by thinning a thickness of the electrostatic attracting film made of a dielectric material provided on the surface of the lower electrode, or by employing a material having a large specific dielectric coefficient.

Further, as another example of the voltage suppressing means, there is a method of suppressing the increase of the voltage $V_{CM}$ by shortening the period of the pulse bias voltage. Furthermore, it is also considered that the electrostatic attracting circuit and the pulse bias voltage applying circuit are separately arranged in different positions, for example, another different electrode opposite to the electrode mounting and holding the sample, or a third electrode provided separately.

Description will be made in detail below on the relationship between the voltage change ($V_{CM}$) in one cycle of the bias voltage generated between the ends of the electrostatic attracting film and the pulse bias voltage which should be brought by the voltage suppressing means in accordance with the present invention, referring to FIG. 7 to FIG. 13.

Figure 7A:
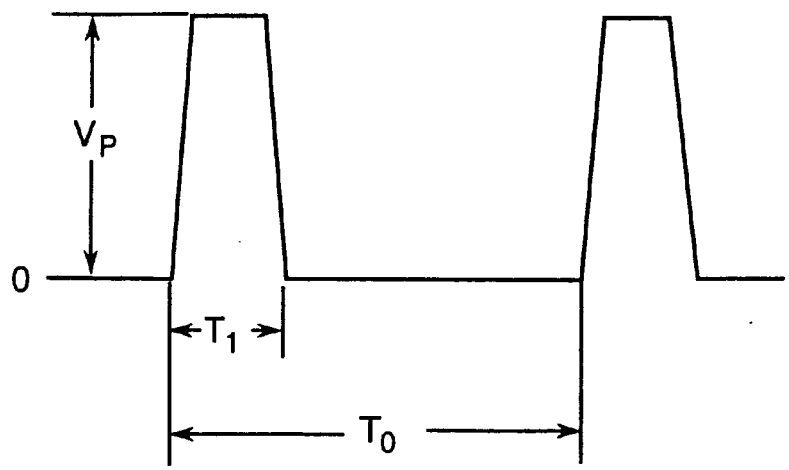
FIGS. 7(A) and 7(B) are charts showing examples of preferable output wave-forms used in a pulse bias electric power source in accordance with the present invention.
Figure 7B:
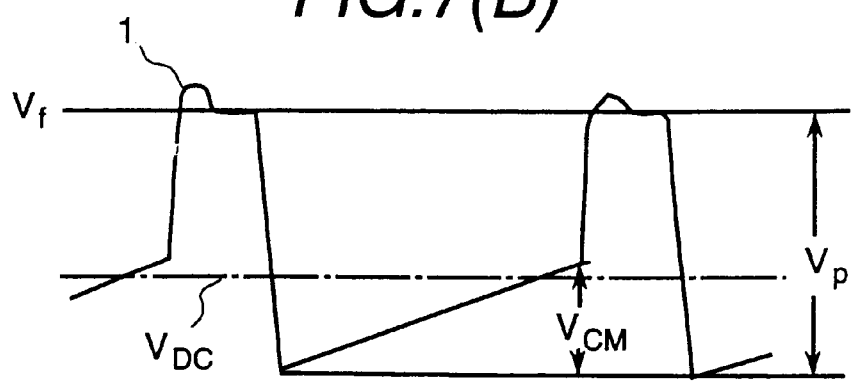

FIGS. 7(A) and 7(B) show an example of a desirable output waveform used in the pulse bias power source 17 in accordance with the present invention. In the figure, pulse amplitude is $v_p$, pulse period is $T_0$, and positive direction pulse width is $T_1$.

When the wave-form of FIG. 7(A) is applied to a sample though a blocking capacitor and an electrostatic attracting dielectric layer (hereinafter referred to as electrostatic attracting film), the voltage wave-form on the surface of the sample under a steady-state condition where a plasma is generated by another power source becomes as shown in FIG. 7 (B). Referring to the labelling of FIG. 7(B), $V_{DC}$ is direct current component voltage of the wave-form $V_f$ is floating potential of the plasma, and $V_{CM}$ is maximum voltage during one cycle of the voltage produced between both ends of the electrostatic attracting film.

The portion (1) which is positive voltage to $V_f$ in FIG. 7(B) is a portion where only electron current is mainly dragged, the portion which is negative voltage to $V_f$ is a portion where ion current is dragged, and the portion $V_f$ is a portion where electrons and ions are balanced. The voltage $V_f$ is generally several volts to several tens of volts.

In the description according to FIG. 7(A) and thereafter, it is assumed that the capacitance of the blocking capacitor and the capacitance of the insulator member near the sample surface are sufficiently larger than the capacitance of the electrostatic attracting film (hereinafter referred to as electrostatic attracting capacitance).

The value $V_{CM}$ is expressed by the following equation:

$$V_{CM} = (q/c) = \{i_{i,X}(T_0 - T_1)\} / \{(\epsilon_r \epsilon_0/d) \times K\} \quad \text{(Equation 2)}$$

In this equation, q is ion current density (averaged value) entering into the sample during the period of $(T_0-T_1)$, $i_i$ is ion current density, d is film thickness of the electrostatic attracting film, K is electrode cover ratio of the electrostatic attracting film ($\leq 1$), $\epsilon_r$ is the specific dielectric constant of the electrostatic attracting film, and $\epsilon_0$ is dielectric constant of vacuum (constant value).

FIGS. 8(A) to 8(E) and FIG. 9 show electric potential wave-forms on the sample surface and probability distribution of ion energy when To is varied while a pulse duty ratio $(T_1/T_0)$ is being kept constant. Therein, $T_{01}:T_{02}:T_{03}:T_{04}:T_{05}=16:8:4:2:1$.

Figure 8A:
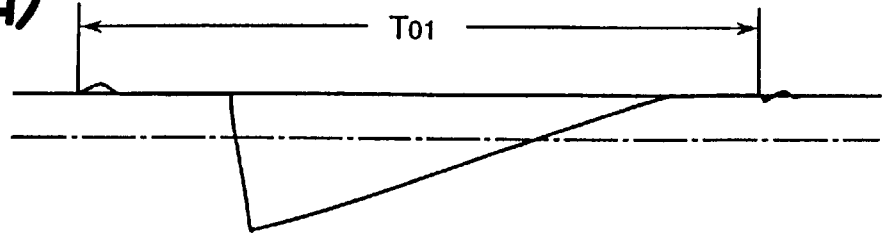
FIGS. 8(A) to 8(E) are charts showing electric potential wave-forms on a sample surface and probability distribution of ion energy when $T_0$ is varied while a pulse duty ratio $(T_1/T_0)$ is being kept constant.
Figure 8B:
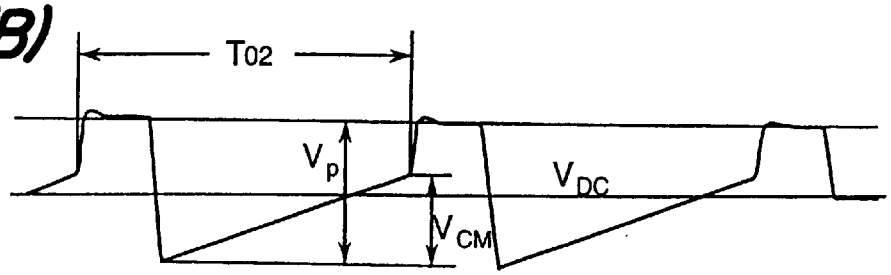
Figure 8C:
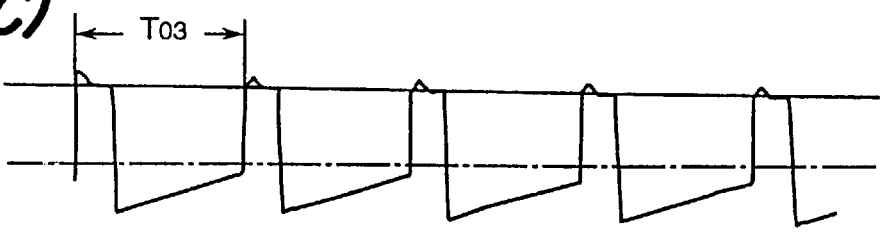
Figure 8D:
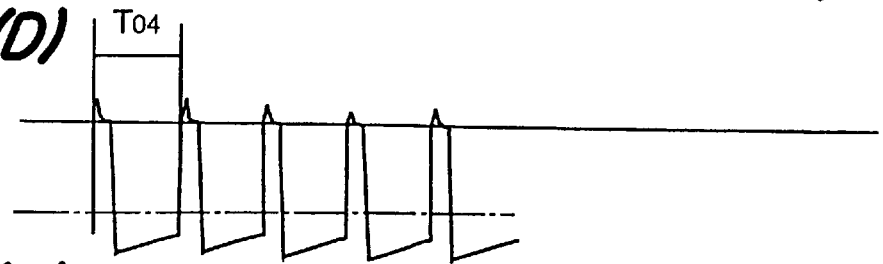
Figure 8E:
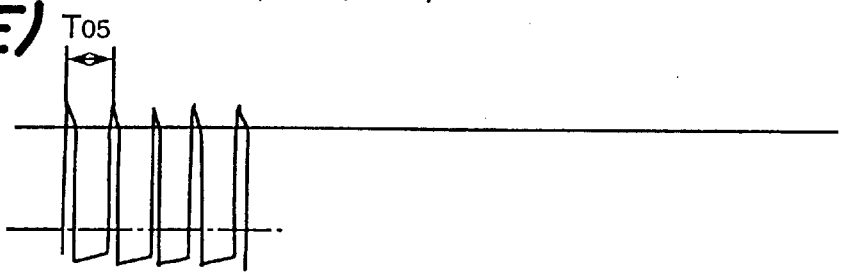
Figure 9:
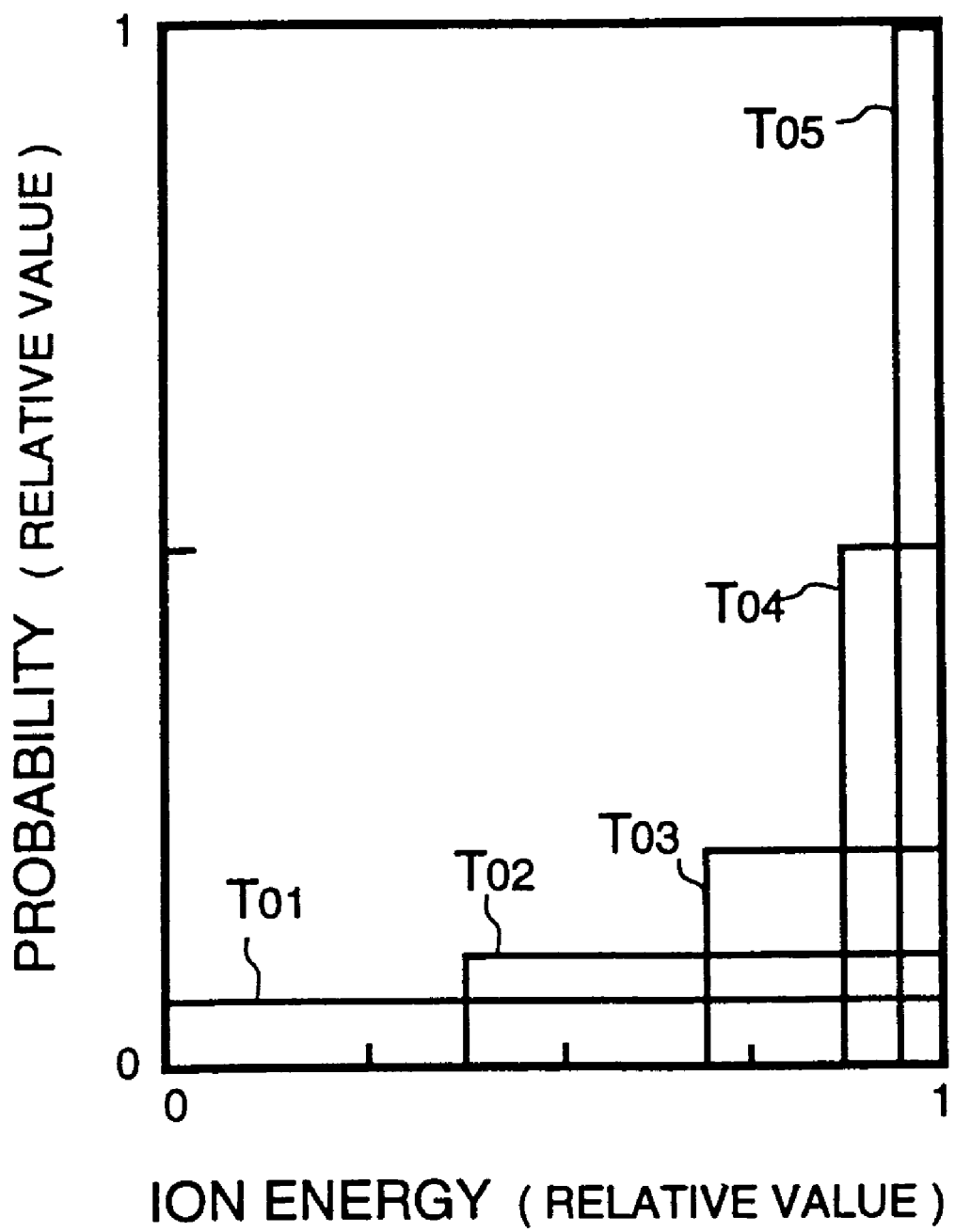
FIG. 9 is a chart showing an electric potential wave-form on a sample surface and probability distribution of ion energy when $T_0$ is varied while a pulse duty ratio is being kept constant.

As shown in FIG. 8(A), when the pulse period $T_0$ is too large, the electric potential on the sample surface is largely deformed from a rectangular wave-form and becomes a triangular wave-form. The distribution of ion energy becomes constant from a low ion energy region to a high ion energy region, as shown in FIG. 9, which is not preferable.

As shown in FIGS. 8(B) to (E), as the pulse period $T_0$ is decreased to small, the value $(V_{CM}/V_P)$ becomes smaller than 1 (one), and the ion energy distribution is also narrowed.

In FIGS. 8(A) to 8(E) and FIG. 9, the relationship $T_0=T_{01}$, $T_{02}$, $T_{03}$, $T_{04}$, $T_{05}$ corresponds to $(V_{CM}/V_P)=1, 0.63, 0.31, 0.16, 0.08$.

Figure 10:
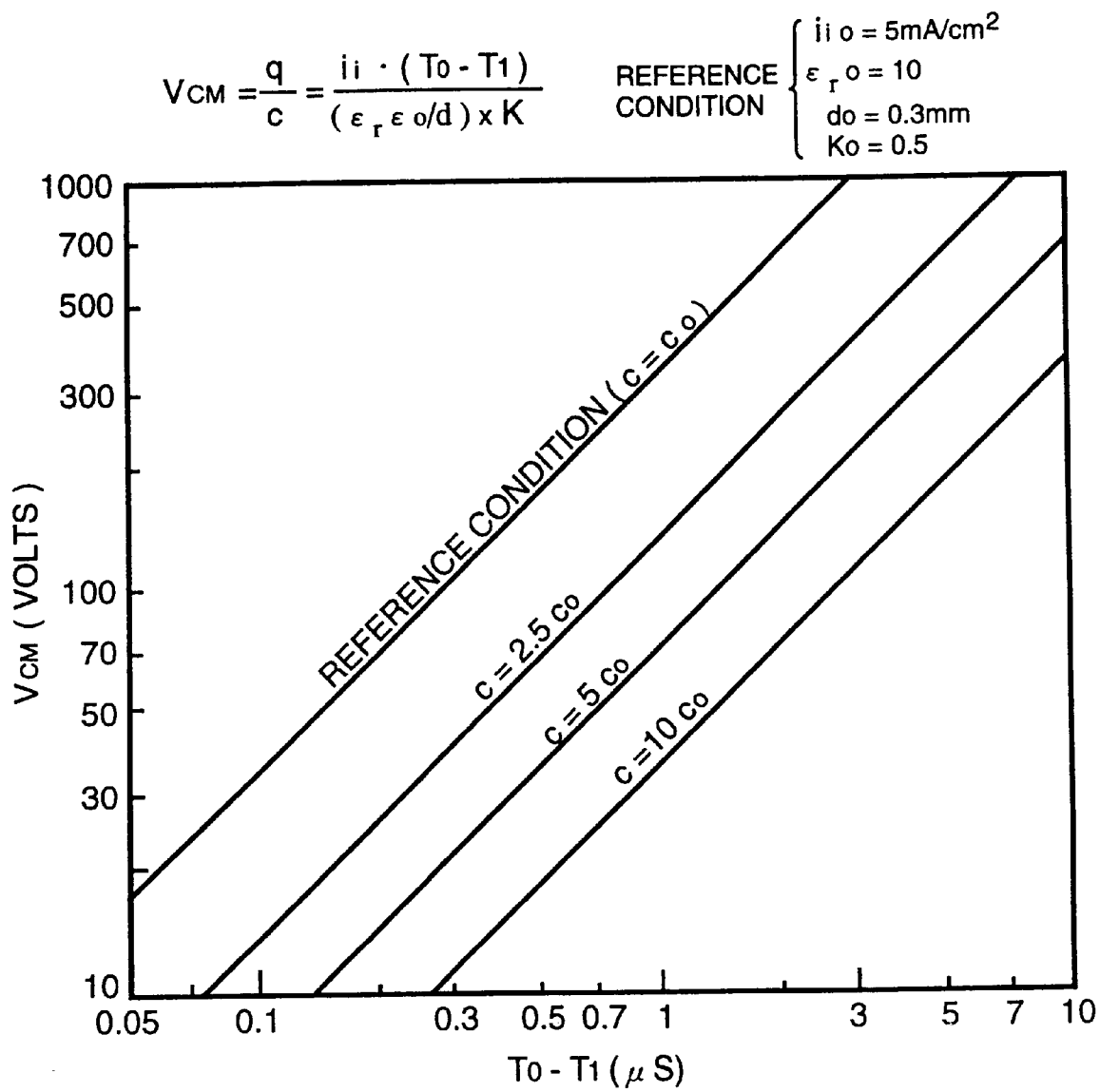
FIG. 10 is a graph showing the relationship between the pulse OFF period $(T_1-T_0)$ and maximum voltage $V_{CM}$ during one cycle of a voltage induced between both ends of an electrostatic attracting film.

Next, FIG. 10 shows the relationship between pulse OFF period $(T_1-T_0)$ and maximum voltage $V_{CM}$ during one cycle of a voltage induced between both ends of the electrostatic attracting film.

The solid bold line (line for reference condition) in FIG. 10 shows change of the value $V_{CM}$ in a plasma having a medium density of ion current density $i_i=5$ mA/cm$^2$ when about 50% of the area of the electrode (K=0.5) is flattened to touch to the back side of the sample 40, and is covered with aluminum oxide containing titanium oxide ($\epsilon_r=10$) with a thickness of 0.3 mm.

It can be understood from FIG. 10 that as the pulse OFF period $(T_1-T_0)$ is increased, the voltage $V_{CM}$ induced between both ends of the electrostatic attracting film is increased proportional to the period and becomes higher than the pulse voltage $v_p$ generally used.

For example, in a plasma etching apparatus, the pulse voltage $v_p$ is generally limited as follows in connection to occurrence of damage, selectivity to base material and/or a mask, a shape and so on:

For gate etching: 20 volts $\leq v_p \leq$ 100 volts
For metal etching: 50 volts $\leq v_p <$ 200 volts
For oxide film etching: 250 volts $\leq v_p \leq$ 1000 volts When it is tried to satisfy the condition $(V_{CM}/V_P) \leq 0.5$, to be described later, in the reference condition, the limit in the pulse OFF period $(T_1-T_0)$ becomes as follows:

For gate etching: $(T_1-T_0) \leq 0.15$ µs
For metal etching: $(T_1-T_0) \leq 0.35$ µs
For oxide film etching: $(T_1-T_0) \leq 1.2$ µs When $T_0$ approaches to 0.1 µs, unnecessary plasma is generated and the bias electric source is not effectively used for ion acceleration since the impedance of the ion sheath approaches to or becomes lower than the impedance of the plasma. Thereby, controllability of ion energy by the bias electric power source is degraded. Therefore, it is desired that the period $T_0$ is larger than 0.1 µs, preferably, larger than 0.2 µs.

In a gate etching apparatus in which $v_p$ can be suppressed to a low value, it is necessary to employ a material having a specific dielectric constant as high as 10 to 100 for the electrostatic attracting film, for example, a dielectric constant $\epsilon_r$ of Ta$_2$O$_3$ is 25, and to also decrease the film thickness, for example, to a thickness of 10 µm to 400 µm, preferably, to a thickness of 10 µm to 100 µm, without reducing the insulating withstanding voltage.

In FIG. 10, there are also shown the values of $V_{CM}$ when electrostatic capacitance per unit area is increased by 2.5 times, 5 times and 10 times. Even if an electrostatic attracting film is improved, it is thought that the electrostatic capacitance c can be increased by several times in the present situation. Assuming $V_{CM} \leq 300$ volts, $c \leq 10c_0$, the following relation can be obtained:

$$0.1 \text{ µs} \leq (T_0-T_1) \leq 10 \text{ µs}.$$

A portion effective for plasma processing by ion acceleration is the portion $(T_0-T_1)$, and therefore it is preferable that the pulse duty $(T_1/T_0)$ is as small as possible.

Figure 11:
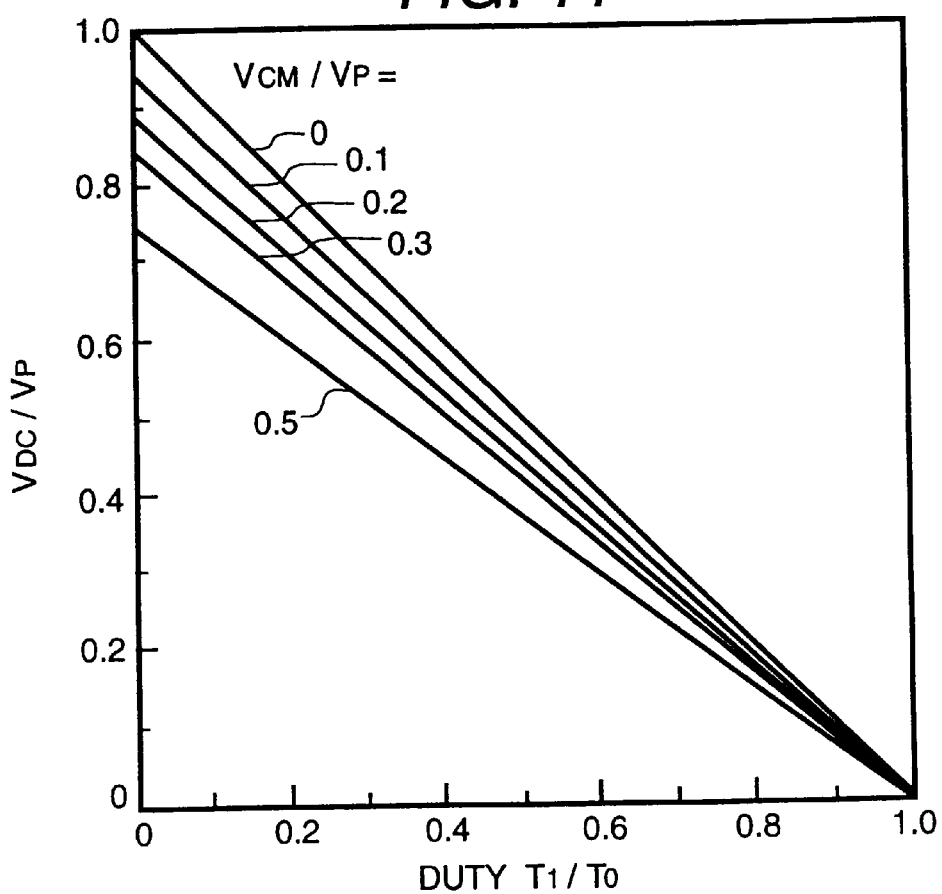
FIG. 11 is a graph showing the relationship between pulse duty ratio and $(V_{DC}/V_P)$.

FIG. 11 shows $(V_{DC}/V_P)$ which means an efficiency of plasma processing taking time average into consideration. It is preferable to make $(T_1/T_0)$ small and $(V_{DC}/V_P)$ large.

Assuming $(V_{DC}/V_P) \geq 0.5$ as an efficiency of plasma processing and taking a condition to be described later $(V_{DC}/V_P) \leq 0.5$, the pulse duty becomes $(T_1/T_0) \leq$ approximately 0.4.

The pulse duty $(T_1/T_0)$ is effective for ion energy control when it is small. However, when it is unnecessarily small, a pulse width $T_1$, becomes as small as 0.05µ and consequently the pulse bias contains frequency components in the range of several tens of MHz. As a result, it becomes difficult to separate from the plasma generating high frequency component which is to be described later. As shown in FIG. 11, since decrease of $(V_{DC}/V_P)$ in the range of $0 \leq (T_1/T_0) \leq 0.05$ is small, no problem occurs when $(T_1/T_0)$ is set to a value above 0.05.

Figure 12:
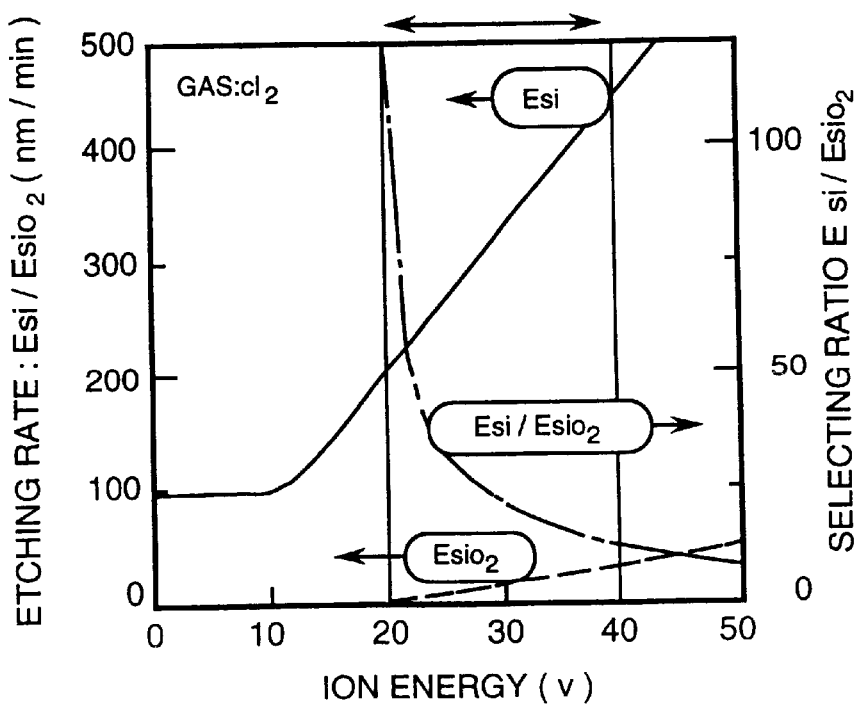
FIG. 12 is a graph showing energy dependence of the silicon etching rate ESi and oxide film etching rate $ESiO_2$ when chlorine gas of 5 mTorr is formed in a plasma.

As an example of gate etching, FIG. 12 shows an energy dependence of the silicon etching rate ESi and oxide 20 film etching rate ESiO$_2$ when chlorine gas of 10 mTorr is formed in a plasma. The silicon etching rate ESi becomes a constant value in a low ion energy region. In a region of ion energy above approximately 10 V, ESi increases as the ion energy increases. On the other hand, the etching rate ESiO$_2$ for the oxide film of the base material is zero when the ion energy is smaller than nearly 20 V, and when the ion energy exceeds nearly 20 V, the etching rate ESiO$_2$ increase as the ion energy is increased.

As a result, when the ion energy is below nearly 20 V, there is a region where the selectivity to the base material ESi/ESiO$_2$ becomes ∞ (infinity). When the ion energy is above nearly 20 V, the selectivity ESi/ESiO$_2$ to the base material rapidly decreases as the ion energy is increased.

Figure 13:
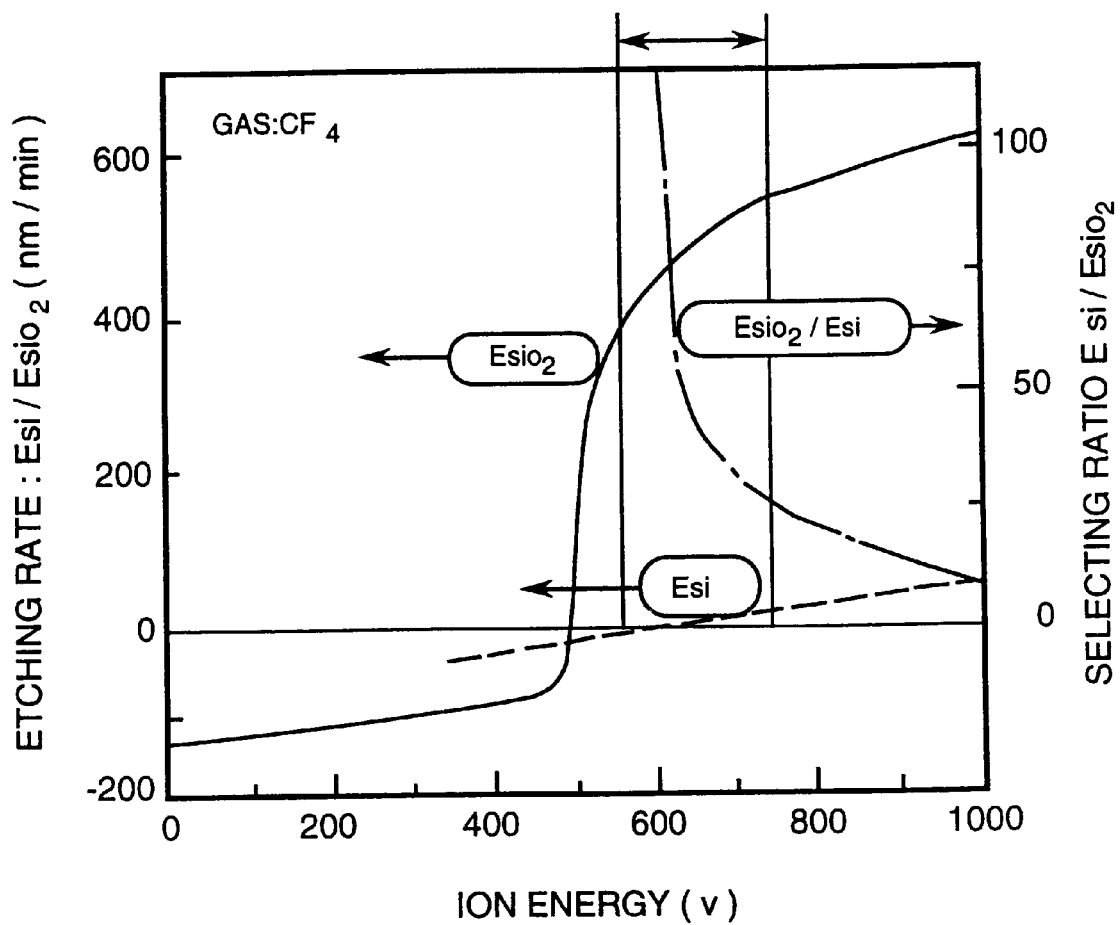
FIG. 13 is a graph showing ion energy distributions of the oxide film etching rate $ESiO_2$ and silicon etching rates ESi as an example of etching of a oxide film when CF4 gas of 5 mTorr is formed in a plasma.

As an example of etching of an oxide film (SiO, BPSG, HISO, TEOS or the like) as a kind of insulator films, FIG. 13 shows ion energy distributions of the oxide film etching rate ESiO$_2$ and silicon etching rates ESi when C$_4$F$_8$ gas of 1.0 Pa is formed in a plasma.

The oxide film etching rate ESiO$_2$ becomes negative and deposits are produced when the ion energy is low. The oxide film etching rate ESiO$_2$ steeply increases at the ion energy of nearly 400 V, and after that gradually increases. On the other hand, the etching rate ESi for silicon to be used as the base material is switched from negative (etching) to positive (etching) at an ion energy higher than the ion energy where ESiO$_2$ is switched from negative to positive, and then gradually increases.

As the result, the selectivity ESi/ESiO$_2$ to the base material becomes ∞ (infinity) at an ion energy where ESiO$_2$ is switched from negative to positive, and in the ion energy above the switching point the selectivity $ESi/ESiO_2$ steeply decreases as the ion energy increases.

When the results of FIG. 12 and FIG. 13 are applied to a practical process, ion energy is set to an appropriate value by adjusting the bias electric power source with taking the values of ESi, $ESiO_2$, $ESi/ESiO_2$, and the magnitude of the value $ESi/ESiO_2$.

A better characteristic can be obtained by switching the ion energy just before and just after etching, that is, etching until exposing a base film, with giving a priority to the etching rate just before the etching and giving a priority to the selectivity just after the etching.

The characteristic shown in FIG. 12 and FIG. 13 is a characteristic for a case where the ion energy distribution is limited in a narrow range. Since an etching rate for a case where the ion energy distribution spreads in a wide range is expressed by the time averaged value, it cannot be set at the optimum value and accordingly the selectivity is substantially degraded.

According to an experiment, when the value $(V_{DC}/V_P)$ was smaller than about 0.3, a deviation of ion energy was smaller than nearly ±15%, and a high selectivity higher than 30 was attained with the characteristic of FIG. 12 and FIG. 13. Further, as far as $(V_{DC}/V_P) \leq 0.5$, the selectivity was improved compared to a conventional sinusoidal wave bias method.

As described above, as the voltage suppressing means for suppressing the voltage change $(V_{CM})$ in one cycle of the bias voltage generated between the ends of the electrostatic attracting film, it is preferable that the voltage change $(V_{CM})$ is lower than one-half of the voltage $(V_P)$ of the pulse bias. In detail, there is a method to decreasing a thickness of the electrostatic chuck film 22 made of a dielectric material provided on the surface of the lower electrode 15, or by employing a material having a large specific dielectric coefficient. Further, there is a method to suppress the voltage change between the ends of the electrostatic attracting film by shortening the period of the pulse bias voltage to 0.1 $\mu$s to 10 $\mu$s, preferably, 0.2 $\mu$s to 5 $\mu$s (corresponding to repeating frequency of 0.2 MHz to 5 MHz) so that the pulse duty $(T_1/T_0)$ is set as $0.05 \leq (T_1/T_2) \leq 0.4$.

Furthermore, it is possible to make the voltage change $(V_{CM})$ in one cycle of the bias voltage generated between the ends of the electrostatic attracting film satisfy the above-described condition $(V_{DC}/V_P) \leq 0.5$.

An embodiment of using the vacuum processing chamber for etching of an insulator film (SiO, BPSG, TEOS, HISO or the like) will be described below.

A processing gas 36 used for the etching operation is composed of $C_4F_8$ of 1 to 5%, Ar of 90 to 95% and $O_2$ of 0 to 5%; or $C_4F_8$ of 1 to 5%, Ar of 70 to 90%, $O_2$ of 0 to 5% and CO of 10 to 20%. The plasma generating high frequency electric power source 16 used has a higher frequency, for example 40 MHz, compared to a conventional one to stabilize discharge under a low pressure range of 1 to 3 Pa.

When dissociation of the processing gas progresses to exceed the necessary amount by using the high frequency of the plasma generating high frequency power source 16, the output of the high frequency power source 16 is ON-OFF controlled or level modulation controlled using a high frequency electric power modulating signal source 161. When the level is high, ions are generated more than generation of radicals, and when the level is low, radicals are generated more than generation of ions. An ON time (or the high level time for the level modulation) used is 5 to 50 $\mu$s, and an OFF time (or the low level time for the level modulation) used is 10 to 200 $\mu$s, while a period used is 20 to 250 $\mu$s. By doing so, it is possible to avoid unnecessary dissociation and to attain a desired ion-radical ratio.

A modulating period of the plasma generating high frequency power source is generally longer than the period of the pulse bias. Therefore, the modulating period of the plasma generating high frequency power source is set to a value of an integer times the period of the pulse bias to optimize the phase between them. By doing so, the selectivity can be improved.

On the other hand, ion energy is controlled so that ions in the plasma are accelerated and vertically irradiated onto the sample by applying a pulse bias voltage. By using an electric power source having, for example, a pulse bias period T of 0.65 $\mu$s, a pulse width T1 of 0.15 $\mu$s and a pulse amplitude $V_P$ of 800 V as the pulse bias power source 17, it is possible to perform plasma processing having a better characteristic in which the width of ion energy distribution is ±15% and the selectivity to the base material is 20 to 50.

Another embodiment of a plasma etching apparatus of two-electrode type in accordance with the present invention will be described below, referring to FIG. 14. Although this embodiment has a similar construction as shown by FIG. 1, a different point of this embodiment from FIG. 1 is that the lower electrode 15 holding the sample has a single pole type electrostatic chuck 20. An electrostatic attracting dielectric layer 22 is provided on the upper surface of the lower electrode 15, and the positive side of the direct current source 23 is connected to the lower electrode 15 through a coil 24 for cutting the high frequency component. Further, the pulse bias electric power source 17 for supplying a positive pulse bias voltage of 20 V to 1000 V is also connected to the lower electrode through a blocking capacitor 19.

Discharge confining rings 37A, 37B are provided in the periphery of the processing chamber 10 to increase a plasma density and to minimize attaching of unnecessary deposits onto the outside portions of the discharge confining rings 37A, 37B. In the discharge confining rings 37A, 37B of FIG. 14, a diameter of the bank portion of the discharge confining ring 37A in the lower electrode side is formed smaller than a diameter of the bank portion of the discharge confining ring 37B in the upper electrode side so that distribution of reaction products around the sample is made uniform.

A material used for the discharge confining rings 37A, 37B, at least for the side facing the processing chamber side, is a semiconductor or a conductor such as carbon, silicon or SiC. Further, a bias electric power source 17A of 100 kHz to 13.56 MHz for the discharge confining ring is connected to the ring 37A in the lower electrode side through a capacitor 19A, and the ring 37B in the upper electrode side is constructed so that a part of the voltage of the high frequency electric power source 16 is applied to the ring 37B in the upper electrode side. Thereby, attaching of deposits onto the rings 37A, 37B due to the sputtering effect of ions is decreased and the fluorine removing effect is provided.

Figure 14:
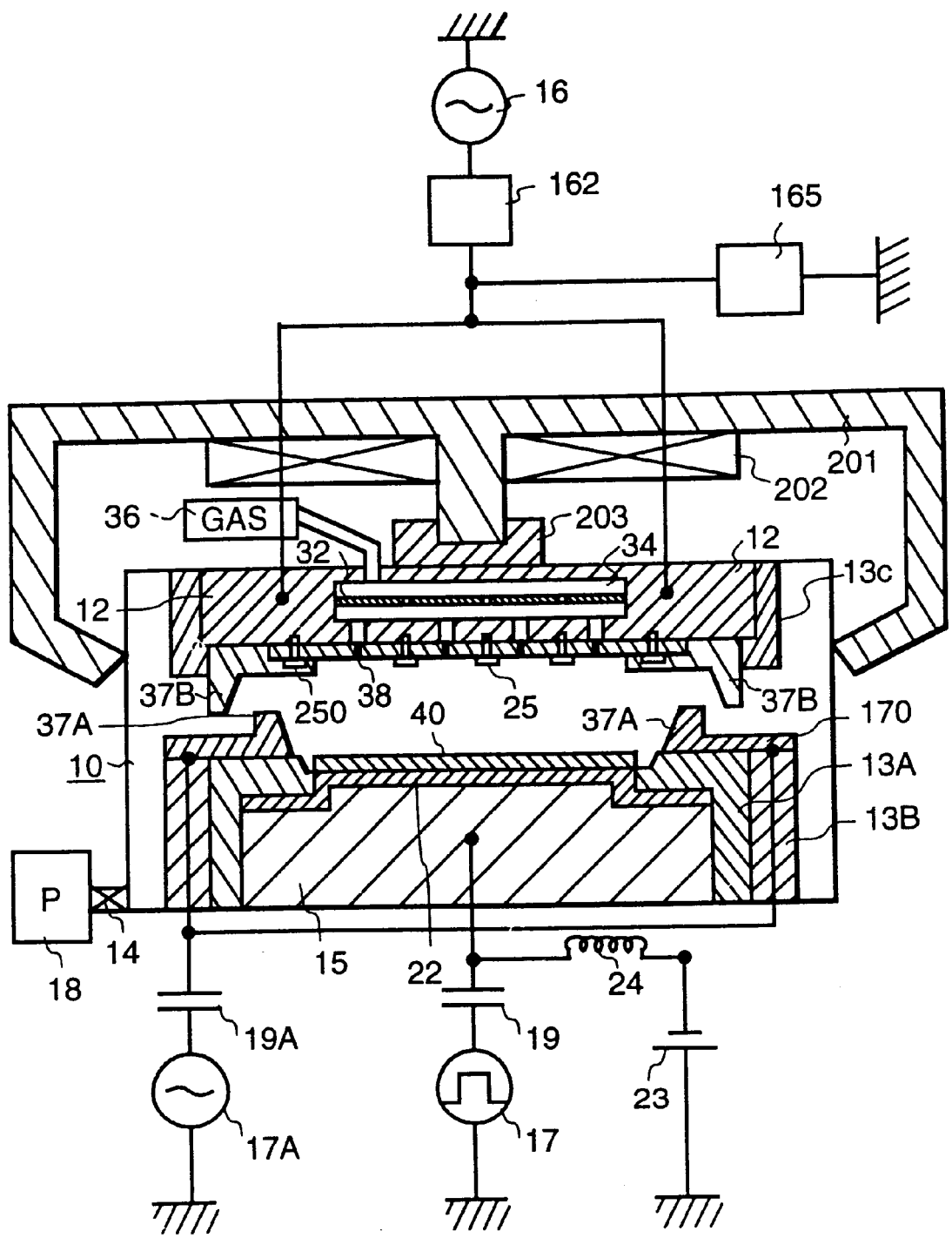
FIG. 14 is a vertical cross-sectional view showing another embodiment of a plasma etching apparatus of a two-electrode type in accordance with the present invention.

The reference characters 13A, 13C of FIG. 14 are insulator members made of aluminum oxide or the like, and the reference character 13B is an insulator member having a conductor such as SiC, glassy carbon, Si or the like.

When the conductivity of the rings 37A, 37B is low, conductors made of a metal are embedded inside the rings 37A, 37B and distance between the surface of the ring and the embedded conductor is made small. Thereby, the high frequency electric power easily radiates from the surfaces of the rings 37A, 37B to decrease reduction of the sputter effect.

The upper electrode cover 30 is fixed to the upper electrode 12 generally only in the peripheral portion of the cover with bolts 250. A gas is supplied to the upper electrode cover 30 from the gas supply unit 36 through the gas introducing chamber 34, the gas diffusion plate 32 and the upper electrode 12. The holes provided in the upper electrode cover 30 have a very small diameter of 0.3 to 1 mm to reduce the likelihood of the occurrence of abnormal discharge in the hole. The gas pressure in the upper portion of the upper electrode cover 30 is a fraction of one atmospheric pressure to one-tenth of one atmospheric pressure. For example, a force of nearly 100 kg acts on the upper electrode cover 30 having a diameter of larger than 300 mm as a whole. Therefore, the upper electrode cover 30 is deformed in a convex shape to the upper electrode 12 and accordingly a gap is produced having several hundreds micro-meters near the central portion.

In that case, when the frequency of the high frequency electric power source 16 is increased up to approximately more than 30 MHz, resistance in the lateral direction of the upper electrode cover 30 cannot be neglected and particularly the plasma density near the central portion is decreased. In order to solve this problem, the upper electrode cover 30 is fixed to the upper electrode 12 in portions near the center side of the upper electrode cover, not the peripheral portion. In the embodiment of FIG. 14, the upper electrode cover is fixed to the upper electrode 12 in several portions near the central side of the upper electrode cover 30 using bolts 251 made of a semiconductor such as SiC or carbon or an insulator such as aluminum oxide to make distribution of the high frequency field applied from the upper electrode 12 side uniform.

The method of fixing the upper electrode cover 30 to the upper electrode 12 at least near the center of the cover is not limited to using the bolts 251 described above. For example, the upper electrode cover 30 may be fixed to the upper electrode 12 using a substance having adhesiveness all over the surface or at least near the center of the upper electrode cover.

In FIG. 14, the sample 40 to be processed is mounted on the lower electrode 15 and attracted by the electrostatic chuck 20, that is, by a Coulomb force produced between both ends of the electrostatic attracting film 22 by positive charge by the direct current electric power source 23 and negative charge supplied from the plasma.

The operation of this apparatus is the same as that of the two-electrode type plasma etching apparatus shown in FIG. 1. When etching is performed, the sample 40 of an object to be processed is mounted on the lower electrode 15 and attracted by an electrostatic force. While a processing gas is being supplied to the processing chamber 10 from the gas supplying unit 36, on the other hand, the processing chamber is evacuated and depressurized by the vacuum pump 18 so that pressure of the processing chamber becomes a processing pressure of the sample, that is, a pressure of 0.5 Pa to 4.0 Pa. Then, the high frequency electric power source 16 is switched on to apply a high frequency electric power of 20 MHz to 500 MHz, preferably 30 MHz to 100 MHz, between the electrodes 12 and 15 to form the processing gas into a plasma. on the other hand, a positive pulse bias voltage of 20 V to 1000 V having a period of 0.1 $\mu$s to 10 $\mu$s, preferably 0.2 $\mu$s to 5 $\mu$s, and a duty in a positive pulse portion of 0.05 to 0.4 is applied to the lower electrode 15 from the pulse bias electric power source 17 to etch the sample while the electrons and the ions in the plasma are being controlled.

By applying the pulse bias voltage in such a manner, ions and/or electrons in the plasma are accelerated and vertically irradiated onto the sample to perform highly precise shape control or highly precise selectivity control. The characteristics required for the pulse bias power source 17 and the electrostatic attracting film 22 are the same as in the embodiment of FIG. 1, and accordingly detailed description will be omitted here.

Figure 16:
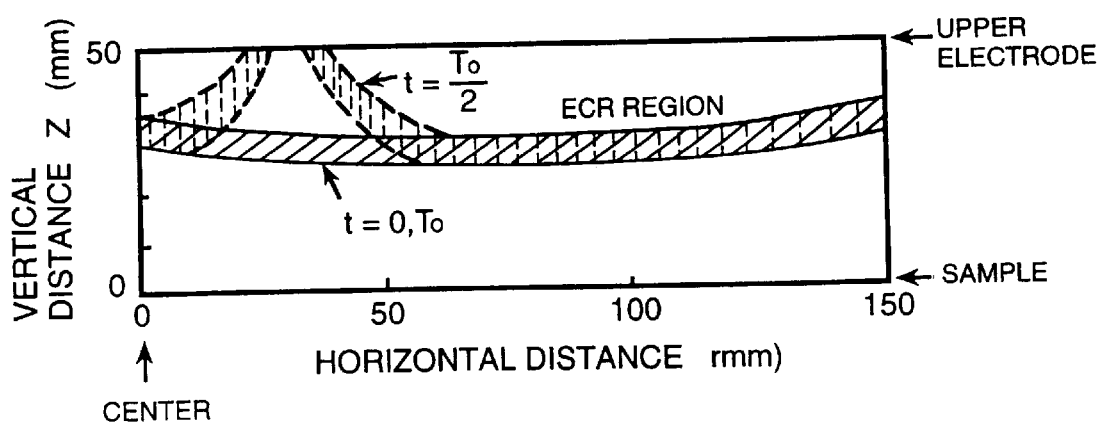
FIG. 16 is a graph explaining an ECR region of the plasma etching apparatus of FIG. 15.
Figure 17:
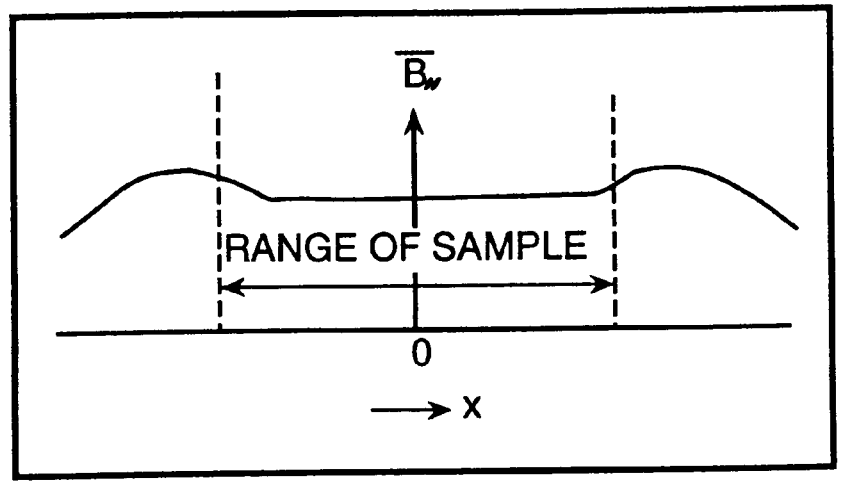
FIG. 17 is a graph showing a magnetic field distribution characteristic of the plasma etching apparatus of FIG. 15.

A further embodiment according to the present invention will be described below, referring to FIG. 15 to FIG. 17. Although this embodiment is similar to the plasma etching apparatus of the two-electrode type construction shown in FIG. 1, a different point of this embodiment from FIG. 1 is in construction of the magnetic field forming means 200. The core 201 of the magnetic field forming means 200 is eccentrically arranged and driven by a motor 204 so as to be rotated at a speed of several rotations per minute to several tens of rotations per minute around an axis corresponding to the center of the sample 40. The core 201 is grounded.

In order to perform plasma-processing all over the surface of the sample highly accurately, cyclotron resonance effect of electrons is larger in the peripheral portion or the portion outside of the peripheral portion than in the center so that generation of plasma becomes large in the peripheral portion or the portion outside of the peripheral portion of the sample than in the center of the sample. However, in the embodiment of FIG. 1, there is no ECR region in the central portion of the sample and the plasma density near the center of the sample sometimes becomes too low, as shown in FIG. 6.

Figure 15:
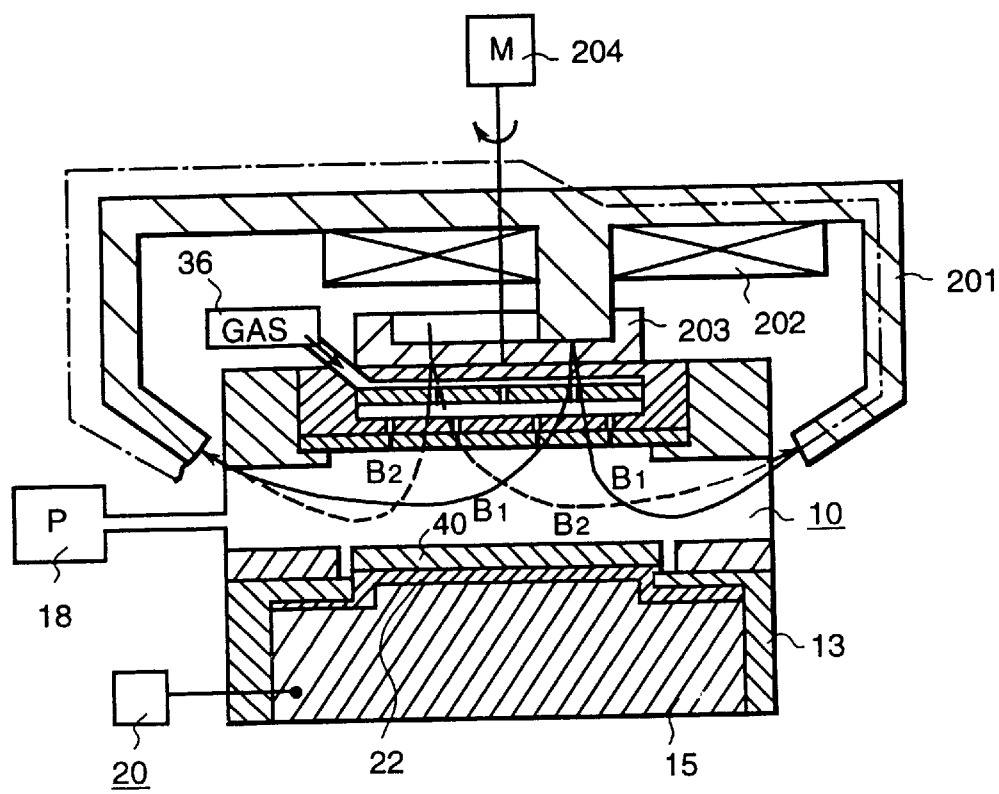
FIG. 15 is a vertical cross-sectional view showing a further embodiment of a plasma etching apparatus of a two-electrode type in accordance with the present invention.

In the embodiment of FIG. 15, the magnetic field distribution is varied by rotation of the eccentric core 201 of the magnetic field forming means 200, and accordingly in the central portion of the sample the ECR region is formed in a low position from the sample surface at time t=0 and t=$T_0$, and formed in a high position from the sample surface at time t=($\frac{1}{2}$)$T_0$. Since the core 201 is rotated at a speed of several rotations per minute to several tens of rotations per minute, the averaged value of the magnetic field intensity in the middle portion between the electrodes in the direction parallel to the sample surface becomes nearly the same value by the time averaging due to the rotation, as shown in FIG. 17. That is, the ECR region is formed in nearly the same level from the sample surface except for the peripheral portion of the sample.

As shown by dash-and-dot lines in the core 201 portion of FIG. 15, the thickness of the core composing the magnetic circuit in the side near the eccentric central core is formed thin and the thickness of the core composing the magnetic circuit in the side far from the eccentric central core is formed thick. By doing so, uniformity of the magnetic field intensity is further improved.

Figure 18:
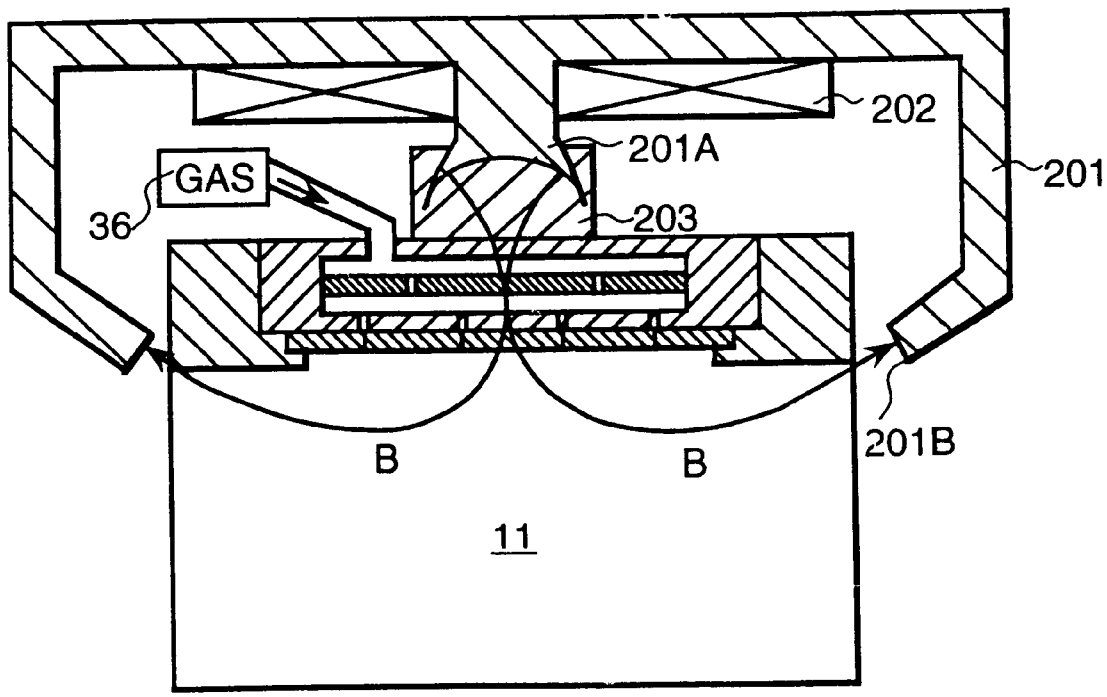
FIG. 18 is a vertical cross-sectional view showing a further embodiment of a plasma etching apparatus in accordance with the present invention.
Figure 19:
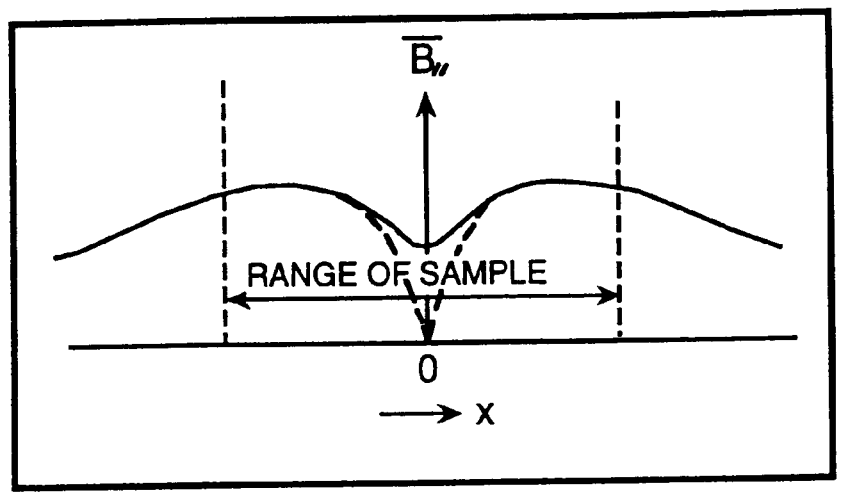
FIG. 19 is a graph showing a magnetic field distribution characteristic of the plasma etching apparatus of FIG. 18.

A still further embodiment in accordance with the present invention will be described below, referring to FIG. 18 and FIG. 19. Although this embodiment is similar to the plasma etching apparatus of the two-electrode type construction shown in FIG. 15, a different point of this embodiment from FIG. 15 is in construction of the magnetic field forming means 200. The core 201 of the magnetic field forming means 200 has a concave surface edge 201A in a portion corresponding to the center of the processing chamber and also has another edge 201B in the side position of the processing chamber. By operation of the concave surface edge 201A, the magnetic flux B has a component in the inclined direction. As a result, distribution of the magnetic field is varied and the component of the magnetic field intensity in the direction parallel to the sample surface is formed to be more uniform compared to on the case of FIG. 1, as shown in FIG. 19.

Figure 20:
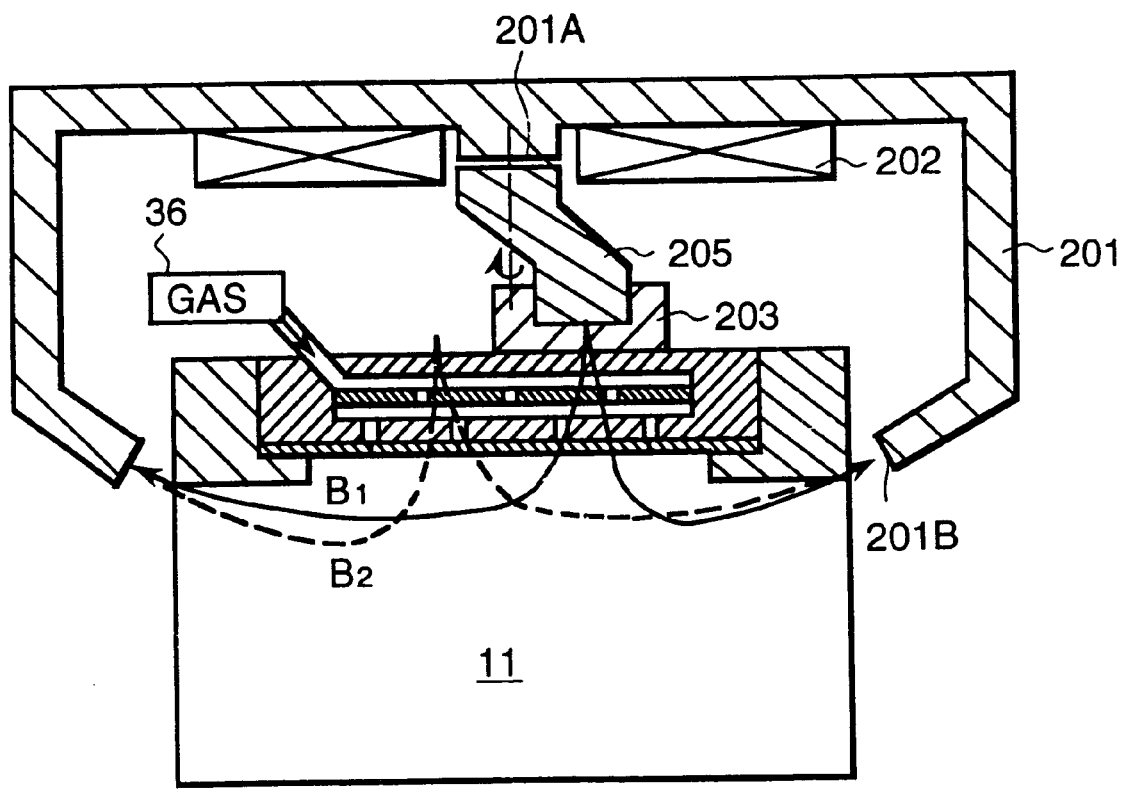
FIG. 20 is a vertical cross-sectional view showing a further embodiment of a plasma etching apparatus of a two-electrode type in accordance with the present invention.

A further embodiment in accordance with the present invention will be described below, referring to FIG. 20. Although this embodiment is similar to the plasma etching apparatus of the two-electrode type construction shown in FIG. 15, a different point of this embodiment from FIG. 15 is in construction of the magnetic field forming means 200. The core 201 of the magnetic field forming means 200 is of a fixed type, and forms a magnetic circuit together with a core 205 arranged in a position corresponding to the central portion of the processing chamber. The core 205 is rotated around an axis passing through the center of the edge 201A together with an insulator member 203. By such a construction, the same as the embodiment of FIG. 15, the averaged position of the ECR region near the central portion of the sample is formed in nearly the same level from the sample surface all over the surface of the sample.

Figure 21:
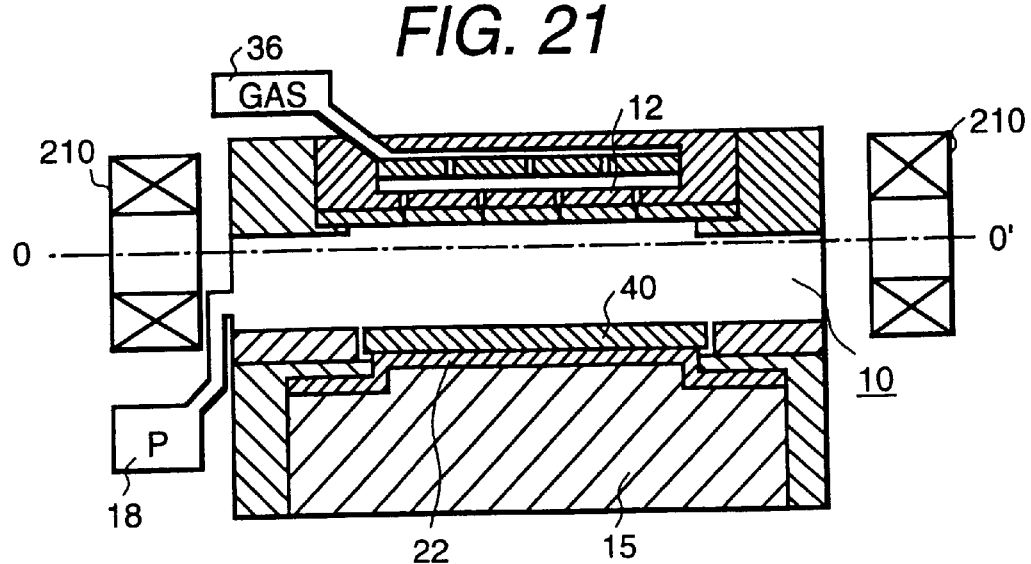
FIG. 21 is a vertical cross-sectional view showing a further embodiment of a plasma etching apparatus of a two-electrode type in accordance with the present invention.

A still further embodiment of a two-electrode type plasma etching apparatus in accordance with the present invention will be described below, referring to FIG. 21 and FIG. 22. In this embodiment, the magnetic field forming means 200 has two pairs of coils 210, 220 in the circumferential portion of the processing chamber, and a rotating magnetic field is formed by successively switching the direction of the magnetic field in each of the pairs of coils as shown by the arrows (1), (2), (3), (4). The position of the center 0–0' of the coils 210, 220 is set at a level in the upper electrode 12 side from the middle level between the electrodes 12 and 15. Thereby, the apparatus is constructed so that the magnetic field intensity on the sample 40 becomes smaller than 30 gauss, preferably, smaller than 15 gauss.

The distribution of the magnetic field intensity for each portion on the sample surface can be adjusted by appropriately choosing the position and the diameter of the coils 210, 220 so as to increase plasma generation in the periphery or the outer side of the periphery of the sample.

Figure 23:
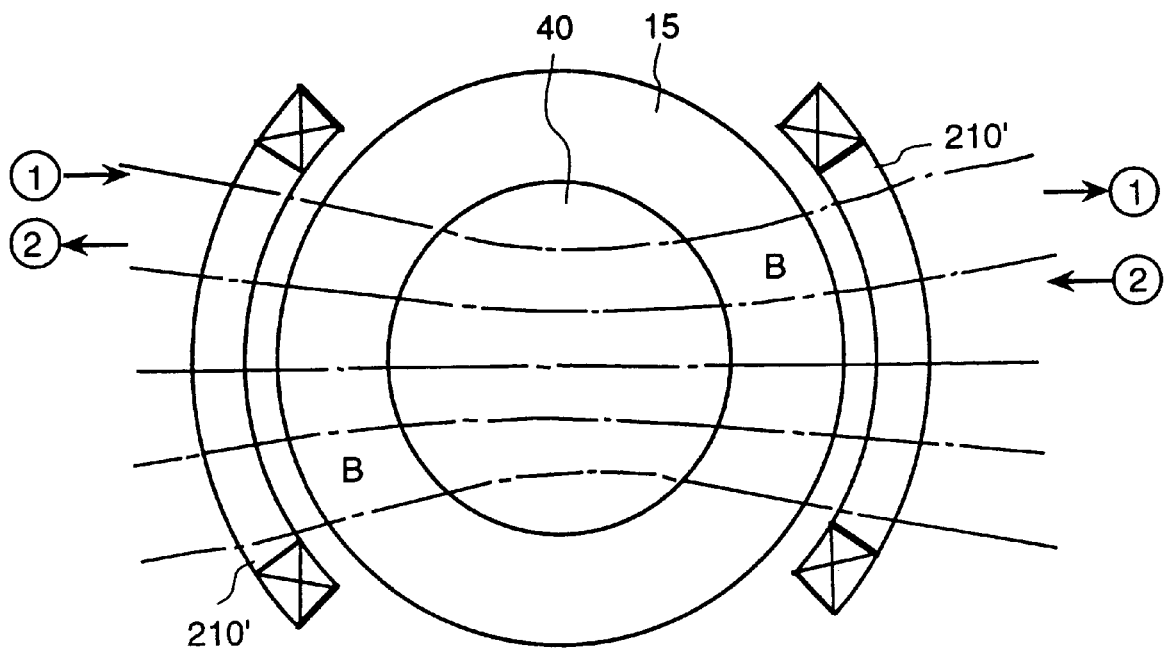
FIG. 23 is a cross-sectional side view showing the main portion of a further embodiment of a plasma etching apparatus of a two-electrode type in accordance with the present invention.

A further embodiment of a two-electrode type plasma etching apparatus in accordance with the present invention will be described below, referring to FIG. 23 and FIG. 24. In this embodiment, the magnetic field forming means 200 has a pair of coils 210' arranged in an arc-shape in a horizontal plane along the circumference of the circular processing chamber. The polarity of the magnetic field is varied with a constant period as shown by the arrows (1), (2) in FIG. 23 by controlling current flowing in the pair of coils 210'.

Figure 24:
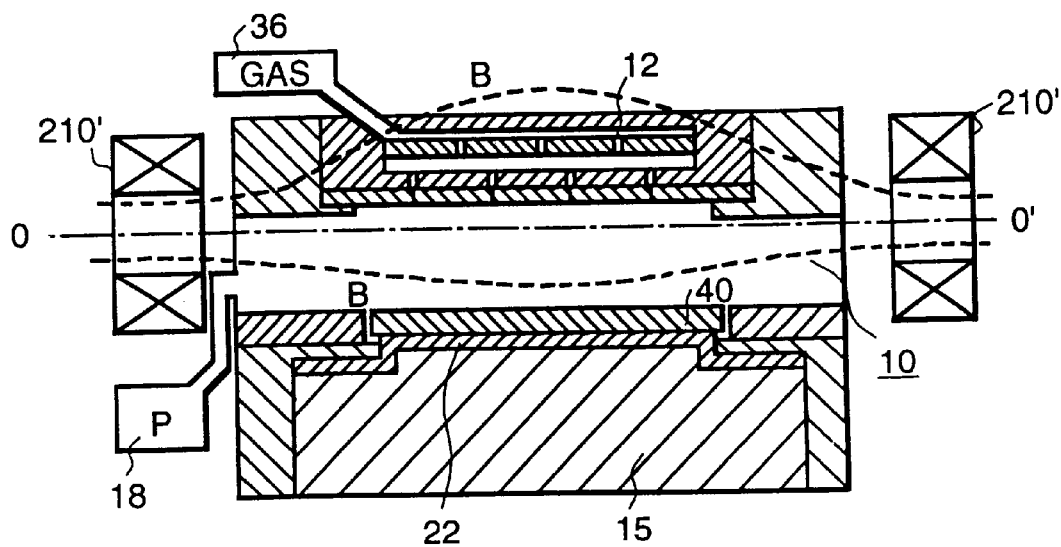
FIG. 24 is a vertical cross-sectional view showing the plasma etching apparatus of FIG. 23.

Since the magnetic flux expands with respect to a vertical plane in the central portion of the processing chamber as shown by the dashed lines in FIG. 24, the intensity of the magnetic field in the central portion of the processing chamber is reduced. However, the pair of coils 210' are curved along the processing chamber, and the magnetic flux B is concentrated in the central portion of the processing chamber. Therefore, the intensity of the magnetic field in the central portion of the processing chamber can be increased compared to the embodiment of FIG. 22. In other words, in the embodiment of FIG. 23, it is possible to suppress a decrease in the magnetic field in the central portion of the processing chamber compared to in the embodiment of FIG. 22, and, accordingly, the uniformity of the magnetic field on the sample mounting surface of the sample table can be improved.

Further, by varying the polarity of the magnetic field with a certain period, drift effect of E×B can be reduced.

Figure 22:
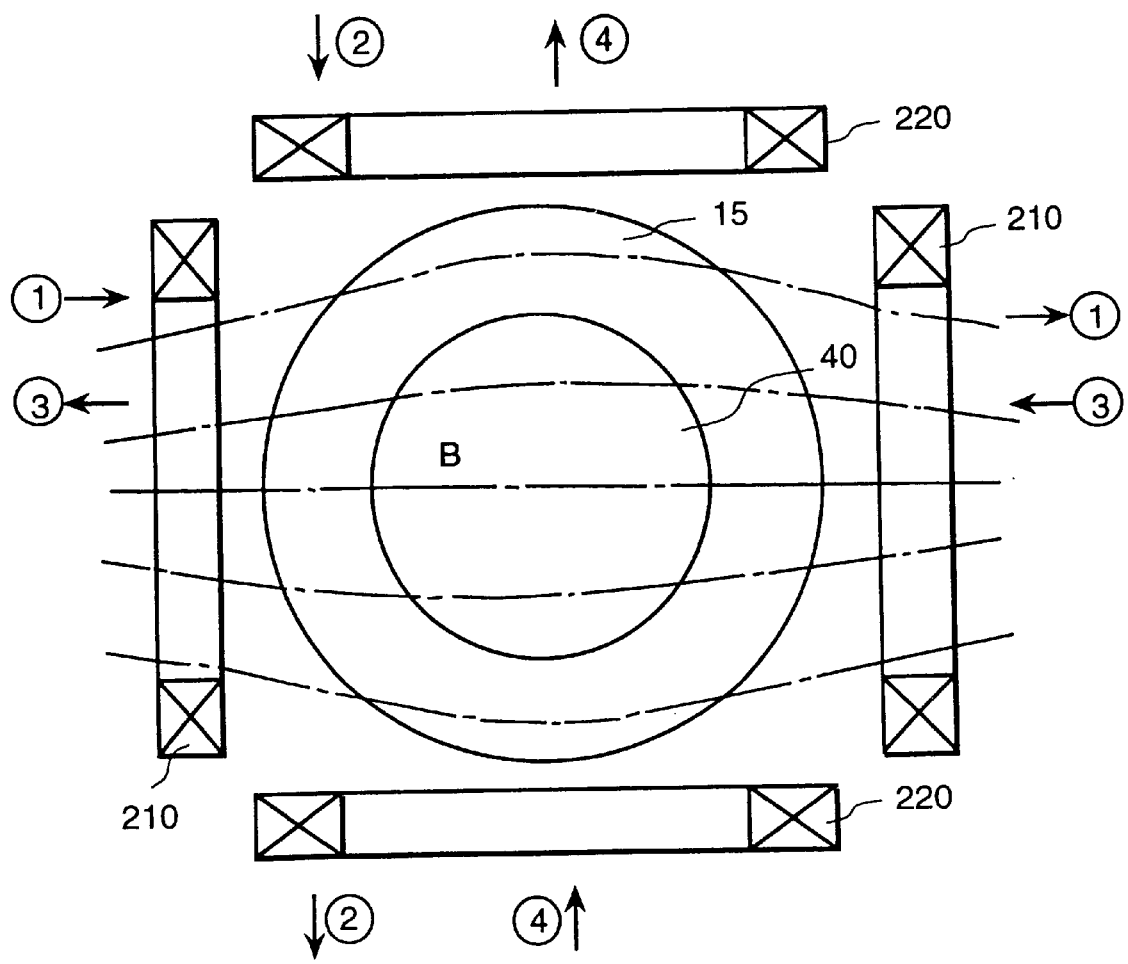
FIG. 22 is a graph showing a magnetic field distribution characteristic of the plasma etching apparatus of FIG. 21.

In this type, two pair of coils as in the embodiment of FIG. 22 may be employed as the magnetic field forming means 200.

Figure 25:
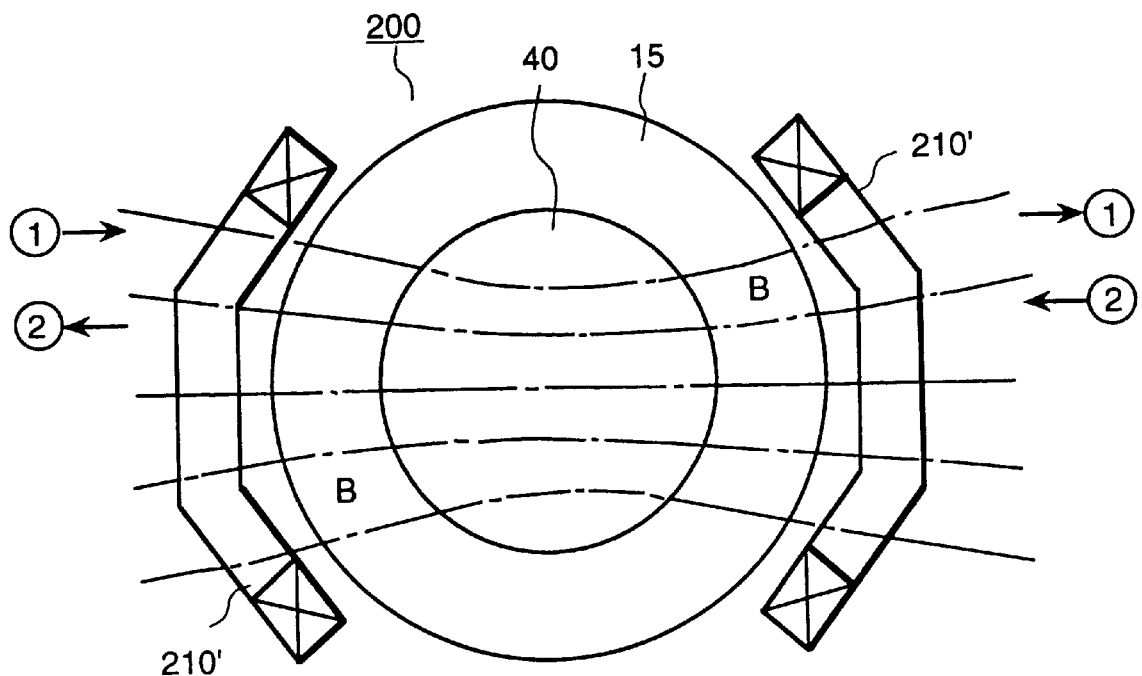
FIG. 25 is a view showing another embodiment of a magnetic field forming means.

Further, instead of the arc-shaped coil 210' the magnetic field forming means 200 may employ a convex coil 210' shown in FIG. 25 which is formed by combining a plurality of straight shaped coil sections arranged along the circumference of the circular processing chamber 10. In this case, the magnetic flux B concentrates in the central portion of the processing chamber and, accordingly, the same effect as in the embodiment of FIG. 23 can be obtained.

Figure 26:
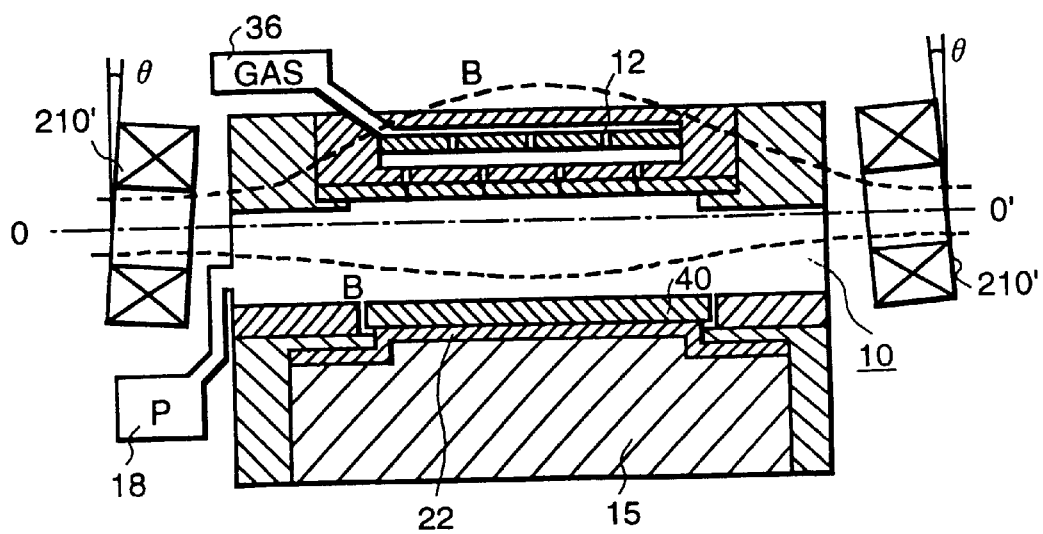
FIG. 26 is a vertical cross-sectional view showing another embodiment of a plasma etching apparatus of a two-electrode type in accordance with the present invention.

Furthermore, as shown in FIG. 26, the center axis of a pair of coils may be inclined with respect to a vertical plane so as to approach the sample surface in the central portion of the processing chamber. According to this embodiment, since the magnetic field intensity in the central portion of the processing chamber can be increased and the magnetic field intensity in the peripheral portion of the processing chamber can be decreased, the uniformity of the magnetic field on the sample mounting surface of the sample table can be improved. In order to make the magnetic field intensity uniform, it is preferable that the inclining angle θ of the center axis of the coil is set from 5 degrees to 25 degrees.

Figure 27:
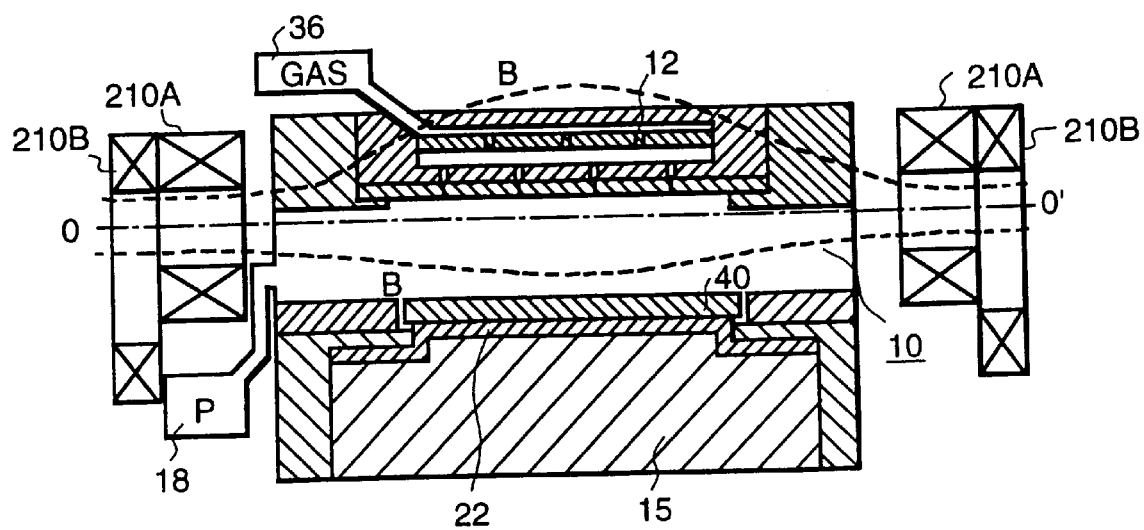
FIG. 27 is a vertical cross-sectional view showing another embodiment of a plasma etching apparatus of a two-electrode type in accordance with the present invention.

Further, as shown in FIG. 27, a pair of coils 210B are arranged near a pair of coils 210A. By controlling currents flowing in the two pair of coils, the position of the ECR resonance as well as the gradient of the magnetic field near the position of the ECR resonance are varied to change the width of the ECR resonance region. By optimizing the width of the ECR resonance region for each process, it is possible to obtain an ion/radical ratio suitable for each process.

It is possible to further improve the uniformity of magnetic field intensity distribution and the controllability by properly combining the embodiments of FIG. 23 to FIG. 27 described above, if necessary.

Figure 28:
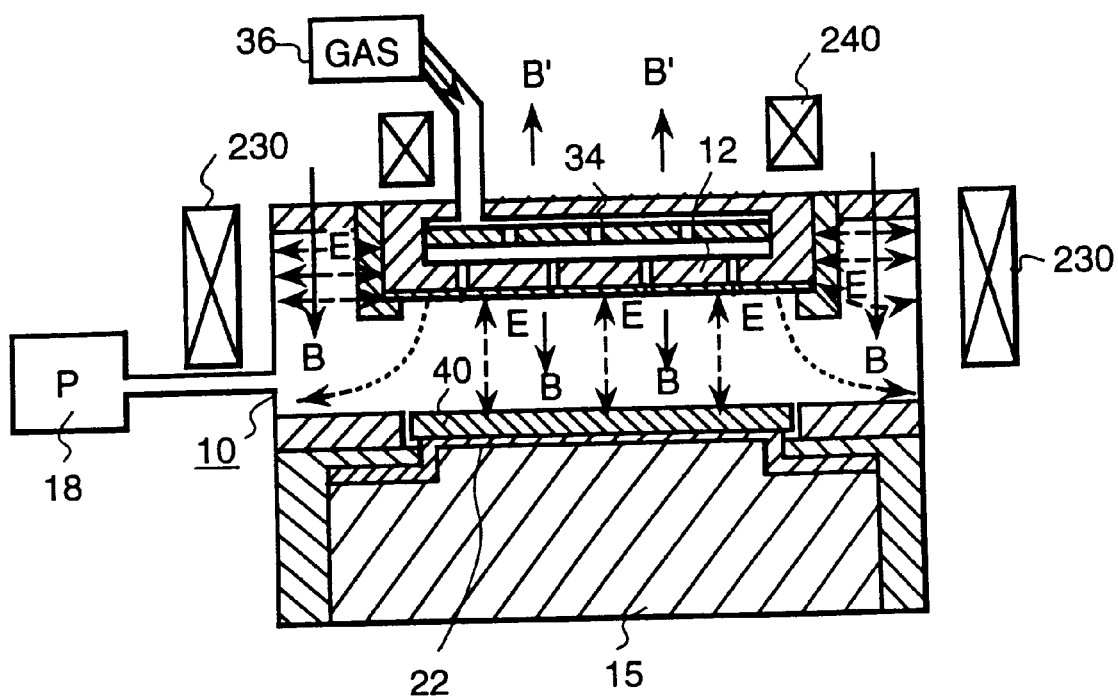
FIG. 28 is a vertical cross-sectional view showing another embodiment of a plasma etching apparatus of a two-electrode type in accordance with the present invention.
Figure 29:
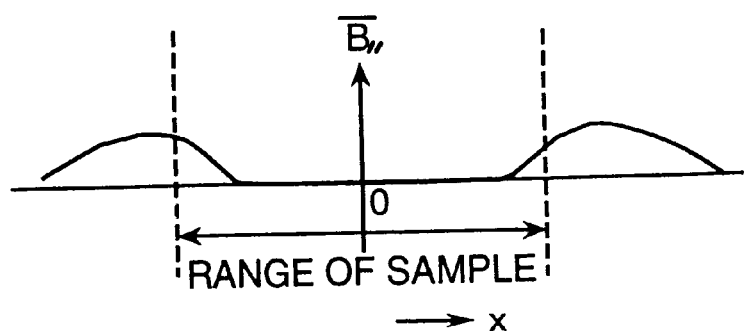
FIG. 29 is a graph showing a magnetic field distribution characteristic of the plasma etching apparatus of FIG. 28.

A still further embodiment of a two-electrode type plasma etching apparatus in accordance with the present invention will be described below, referring to FIG. 28 and FIG. 29. In this embodiment, a part of the processing chamber is made of a conductor and grounded. On the other hand, the magnetic field forming means 200 has coils 230, 240 in the peripheral portion and the upper portion of the processing chamber 10. The direction of the magnetic flux B formed by the coil 230 and the direction of the magnetic flux B' formed by the coil 240 cancel each other in the central portion of the processing chamber 10, and superpose each other in the peripheral portion and the outer portion of the peripheral portion of the processing chamber 10, as shown by the arrows. As a result, the distribution of the magnetic field intensity at each position of the sample surface becomes as shown in FIG. 29. In addition to this, in the portion of the mounting surface for the sample 40, the direction of the electric field and the direction of the magnetic field between the upper electrode 12 and the lower electrode 15 are the same. On the other hand, in the portion outside the mounting surface for the sample 40, the component of the magnetic field in the vertical direction intersecting with the component of electric field in the lateral direction at a right angle is formed in the peripheral portion of the upper electrode 12 and the portion between the upper electrode 12 and the wall of the processing chamber.

Figure 38:
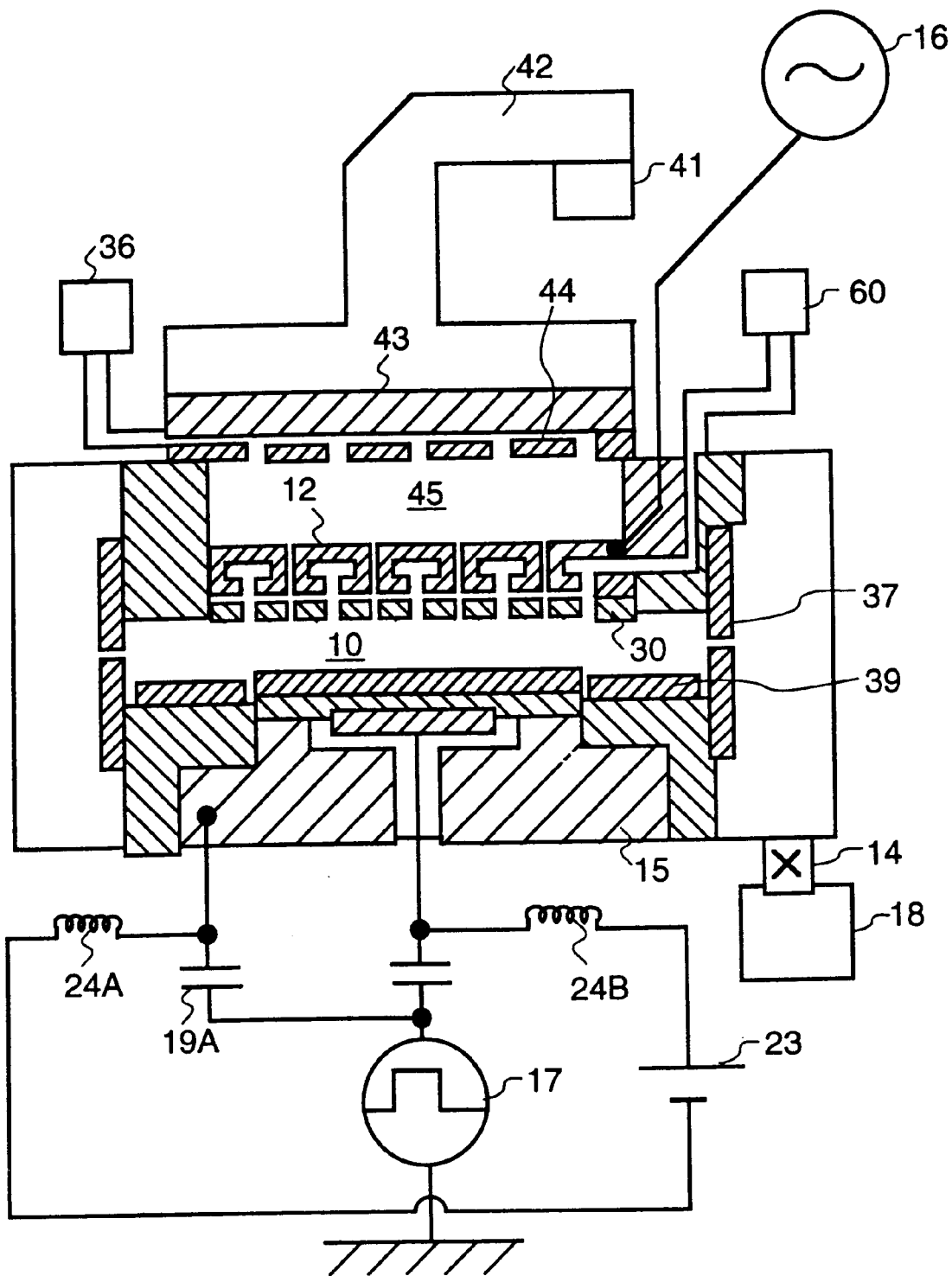
FIG. 38 is a vertical cross-sectional front view showing a further embodiment of a plasma processing apparatus in accordance with the present invention.

Therefore, according to the embodiment of FIG. 38, the cyclotron resonance effect of electrons in the central portion of the sample can be decreased and generation of plasma in the peripheral portion and the outside portion of the peripheral portion of the sample can be increased.

Figure 30:
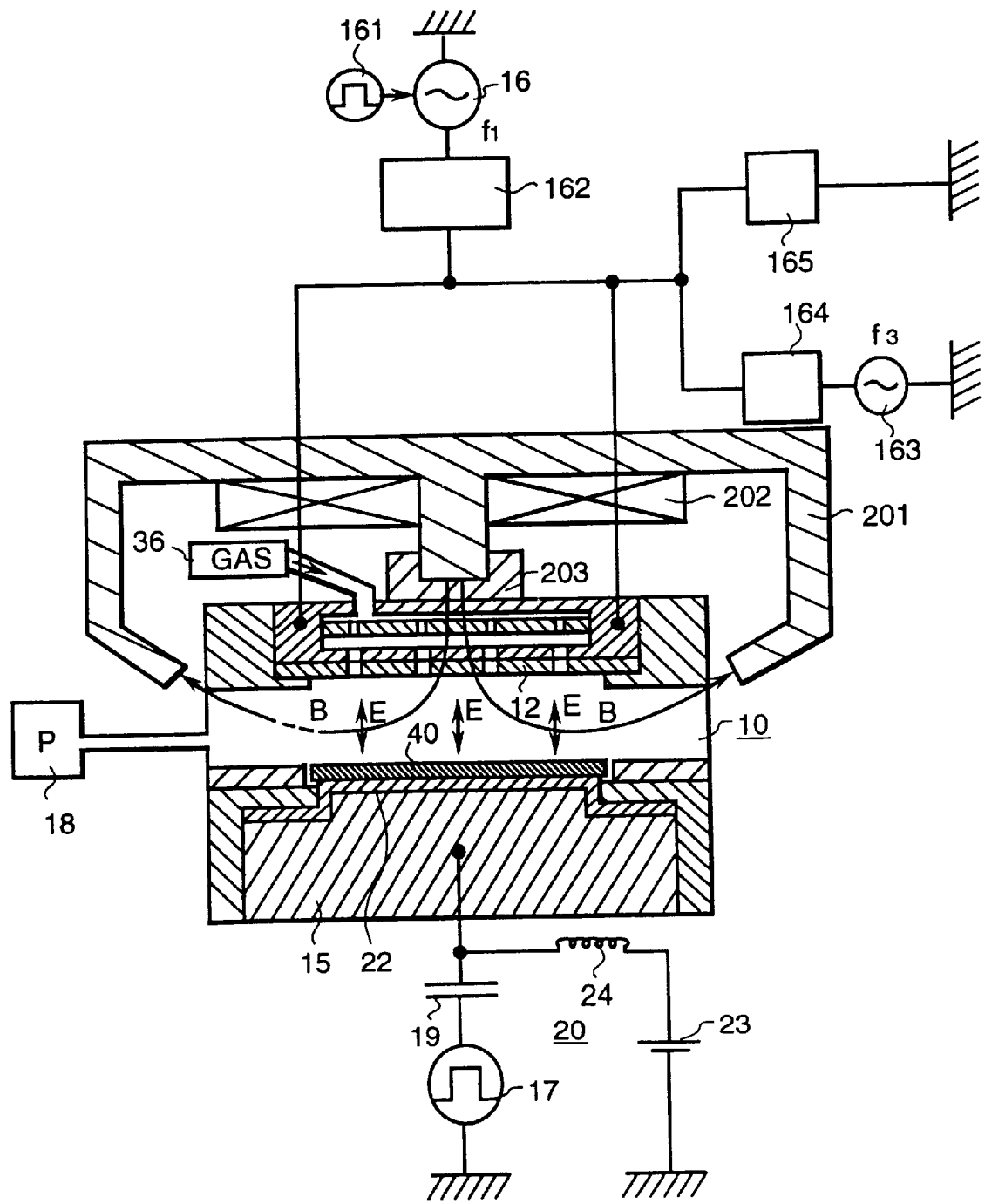
FIG. 30 is a vertical cross-sectional view showing a further embodiment of a plasma etching apparatus of a two-electrode type in accordance with the present invention.

A further embodiment in accordance with the present invention will be described below, referring to FIG. 30. In the two-electrode type plasma etching apparatus shown in FIG. 1, there are some cases where sufficient ion energy cannot be obtained with the high frequency electric power $f_1$ applied from the high frequency electric power source 16 to the upper electrode 12. In such a case, this embodiment increases the ion energy to 100 V to 200 V by applying a high frequency voltage $f_3$ having a frequency, for example, below 1 MHz from a low frequency electric power source 163 to the upper electrode 12 as a bias. Here, the reference characters 164, 165 indicate filters.

An embodiment of a two-electrode type plasma etching apparatus of non-magnetic field type in accordance with the present invention will be described below, referring to FIG. 31.

As described above, in order to improve micro workability of a sample, it is preferable that a plasma generating high frequency electric power source 16 has a higher frequency and discharge under a low gas pressure is stabilized. In the embodiment of the present invention, the pressure processing a sample in the processing chamber is set to 0.5 to 4.0 Pa. By setting the gas pressure in the processing chamber 10 to a low pressure below 40 mTorr, probability of ion collision in the sheath is decreased. Therefore, in processing a sample 40, directivity of ions is increased and accordingly it becomes possible to perform vertical fine pattern. However, in order to attain the same processing rate under a pressure below 5 mTorr, the exhausting system and the high frequency electric power source become large in size, and dissociation of the processing gas occurs excessively due to increase of electron temperature, as a result, the processing characteristic is likely to be degraded.

In general, between a frequency of a plasma generating electric power source for a pair of electrodes and a minimum gas pressure capable of stably discharging, there is relationship that the lowest gas pressure for stable discharge is decreased as the frequency of the electric power source is increased and the distance between the electrodes is increased. In order to avoid ill effects such as attaching of deposits onto surrounding walls and onto the discharge confining ring 37 and to effectively perform a function of removing fluorine or oxygen by the upper electrode cover 30, the susceptive cover 39 and the resist in the sample, it is preferable that the distance between the electrodes is set to a value shorter than 50 mm which corresponds to a distance smaller than 25 times of mean-free-path at the maximum gas pressure of 40 mTorr. On the other hand, in order to attain stable discharge, the distance between the electrode is required to be 2 to 4 times (4 mm to 8 mm) or larger of the mean-free-path at the maximum gas pressure (40 mTorr).

Figure 31:
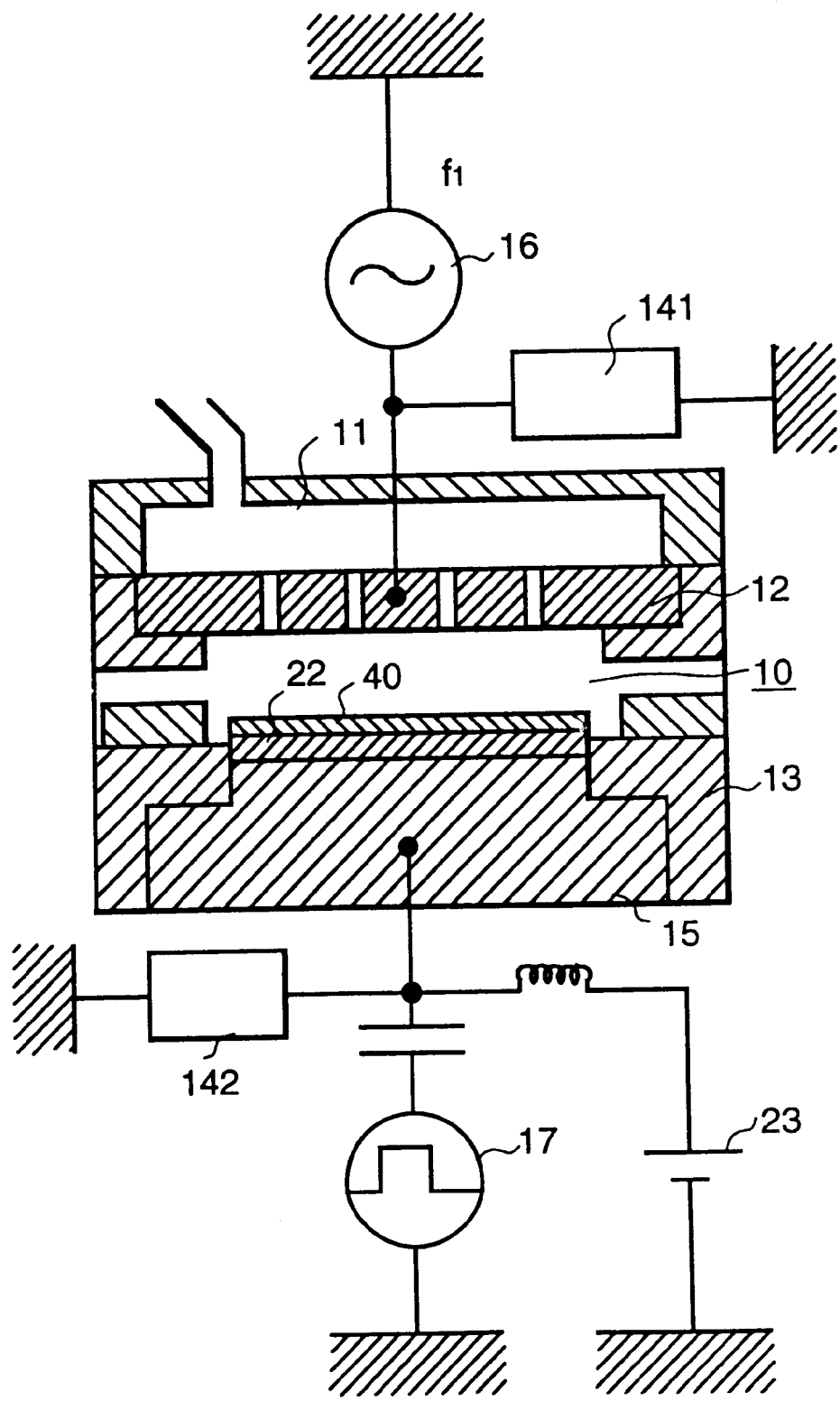
FIG. 31 is a vertical cross-sectional view showing an embodiment of a plasma etching apparatus of a two-electrode type which is a modification of one shown in FIG. 1.
Figure 32:
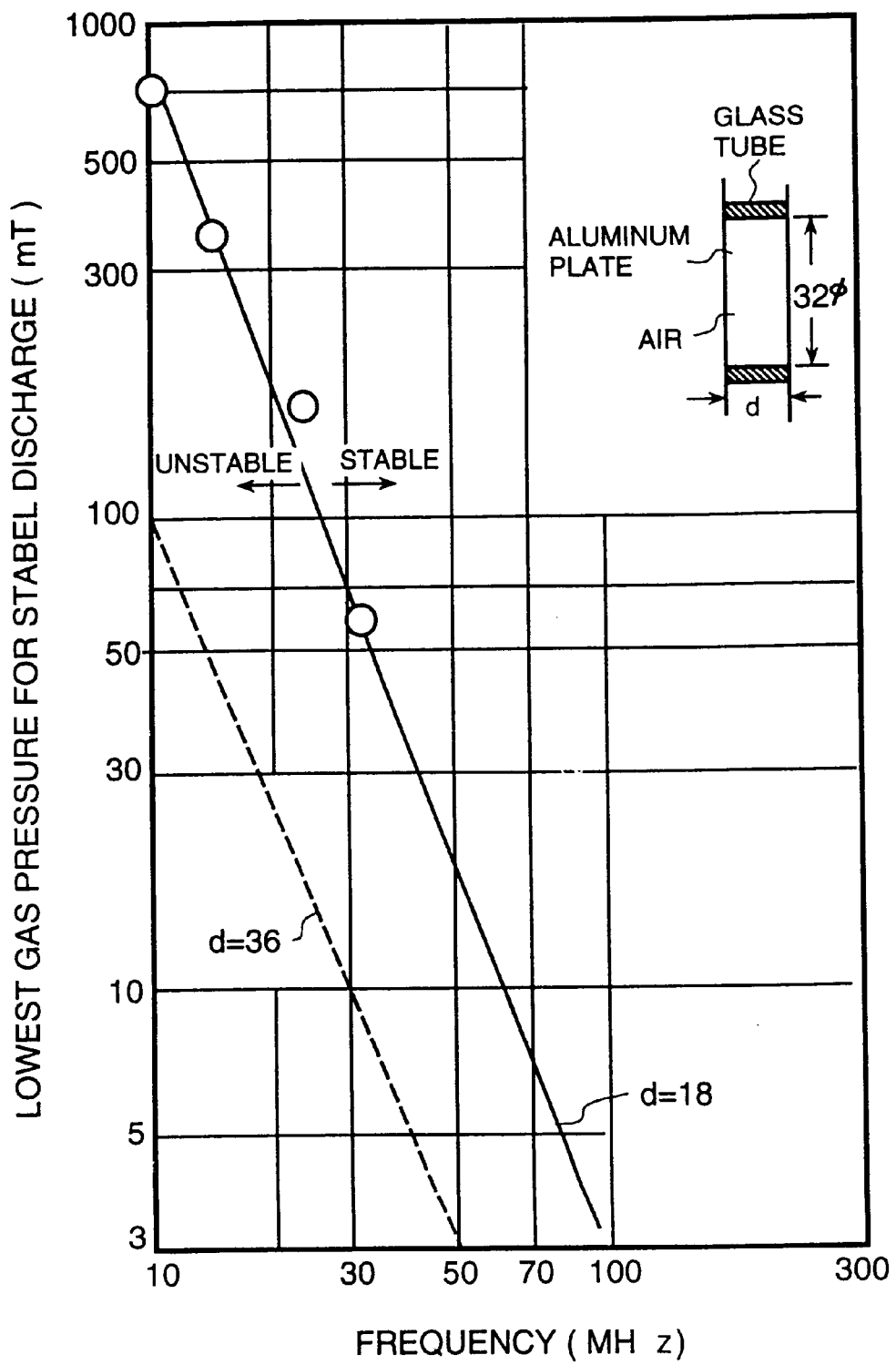
FIG. 32 is a graph showing the relationship between frequency of a plasma generating electric power source and a lowest gas pressure condition for stable discharge.

In the embodiment shown in FIG. 31, since a high frequency electric power of 20 MHz to 500 MHz, preferably 30 MHz to 200 MHz, is used as the plasma generating high frequency electric power source 16, it is possible to obtain a stable plasma and to improve micro workability even if the gas pressure in the processing chamber is set to a low pressure of 0.5 to 4.0 Pa. Further, by using such a high frequency electric power, dissociation of gas plasma is improved and controllability of selectivity during processing of a sample is improved.

In the embodiments of the present invention described above, the occurrence of interference between the output of the pulse bias electric power source and the output of the plasma generating electric power source can be considered. Therefore, the countermeasure for this problem will be described below.

Figure 33:
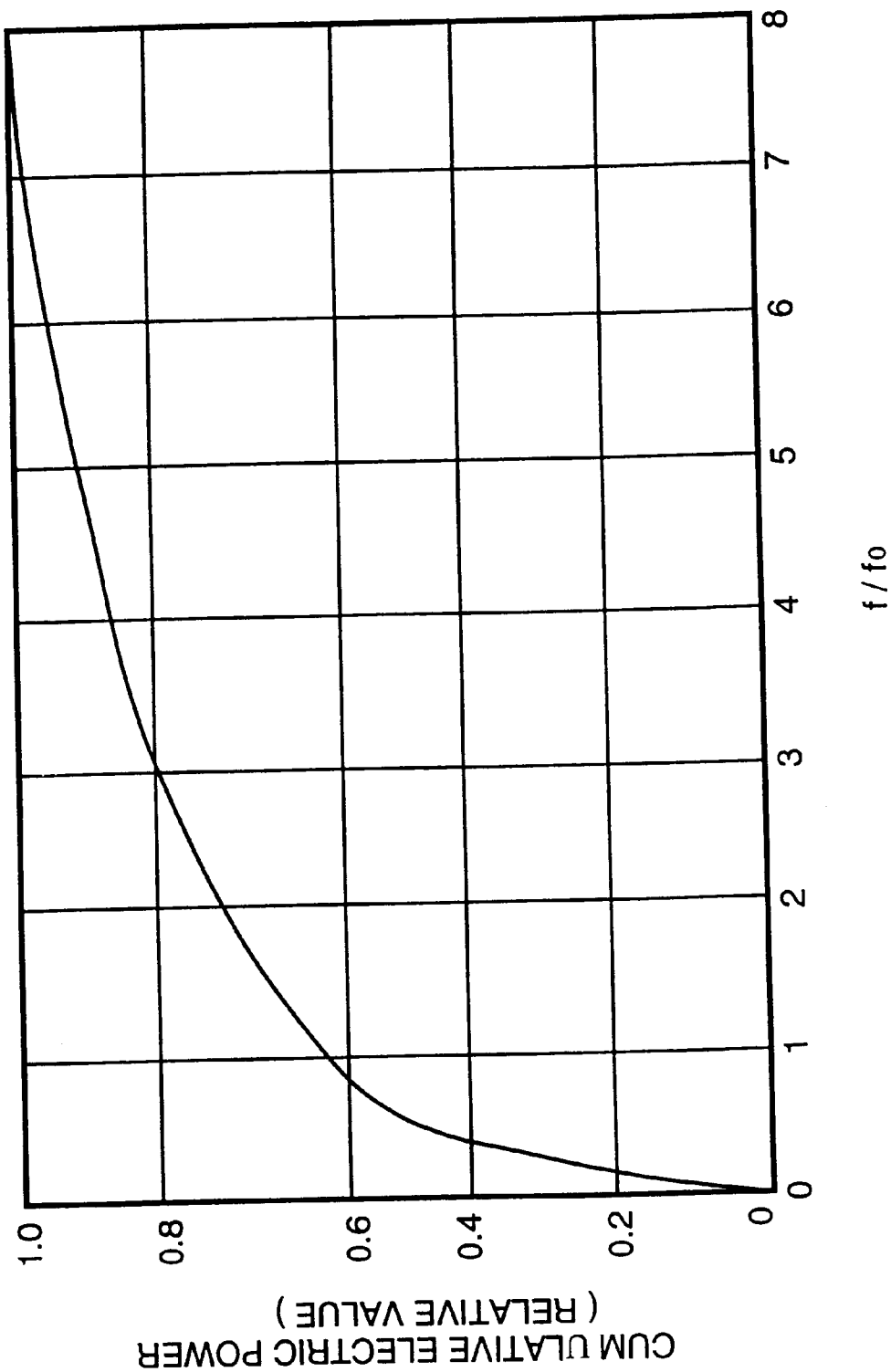
FIG. 33 is a graph showing the relationship between frequency of a pulse bias electric power source and cumulative electric power.

In an ideal rectangular pulse having a pulse width of $T_1$, a pulse period of $T_0$ and rise/fall speeds of infinity, as shown in FIG. 33, 70% to 80% of the electric power is included in the frequency range of $f \leq 3f_0$ ($f_0 = (1/T_1)$). However, the wave-form actually applied has rise/fall speeds of finite values, convergence of electric power is further improved and 90% of electric power can be included in the frequency range of $f \leq 3f_0$.

In order to uniformly apply a pulse bias having a high frequency component of $3f_0$ over the surface of a sample, it is preferable to provide opposing electrodes parallel to the sample surface and to ground a pulse bias having a frequency component within a range of $f \leq 3f_0$ where $3f_0$ is obtained from Equation 3 as follows:

$$3f_0 = 3\cdot(10^6/0.2) = 15 \text{ MHz, when } T = 0.2 \text{ } \mu s \text{ } 3f_0 = 30 \text{ MHz, when } T = 0.1 \text{ } \mu s \qquad \text{(Equation 3)}$$

In the embodiment shown in FIG. 31, a countermeasure is provided for interference between the output of the pulse bias electric power source and the output of the plasma generating electric power source. That is, in the plasma etching apparatus, the plasma generating high frequency electric power source 16 is connected to the upper electrode 12 opposite to the sample 40. In order to set the upper electrode 12 to the ground level of the pulse bias, the frequency $f_1$ of the plasma generating electric power source 16 is set to a value larger than $3f_0$ described above and the upper electrode 12 and the ground level are connected with a band eliminator 141 of which the impedance is large around $f=f_1$ and small for the other frequencies.

On the other hand, the sample table 15 and the ground level are connected with a band pass filter 142 of which the impedance is small around $f=f_1$ and large for the other frequencies. By constructing in such a way, the interference between the output of the pulse bias electric power source 17 and the output of the plasma generating electric power source 16 can be suppressed to a level which creates no problem and a better bias can be applied to the sample 40.

Figure 34:
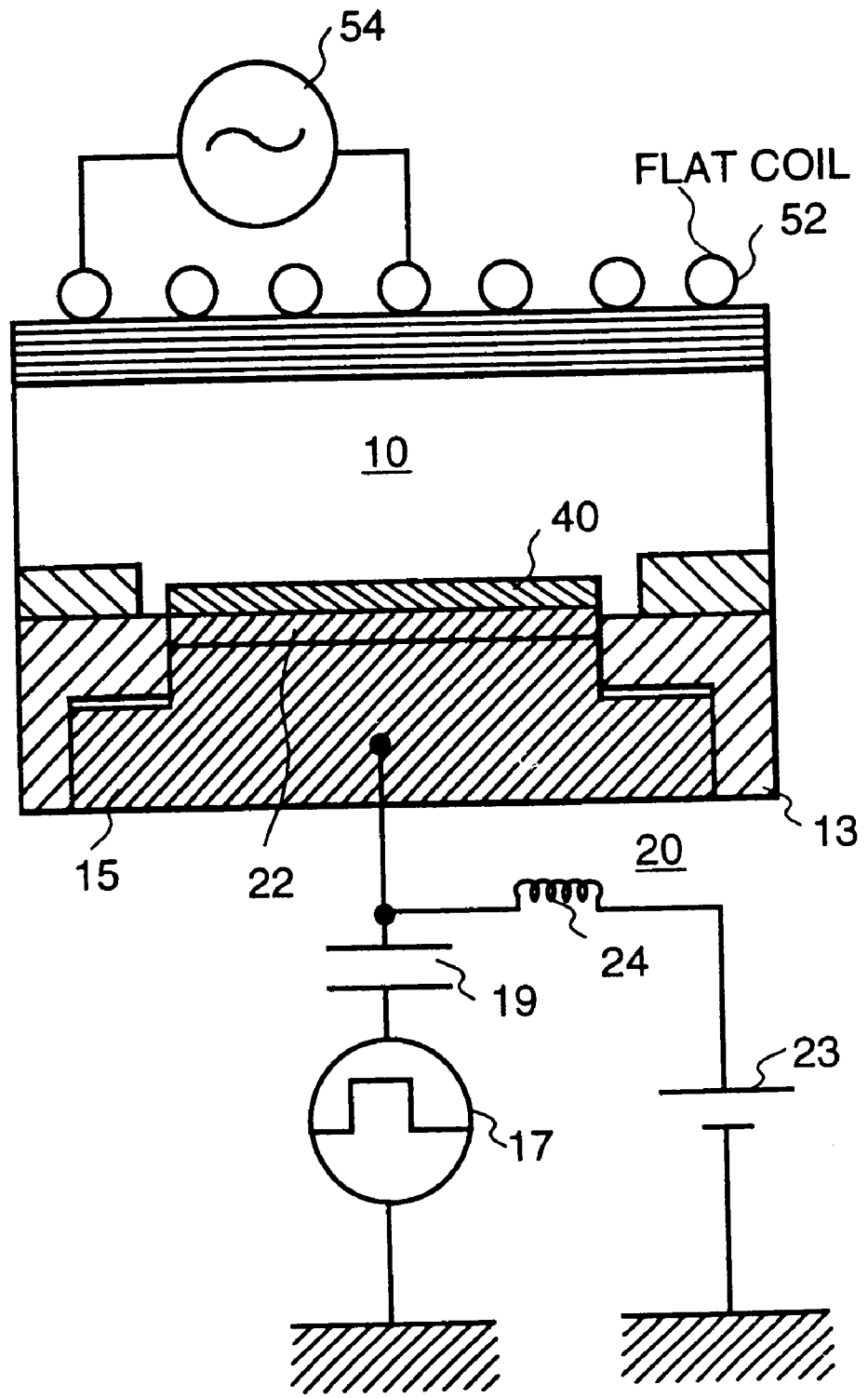
FIG. 34 is a vertical cross-sectional view showing an embodiment of a plasma etching apparatus of an induction coupling discharge type and a non-magnetic field type among external energy supplying discharge types to which the present invention is applied.
Figure 35:
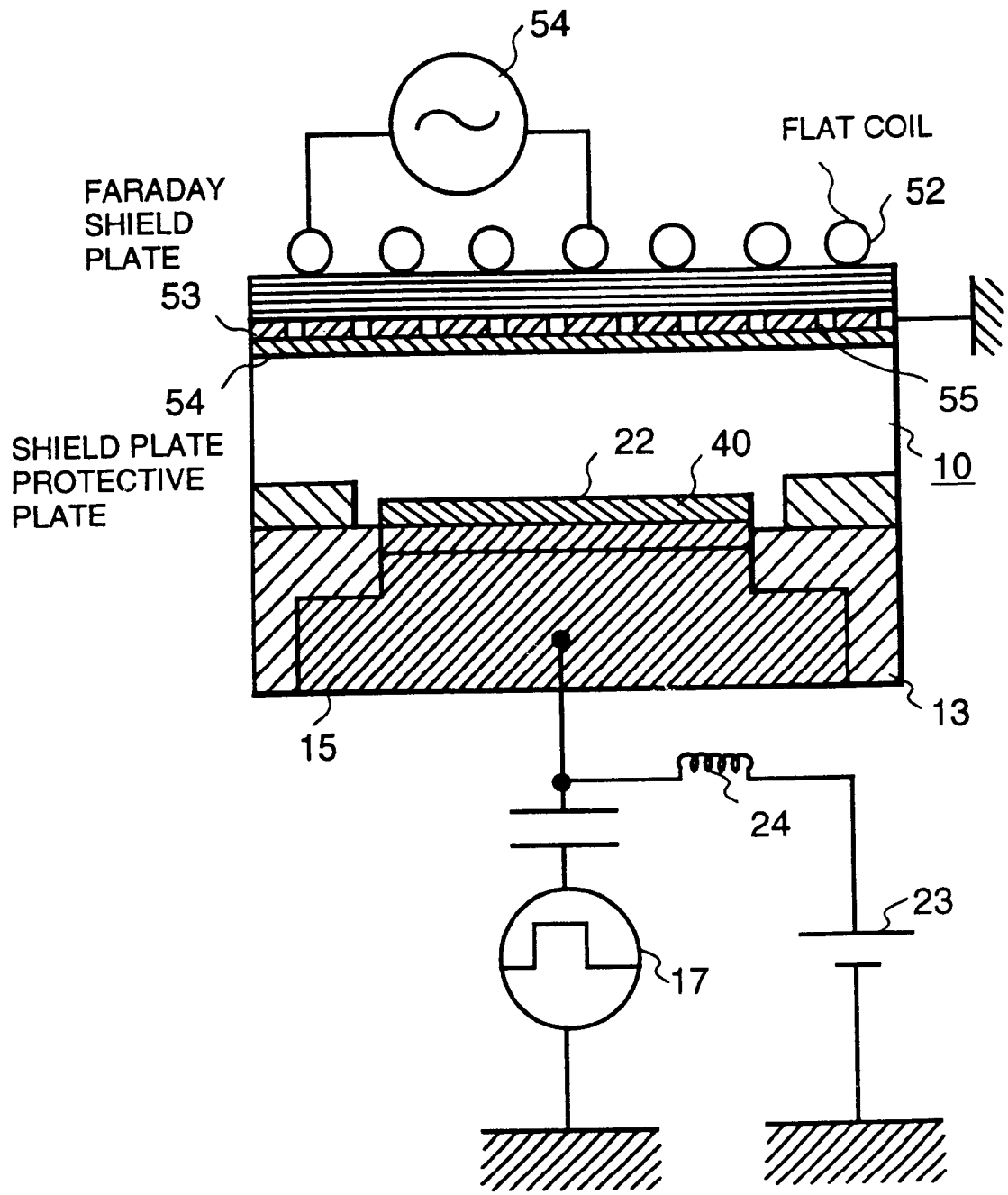
FIG. 35 is a vertical cross-section view showing a further embodiment of a plasma etching apparatus in accordance with the present invention.

FIG. 34 shows an embodiment of a plasma etching apparatus of the induction coupling discharge type and the non-magnetic field type among the external energy supplying discharge type to which the present invention is applied. The reference character 52 indicates a flat coil, and the reference character 54 indicates a high frequency electric power source for applying a high frequency voltage of 10 MHz to 250 MHz to the flat coil. The plasma etching apparatus of the induction coupling discharge type can generate a stable plasma with a lower frequency and under a lower gas pressure compared to the type shown in FIG. 10. On the contrary, dissociation of gas is apt to be progressed. Therefore, unnecessary dissociation is prevented by modulating the output of the high frequency electric power source 1 using the high frequency electric power source modulating signal source 161, as shown in FIG. 1. The processing chamber 10 of a vacuum vessel comprises a sample table 15 which mounts the sample 40 on the electrostatic attracting film 22.

When etching is performed, the sample 40 of an object to be processed is mounted on the lower electrode 15 and attracted by an electrostatic force. While a processing gas is being supplied to the processing chamber 10 from the gas supplying unit, not shown, on the other hand, the processing chamber is evacuated and depressurized by the vacuum pump so that pressure of the processing chamber becomes a processing pressure of the sample, that is, a pressure of 0.5 Pa to 4.0 Pa. Then, a high frequency electric power of 13.56 MHz is applied from the high frequency electric power source 54 to the flat coil 52 to form a plasma in the processing chamber 10. The sample 40 is etched using the plasma. On the other hand, during etching, a pulse bias voltage having a period of 0.1 $\mu$s to 10 $\mu$s, preferably 0.2 $\mu$s to 5 $\mu$s is applied to the lower electrode 15. The amplitude of the pulse bias voltage used is in a different range depending on the kind of the film, as described in the embodiment of FIG. 1. By applying the pulse bias voltage in such a manner, ions in the plasma are accelerated and vertically irradiated onto the sample to perform highly precise shape control or highly precise selectivity control. Accordingly, it is possible to perform accurate etching even if a resist mask pattern of the sample is of a submicron pattern.

In a plasma etching apparatus of the induction coupling discharge type and the non-magnetic field type, a Faraday shield plate 53 having a gap, which is grounded, and a thin shield plate protective insulator plate 54 having a thickness of 0.5 mm to 5 mm may be provided on the processing chamber 10 side of the induction high frequency magnetic field output portion. Since the capacitance component between the coil and the plasma is reduced by providing the Faraday shield plate 53, it is possible to reduce energy of ions impinging on a quartz plate under the coil 52 of FIG. 34 and the shield plate protective insulator plate 54 to reduce damage of the quartz plate and the insulator plate, and to prevent foreign from mixing into the plasma.

Further, since the Faraday shield plate 53 also serves as a grounded electrode for the pulse bias electric power source 17, it is possible to apply the pulse bias between the sample 40 and the Faraday shield plate 53 uniformly. In this case, no filter is required between the upper electrode and the sample table 15.

Figure 36:
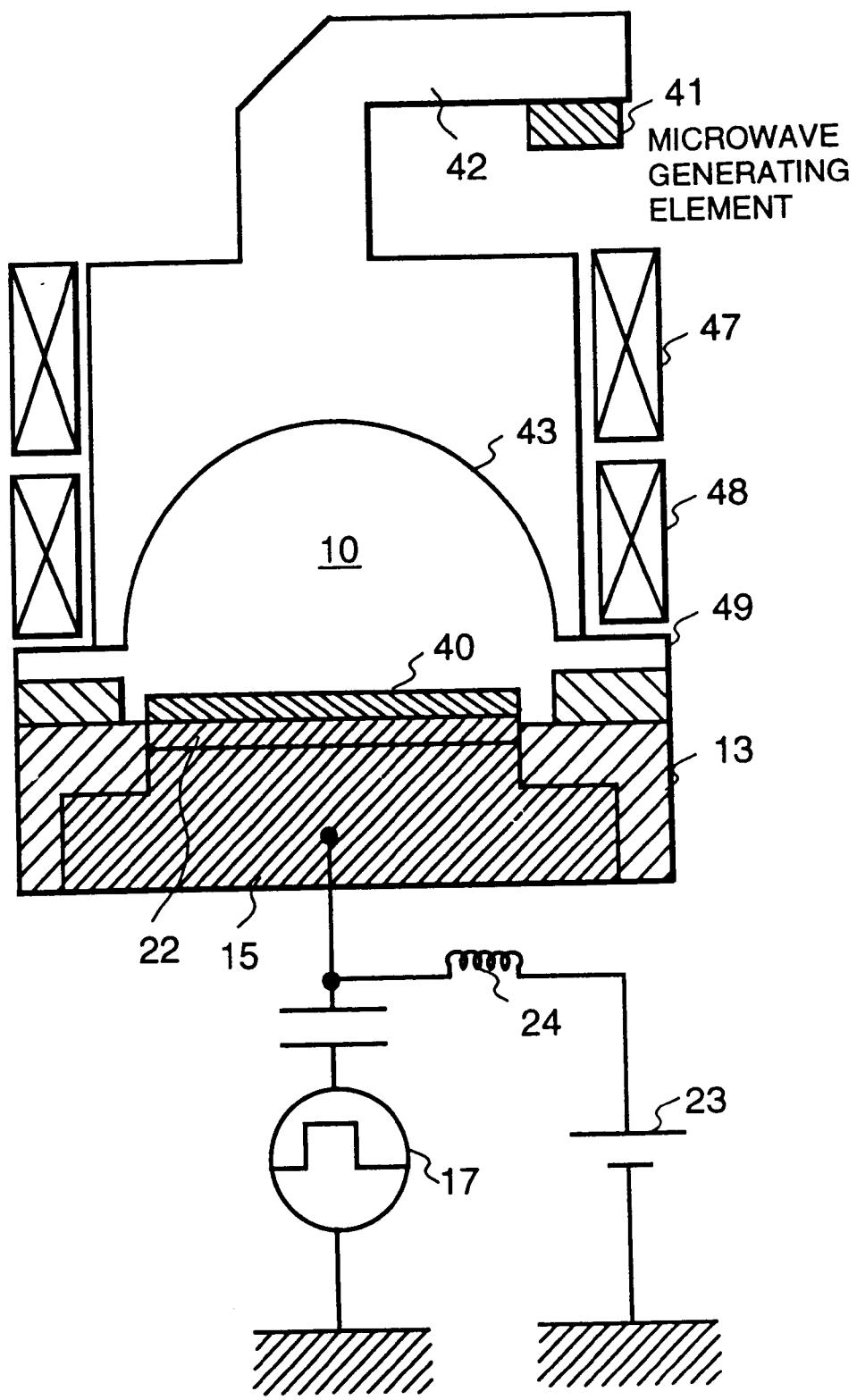
FIG. 36 is a vertical cross-sectional front view showing a part of a microwave processing apparatus to which the present invention is applied.

FIG. 36 is a vertical cross-sectional front view showing a part of a microwave processing apparatus to which the present invention is applied. A pulse bias electric power source 17 and a direct current source 13 are connected to a lower electrode 15 also serving as a sample table 15 mounting a sample 40 on an electrostatic attracting film 22. The reference character 41 indicates a magnetron of a microwave oscillating source, the reference character 42 indicates a microwave guide tube, and the reference character 43 indicates a quartz plate for vacuum-sealing a processing chamber 10, noting that these elements are used to supply the microwave to the processing chamber. The reference character 47 indicates a first solenoid coil for supplying a magnetic field, and the reference character 48 indicates a second solenoid coil for supplying a magnetic field. The reference character 49 indicates a process gas supplying system which supplies a process gas for performing processing such as etching, film-forming and so on into the processing chamber 10. The processing chamber 10 is evacuated by a vacuum pump, not shown. The characteristics required for the pulse bias electric power source 17 and the electrostatic chuck 20 are the same as in the embodiment of FIG. 1, and accordingly detailed description will be omitted here.

When etching is performed, the sample 40 of an object to be processed is mounted on the lower electrode 15 and attracted by an electrostatic force. While a processing gas is being supplied to the processing chamber 10 from the gas supplying unit 49, on the other hand, the processing chamber is evacuated to a vacuum by the vacuum pump so that pressure of the processing chamber becomes a processing pressure of the sample, that is, a pressure of 0.5 Pa to 4.0 Pa. Then, the magnetron 41 and the first and the second solenoid coils 47, 48 are switched on, and a microwave generated in the magnetron 41 is guided to the processing chamber through the wave-guide tube 42 to produce a plasma. The sample 40 is etched using the plasma. On the other hand, during etching, a pulse bias voltage having a period of 0.1 $\mu$s to 10 $\mu$s, preferably 0.2 $\mu$s to 5 $\mu$s is applied to the lower electrode 15.

By applying the pulse bias voltage in such a manner, ions in the plasma are accelerated and vertically irradiated onto the sample to perform high precision shape control or high precision selectivity control. Thereby, it is possible to perform accurate etching processing even if a resist mask pattern of the sample is of a submicron pattern.

In the plasma etching apparatuses in accordance with the present invention depicted in FIG. 1 and the following figures, the direct current voltage of the electrostatic attracting circuit and the pulse voltage of the pulse bias electric power source circuit may be generated by superposing each other. Thereby, both circuits can be constructed in common. Further, the electrostatic attracting circuit and the pulse bias electric power source circuit may be separately provided so that the pulse bias does not adversely affect the electrostatic attraction.

Instead of the electrostatic attracting circuit in the embodiment of the plasma etching apparatus of FIG. 1, another attracting means such as a vacuum attracting means may be employed.

The above-mentioned plasma processing apparatuses having the electrostatic attracting circuit and the pulse bias voltage applying circuit in accordance with the present invention can be applied not only to an etching processing apparatus but also to a plasma processing apparatus such as a CVD apparatus by changing the etching gas to a CVD gas.

Figure 37:
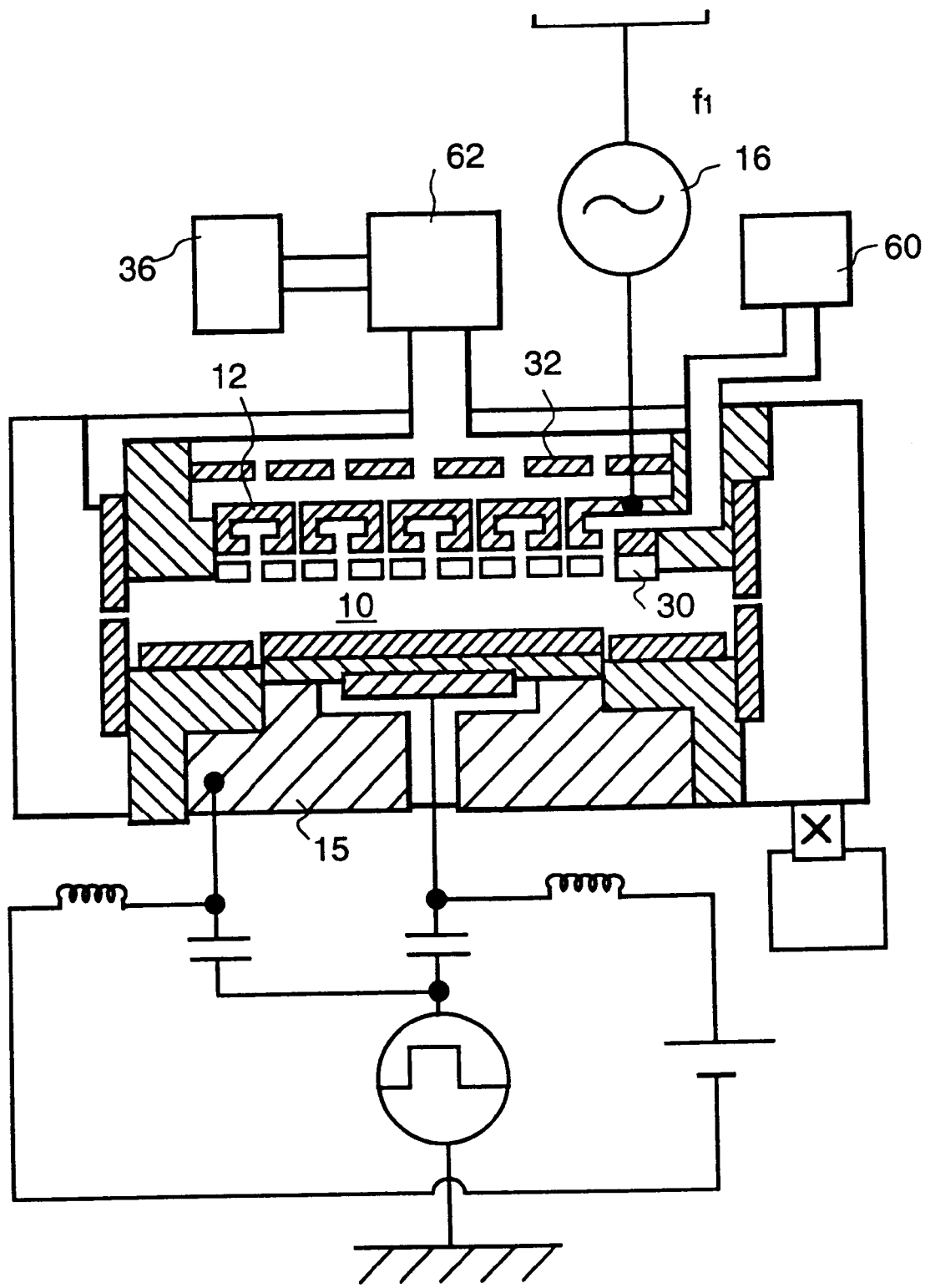
FIG. 37 is a vertical cross-sectional view showing a further embodiment of a plasma etching apparatus in accordance with the present invention.

A description will be provided below regarding a further embodiment of a plasma etching apparatus capable of submicron plasma-processing by overcoming conventional disadvantages and by controlling quantity and quality of ions and radicals, referring to FIG. 37 depicting the further embodiment in accordance with the present invention.

A first plasma generating portion is provided in a place upstream of a vacuum processing chamber where a sample is placed noting that the first plasma generating portion is different from the vacuum processing chamber. Quasi-stable atoms generated in the first plasma generating portion are injected into the vacuum processing chamber, and then the quasi-stable atoms are formed into a second plasma in the vacuum processing chamber. In addition to the plasma etching apparatus shown in FIG. 1, an ion/radical forming gas supply unit 60 and a plasma generating chamber 62 for generating the quasi-stable atoms are provided. Further, a route for introducing a gas containing the quasi-stable atoms into the vacuum processing chamber and an introducing route connected to the ion/radical forming gas supply unit are provided in the upper electrode 12.

The characteristics of this embodiment are as follows. (1) A gas supplied from the quasi-stable atom forming gas supply unit 36 is formed into a plasma by being applied with a high frequency electric power in the quasi-stable atom forming plasma generating chamber 62, and a required amount of quasi-stable atoms are generated in advance to be introduced into the processing chamber 10. In order to efficiently generate the quasi-stable atoms, pressure of the quasi-stable atom forming plasma generating chamber 62 is set to a high pressure of several hundred mTorr to several tens of mTorr.

(2) On the other hand, a gas is introduced into the processing chamber from the ion/radical forming gas supply unit 60.

(3) A high frequency voltage having a comparatively small power is output from the plasma generating electric power source 16 to form a plasma in the processing chamber 10. Since ions are efficiently formed with electrons having a low energy lower than nearly 5 eV because of injection of the quasi-stable atoms, it is possible to obtain a plasma which is in a low electron temperature lower than 6 eV, preferably, lower than 4 eV and which has a very small amount of high energy electrons above 15 eV. Therefore, the radical forming gas is not excessively dissociated and accordingly a necessary quantity and a necessary quality of the radicals can be maintained. On the other hand, a quantity of the ions can be controlled by the amount of the quasi-stable atoms generated in the quasi-stable atom forming plasma generating chamber 62 and the amount of ion forming gas from the ion/radical forming gas supply unit 60.

Since the quantity and the quality of the ions and radicals can be controlled in such a manner, a better performance can be attained even in submicron plasma processing. The radical forming gas used is $CHF_3$, $CH_2F_2$, or a fluorocarbon gas such as $C_4F_4$ or $CF_4$, or adding a gas containing C and H such as $C_2H_4$, $CH_4$, $CH_3OH$, if necessary. The quasi-stable forming gas used is a gas composed of one kind or two kinds of rare gas as a base gas. The ion forming gas used is a gas having the following characteristic which efficiently forms ions.

The gas used as an ion forming gas is one having an ionization level which is lower than an energy level of the quasi-stable atoms, or a gas having an ionization level which is higher than an energy level of the quasi-stable atoms, noting, however, that the difference is as small as 5 eV or less.

It is also possible to use the quasi-stable atom forming gas or the radical forming gas described above instead of the ion forming gas, though the performance is likely to be degraded.

FIG. 38 shows a still further embodiment in accordance with the present invention in which a quantity and a quality of ions and radicals are controlled. This embodiment is the same as the embodiment of FIG. 37 in its basic idea. In FIG. 37, when the distance between the quasi-stable atom forming plasma chamber 62 and the vacuum processing chamber 10 is large, decay of the quasi-stable atoms in the passage becomes large. This embodiment is a countermeasure for such a case. The reference character 41 indicates a magnetron of a microwave oscillating source, the reference character 42 indicates a microwave guide tube, the reference character 43 indicates a quartz plate for vacuum-sealing a first plasma generating chamber 45 and allowing the microwave to pass through, and the reference character 44 is a quartz plate for diffusing gas. In the first plasma generating chamber 45, a plasma is generated by the microwave under a gas pressure of several hundred mTorr to several tens of mTorr to form quasi-stable atoms.

Since the distance between the place generating the quasi-stable atoms and the vacuum processing chamber in the apparatus of FIG. 38 is short compared with in the apparatus of FIG. 37, it is possible to inject the quasi-stable atoms with a high density and accordingly an amount of ions in the vacuum processing chamber 10 can be increased. By maintaining the processing chamber 10 at a pressure of 5 to 50 mTorr and using the high frequency electric power source 16 having a frequency above 20 MHz, a high density and low electron temperature plasma having a density of order of $10^{10}$ to $10^{11}/cm^3$ and an electron temperature of 5 eV, preferably, 3 eV and dissociation of the ion forming gas is progressed while avoiding dissociation of $CF_2$ which requires a dissociation energy of 8 eV. As a result, on the surface of the sample 40, the following reaction is mainly progressed with the assistance of incident ions accelerated at several hundred volts by the bias electric power source 17.

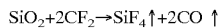
$SiO_2 + 2CF_2 \rightarrow SiF_4\uparrow + 2CO\uparrow$

Since Si and SiN used as a base material are not etched by $CF_2$, it is possible to perform oxide film etching with a high selectivity.

Increases in the amount of fluorine due to partial dissociation of $CF_2$ can be decreased by virtue of the upper electrode cover 30 being made of silicon, carbon or SiC.

As described above, by adjusting the radical forming gas and the ion forming gas the ratio of ions and radicals in the processing chamber 10 can be independently controlled, and consequently the reaction on the surface of the sample 40 can be easily controlled.

The plasma processing apparatus having the electrostatic attracting circuit and the pulse bias voltage applying circuit in accordance with the present invention can be applied not only to an etching processing apparatus but also to a plasma processing apparatus such as a CVD apparatus by changing the etching gas to a CVD gas.

Figure 39:
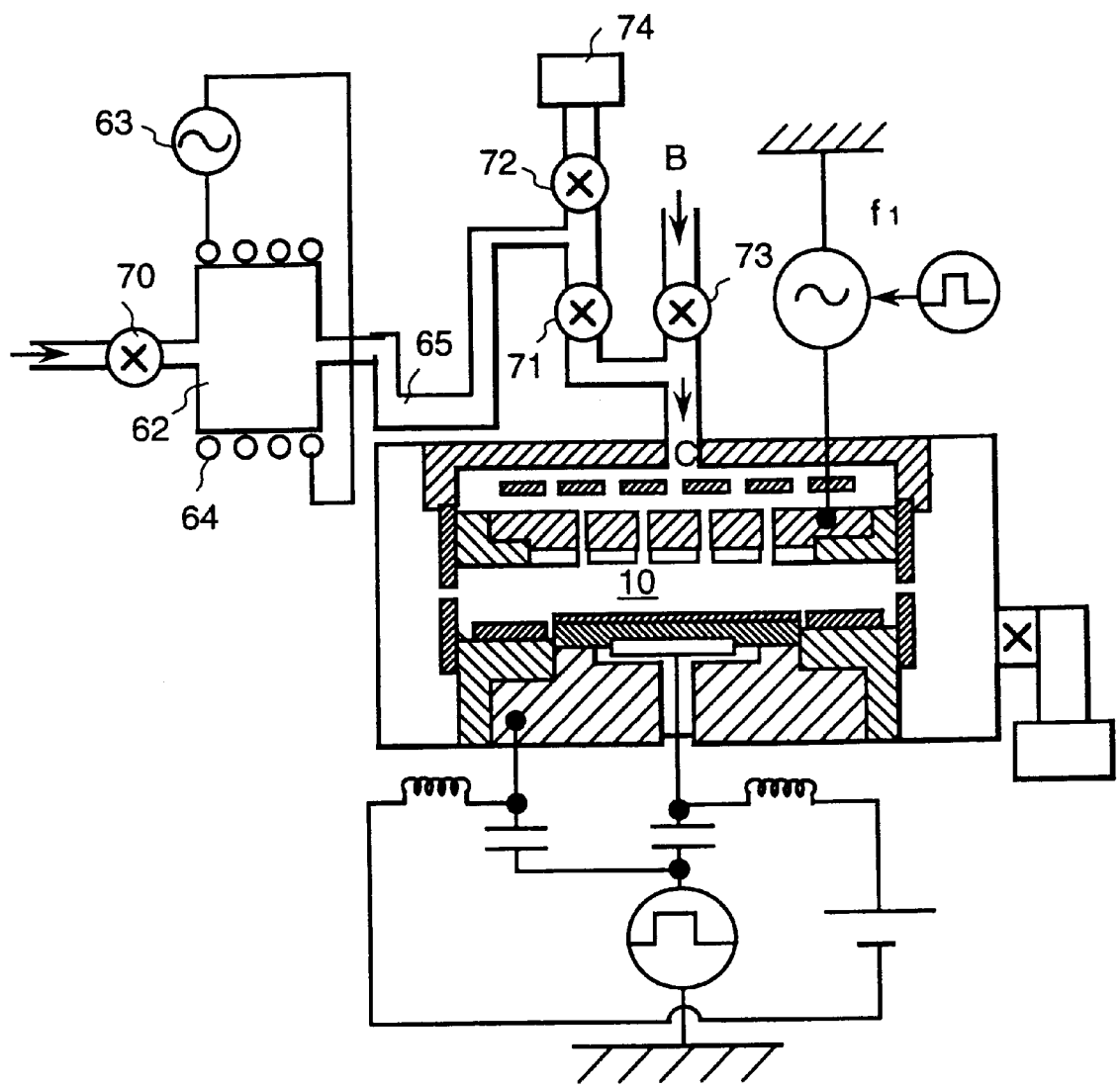
FIG. 39 is a vertical cross-sectional view showing a further embodiment of a plasma etching apparatus of a two-electrode type in accordance with the present invention which is capable of controlling ions and radicals independently.

FIG. 39 shows a further embodiment in accordance with the present invention in which a quantity and a quality of ions and radicals are independently controlled. In FIG. 39, the radical forming gas used is $CHF_3$, $CH_2F_2$, or a fluorocarbon gas such as $C_4F_4$ or $CF_4$, or adding a gas containing C and H such as $C_2H_4$, CH4, $CH_3OH$, if necessary. The radical forming gas is introduced into the radical forming plasma generating chamber 62 through a valve 70 shown by an arrow A in FIG. 39.

In the radical forming plasma generating chamber 62, a plasma is generated by applying an output having a frequency of several MHz to several tens of MHz of an RF power source 63 to the coil 65 under a pressure of several hundred mTorr to several tens mTorr to produce mainly $CF_2$ radicals. The amounts of $CF_3$ and F produced at the same time are reduced by an H component.

Since it is difficult to largely reduce the amounts of CF and O components in the radical forming plasma generating chamber 62, an unnecessary component removing chamber 65 is provided downstream of the radical forming plasma generating chamber. In the unnecessary component removing chamber, an inner wall made of a material containing carbon or silicon such as carbon, Si, SiC or the like is provided to reduce the unnecessary components or to convert the unnecessary components into other gasses of less ill effect. A valve 71 is connected to an exit of the unnecessary component removing chamber 65 to supply a gas which is mainly composed of $CF_2$.

Since a large amount of sediment such as deposits is accumulated between the valve 70 and the valve 71, it is necessary to perform cleaning or exchanging that portion in a comparatively short period. Therefore, in order to easily perform opening-to-atmosphere and exchanging work and to shorten vacuum build-up time at restarting, the portion between the valve 70 and the valve 71 is connected to an evacuation system 74 through a valve 72. The evacuation system 74 may also serve as an evacuation system for the processing chamber 10.

The ion forming gas of a rare gas such as argon gas, xenon gas or the like indicated by B in the figure is supplied to the processing chamber through a valve 73. The passage is connected to the exit of the valve 71.

By maintaining the processing chamber 10 at a pressure of 5 to 50 mTorr and using the high frequency electric power source 16 having a modulated frequency above 20 MHz, a high density and low electron temperature plasma is provided having a density on the order of $10^{10}$ to $10^{11}/cm^3$ and an electron temperature of 5 eV, preferably, 3 eV, and dissociation of the ion forming gas is progressed while avoiding dissociation of $CF_2$ which requires a dissociation energy of 8 eV. As a result, on the surface of the sample 40, the following reaction is mainly progressed with assistance of incident ions accelerated at several hundred volts by the bias electric power source 17.

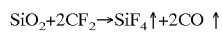
$SiO_2 + 2CF_2 \rightarrow SiF_4\uparrow + 2CO\uparrow$

Since Si and SiN used as a base material are not etched by $CF_2$, it is possible to perform oxide film etching with a high selectivity.

Increases in the amount of fluorine due to partial dissociation of $CF_2$ can be decreased by virtue of the upper electrode cover 30 being made of silicon, carbon or SiC.

As described above, by adjusting the radical forming gas A and the ion forming gas B, the ratio of ions and radicals in the processing chamber 10 can be independently controlled, and consequently the reaction on the surface of the sample 40 can be easily controlled. Further, since unnecessary deposits are removed by the unnecessary component removing chamber 65 so as to enter the processing chamber 10 to as small a degree as possible, the amount of deposits in the processing chamber 10 is substantially reduced and accordingly frequency of cleaning the processing chamber 10 by opening to the atmosphere is also substantially reduced.

Figure 40:
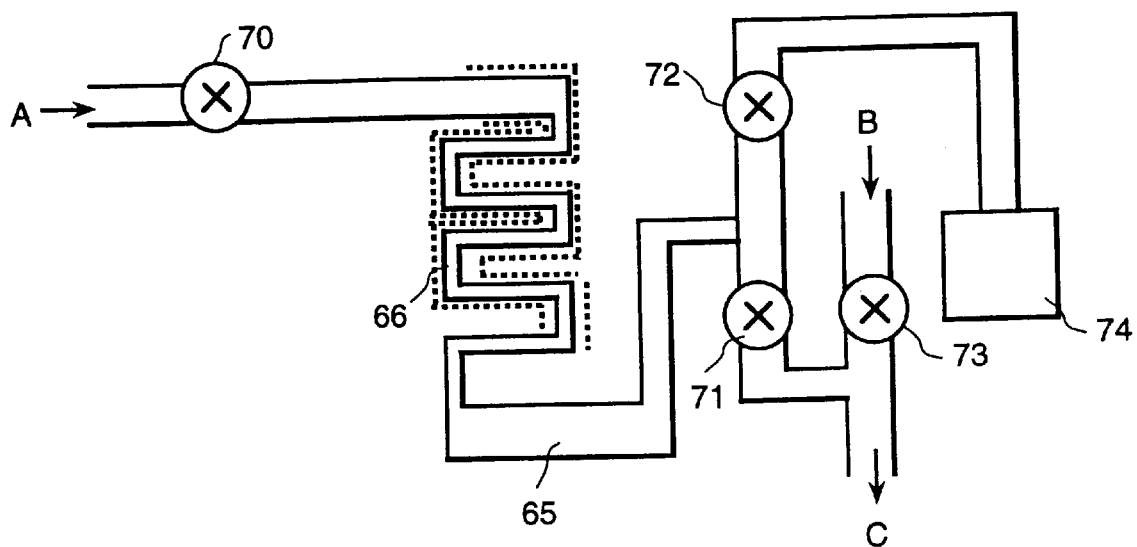
FIG. 40 is a vertical cross-sectional view showing a further embodiment of a plasma etching apparatus of a two-electrode type in accordance with the present invention.

FIG. 40 shows a further embodiment in accordance with the present invention in which a quantity and a quality of ions and radicals are independently controlled. Hexa-fluoropropylene oxide gas ($CF_3CFOCF_2$, hereinafter referred to as HFPO) is passed through a heating pipe portion 66 via a valve 70 from the portion indicated by A in the figure, and through an unnecessary component removing chamber 65 and a valve 71, and then mixed with an ion forming gas B to transfer toward the processing chamber 10. In the heating pipe portion 66, the HFPO is heated at a temperature of 800° C. to 1000° C. to form $CF_2$ by thermal decomposition expressed by the following chemical formula:

$$CF_3CFOCF_2 \rightarrow CF_2 + CF_3CFO$$

Although $CF_3CFO$ is comparatively stable and hardly decomposed, part of the $CF_3CFO$ is decomposed to produce O and F. Therefore, the unnecessary component removing chamber 65 is provided downstream of the heating pipe portion 66 to remove the unnecessary components or convert to substances which will have ill effects. Although a part of the $CF_3CFOCF_2$ flows into the processing chamber 10, there is no problem since it is not dissociated by the low electron temperature plasma below 5 eV.

Use of the valve 72 and the evacuating system 74 and reaction in the processing chamber is the same as described for the case of FIG. 39.

The plasma processing apparatus having the electrostatic attracting circuit and the pulse bias voltage applying circuit in accordance with the present invention can be applied not only to an etching processing apparatus but also to a plasma processing apparatus such as a CVD apparatus by changing the etching gas to a CVD gas.

According to the present invention, it is possible to provide a plasma processing apparatus and a plasma processing method capable of easily performing precise working of a fine pattern to a large sized sample having a diameter of 300 mm or larger, and also capable of improving a selectivity during micro processing. Further, it is possible to provide a plasma processing apparatus and a plasma processing method capable of performing processing, particularly, oxide film processing all over the surface of a large sized sample uniformly and rapidly.

According to the present invention, it is possible to provide a plasma processing apparatus and a plasma processing method capable of improving the selectivity of plasma processing of insulator films such as $SiO_2$, SiN, BPSG and the like.

Further, it is possible to provide a plasma processing apparatus and a plasma processing method capable of improving the selectivity of plasma processing by obtaining a narrow ion energy distribution having better controllability.

Furthermore, in a case of using a sample table having an electrostatic attracting dielectric layer, it is possible to provide a plasma processing apparatus and a plasma processing method capable of improving the selectivity of plasma processing by obtaining a narrow ion energy distribution having better controllability.

Further, it is possible to provide a plasma processing apparatus and a plasma processing method capable of easily performing precise working of a fine pattern and improving the selectivity during fine pattern processing.

Furthermore, it is possible to provide a plasma processing apparatus and a plasma processing method capable of improving the selectivity of plasma processing of insulator films such as $SiO_2$, SiN, BPSG and the like by controlling the quantity and the quality of ions and radicals independently.

What is claimed is:

1. A plasma processing apparatus comprising a vacuum processing chamber, a plasma generating means including a pair of electrodes, and a sample table for mounting a sample to be processed inside said vacuum processing chamber and also serving as one of said electrodes, wherein said plasma processing apparatus further comprises:

an evacuating means for evacuating said vacuum processing chamber to 0.4 Pa to 4 Pa;

a high frequency electric power source for applying an electric power of a VHF band from 30 MHz to 300 MHz between said pair of electrodes; and a magnetic field forming means for forming at least one of a static magnetic field and a low frequency magnetic field not weaker than 10 gauss and not stronger than 110 gauss in a direction intersecting an electric field between said pair of electrodes;

said electrodes being comprised of a first electrode connected to said high frequency electric power source and a second electrode also serving as said sample table connected to a bias electric power source for controlling ion energy, a distance between said pair of electrodes being 30 to 100 mm;

an electron cyclotron resonance region being formed at a position within a range between the surface of said first electrode and the middle of said pair of electrodes by interaction of said magnetic field and an electric field produced by said high frequency electric power source, wherein said magnetic field forming means comprises a core which continuously changes a distance of said cyclotron resonance region to said sample by eccentrically rotating the center of said sample surface to change said magnetic field.

2. A plasma processing apparatus comprising a vacuum processing chamber, a plasma generating means including a first and second electrodes, a sample table having a sample mounting surface for mounting a sample to be processed inside said vacuum processing chamber, and an evacuating means for evacuating said vacuum processing chamber, wherein the plasma processing apparatus further comprises:

a high frequency electric power source for applying an electric power of a VHF band from 30 MHz to 300 MHz between said first and second electrodes and between a first electrode and a grounded wall portion of said processing chamber, wherein said first electrode is connected to said high frequency electric power source, wherein a second electrode also serve as said sample table and wherein the grounded wall portion of said processing chamber is arranged at the outer peripheral side of said first electrode; and a magnetic field forming means for forming at least one of a static magnetic field and a low frequency magnetic field not weaker than 10 gauss and not stronger than 110 gauss in such a manner as to cancel each other out near the central portion of said processing chamber and superpose each other at the periphery and the outer side of said processing chamber, wherein an electron cyclotron resonance region is formed at a position between a predetermined peripheral portion of said sample mounting surface and a portion near the outer side by interaction of said magnetic field and an electric field produced by said high frequency electric power source.

3. A plasma processing apparatus according to claim 2, wherein said magnetic field forming means comprises a plurality of coils arranged around said processing chamber in such a manner as to cancel each other out near the central portion of said sample and superpose each other in the periphery and the outer side of said sample.

4. A plasma processing apparatus comprising a vacuum processing chamber, a plasma generating means including a pair of electrodes, and a sample table for mounting a sample to be processed inside said vacuum processing chamber and also serving as one of said electrodes, wherein said plasma processing apparatus further comprises:

an evacuating means for evacuating said vacuum processing chamber to 0.4 Pa to 4 Pa;

a high frequency electric power source for applying an electric power of a VHF band from 30 MHz to 300 MHz between said pair of electrodes; and a magnetic field forming means for forming at least one of a static magnetic field and a low frequency magnetic field not weaker than 10 gauss and not stronger than 110 gauss in a direction intersecting an electric field between said pair of electrodes;

said electrodes being comprised of a first electrode connected to said high frequency electric power source and a second electrode also serving as said sample table connected to a bias electric power source for controlling ion energy, a distance between said pair of electrodes being 30 to 100 mm; an electron cyclotron resonance region being formed at a position within a range between the surface of said first electrode and the middle of said pair of electrodes by interaction of said magnetic field and an electric field produced by said high frequency electric power source, wherein said bias electric power source for controlling ion energy applies a pulse bias having a period of 0.2 to 5 $\mu$m and a duty cycle at a positive direction pulse portion not larger than 0.4 to said sample through a capacitor element.

5. A method of plasma-processing a sample using a plasma processing apparatus comprising a vacuum processing chamber, a plasma generating means including a pair of electrodes, a sample table for mounting a sample to be processed inside said vacuum processing chamber and also serving as one of said electrodes, and an evacuating means for evacuating said vacuum processing chamber, the method comprising the steps of:

evacuating the inside said vacuum processing chamber by said evacuating means;

forming at least one of a static magnetic field and a low frequency magnetic field not weaker than 10 gauss and not stronger than 110 gauss in a direction intersecting an electric field between said pair of electrodes by a magnetic field forming means;

forming an electron cyclotron resonance region between said pair of electrodes by interaction of said magnetic field and an electric field generated by a high frequency electric power source by applying an electric power of a VHF band from 30 MHz to 300 MHz between said pair of electrodes using said high frequency electric power source; and processing said sample by a plasma produced by said cyclotron resonance of electrons.

6. A method of plasma-processing a sample using a plasma processing apparatus comprising a vacuum processing chamber, a sample table for mounting the sample to be processed inside said vacuum processing chamber, and a plasma generating means including a pair of electrodes, wherein said pair of electrodes are comprised of a first electrode connected to high frequency electric power source and a second electrode also serving as said sample table connected to a bias electric power source for controlling ion energy, a distance between said pair of electrodes being 30 to 100 mm;

the method comprising the steps of:

evacuating said vacuum processing chamber to 0.4 Pa to 4 Pa by a evacuating means;

forming at least one of a static magnetic field and a low frequency magnetic field not weaker than 10 gauss and not stronger than 110 gauss in a direction intersecting an electric field between said pair of electrodes by a magnetic field forming means;

forming an electron cyclotron resonance region between said pair of electrodes by interaction of said magnetic field and an electric field generated by a high frequency electric power source by applying an electric power of a VHF band from 30 MHz to 300 MHz between said pair of electrodes using said high frequency electric power source; and processing said sample by a plasma produced by said cyclotron resonance of electrons.

7. A plasma processing apparatus comprising a vacuum processing chamber, a plasma generating means including a pair of electrodes, a sample table having a sample mounting surface for mounting a sample to be processed inside said vacuum processing chamber, and an evacuating means for evacuating said vacuum processing chamber, wherein said plasma processing apparatus further comprises:

a high frequency electric power source for applying a high frequency electric power of a VHF band from 30 MHz to 300 MHz between said pair of electrodes; and a magnetic field forming means for forming at least one of a static magnetic field and a low frequency magnetic field in a direction intersecting an electric field generated between said pair of electrodes by said high frequency electric power source, wherein an electron cyclotron resonance region is formed between said pair of electrodes by said magnetic field and said electric field, which further comprises:

an electrostatic attracting means for holding said sample onto said sample table by an electrostatic attracting force, a pulse bias applying means connected to said sample table for applying a pulse bias voltage to said sample table; and a voltage suppressing means for suppressing a voltage rise generated by applying said pulse bias voltage corresponding to an electrostatic attracting capacity of said electrostatic attracting means.

8. A plasma processing apparatus according to claim 7, wherein said voltage suppressing means suppresses a voltage change at an electrostatic attracting film of said electrostatic attracting means during one cycle of pulse to one-half of said pulse bias voltage.

9. A plasma processing apparatus comprising a vacuum processing chamber, a plasma generating means including a pair of electrodes, a sample table for mounting a sample to be processed inside said vacuum processing chamber and also serving as one of said electrodes, and an evacuating means for evacuating said vacuum processing chamber, wherein said plasma processing apparatus further comprises:

- a high frequency electric power source for applying an electric power of a VHF band from 50 MHz to 200 MHz between said pair of electrodes; and
- a magnetic field forming means for forming at least one of a static magnetic field and a low frequency magnetic field not weaker than 17 gauss and not stronger than 72 gauss in a direction intersecting an electric field generated between said pair of electrodes by said high frequency electric power source,
- wherein said magnetic field forming means is set so that a portion where a component of said magnetic field in a direction along the surface of said sample table becomes maximum is located at a position on the opposite side of said sample table from the middle of said pair of electrodes, and
- wherein an electron cyclotron resonance region is formed between said pair of electrodes by said magnetic field and said electric field, which further comprises:

- an electrostatic attracting means for holding said sample onto said sample table by an electrostatic attracting force,
- a pulse bias applying means connected to said sample table for applying a pulse bias voltage to said sample table; and
- a voltage suppressing means for suppressing a voltage rise generated by applying said pulse bias voltage corresponding to an electrostatic attracting capacity of said electrostatic attracting means.

10. A plasma processing apparatus according to claim 9, wherein said voltage suppressing means suppresses a voltage change at an electrostatic attracting film of said electrostatic attracting means during one cycle of pulse to one-half of said pulse bias voltage.

11. A plasma processing apparatus comprising a vacuum processing chamber, a plasma generating means including a pair of electrodes, and a sample table for mounting a sample to be processed inside said vacuum processing chamber and also serving as one of said electrodes, wherein said plasma processing apparatus further comprises:

- an evacuating means for evacuating said vacuum processing chamber to 0.4 Pa to 4 Pa;
- a high frequency electric power source for applying an electric power of a VHF band from 30 MHz to 300 MHz between said pair of electrodes; and
- a magnetic field forming means for forming at least one of a static magnetic field and a low frequency magnetic field not weaker than 10 gauss and not stronger than 110 gauss in a direction intersecting an electric field between said pair of electrodes;
- said electrodes being comprised of a first electrode connected to said high frequency electric power source and a second electrode also serving as said sample table connected to a bias electric power source for controlling ion energy, a distance between said pair of electrodes being 30 to 100 mm;
- an electron cyclotron resonance region being formed at a position within a range between the surface of said first electrode and the middle of said pair of electrodes by interaction of said magnetic field and an electric field produced by said high frequency electric power source, which further comprises:

- an electrostatic attracting means for holding said sample onto said sample table by an electrostatic attracting force,
- a pulse bias applying means connected to said sample table for applying a pulse bias voltage to said sample table; and
- a voltage suppressing means for suppressing a voltage rise generated by applying said pulse bias voltage corresponding to an electrostatic attracting capacity of said electrostatic attracting means.

12. A plasma processing apparatus according to claim 11, wherein said voltage suppressing means suppresses a voltage change at an electrostatic attracting film of said electrostatic attracting means during one cycle of pulse to one-half of said pulse bias voltage.

* * * * *